United States Patent
Watanabe et al.

(10) Patent No.: US 8,623,990 B2
(45) Date of Patent: Jan. 7, 2014

(54) POLYESTER RESIN COMPOSITION

(75) Inventors: Yukie Watanabe, Fujinomiya (JP);
Ichiro Amasaki, Fujinomiya (JP); Keizo Kimura, Odawara (JP); Youichi Nagai, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/522,576

(22) PCT Filed: Jan. 13, 2011

(86) PCT No.: PCT/JP2011/050488
§ 371 (c)(1),
(2), (4) Date: Jul. 17, 2012

(87) PCT Pub. No.: WO2011/089969
PCT Pub. Date: Jul. 28, 2011

(65) Prior Publication Data
US 2012/0301696 A1    Nov. 29, 2012

(30) Foreign Application Priority Data

| Jan. 19, 2010 | (JP) | 2010-009538 |
| Jul. 13, 2010 | (JP) | 2010-159143 |
| Nov. 24, 2010 | (JP) | 2010-261825 |

(51) Int. Cl.
*C08G 63/02* (2006.01)
*C08G 64/00* (2006.01)

(52) U.S. Cl.
USPC ........... 528/271; 428/220; 524/100; 524/216; 528/272

(58) Field of Classification Search
USPC ............ 428/220; 524/100, 216; 528/271, 272
See application file for complete search history.

(56) References Cited

U.S. PATENT DOCUMENTS

| 5,354,794 A | 10/1994 | Stevenson et al. |
| 5,476,937 A | 12/1995 | Stevenson et al. |
| 5,618,626 A | 4/1997 | Nagashima et al. |
| 5,674,668 A | 10/1997 | Hagemann et al. |
| 5,942,564 A | 8/1999 | Kaschig et al. |
| 6,225,468 B1 | 5/2001 | Gupta et al. |
| 2003/0080326 A1 | 5/2003 | Schunk et al. |
| 2007/0231502 A1 | 10/2007 | Jones et al. |

FOREIGN PATENT DOCUMENTS

| DE | 19701719 A1 | 7/1998 |
| DE | 19723582 A1 | 12/1998 |
| JP | 05339033 A | 12/1993 |
| JP | 05345639 A | 12/1993 |
| JP | 06056466 A | 3/1994 |
| JP | 6145387 A | 5/1994 |
| JP | 8501291 A | 2/1996 |
| JP | 9106039 A | 4/1997 |
| JP | 2002524452 A | 8/2002 |
| JP | 2003177235 A | 6/2003 |
| JP | 3965631 B2 | 6/2007 |
| JP | 2007152566 A | 6/2007 |
| JP | 2009167416 A | 7/2009 |
| JP | 2009531488 A | 9/2009 |
| WO | 0014077 A1 | 3/2000 |

OTHER PUBLICATIONS

English Translation of the Written Opinion of the International Searching Authority (PCT/ISA/237) dated Apr. 12, 2011 in counterpart International Application No. PCT/JP2011/050488.
International Preliminary Report on Patentability (PCT/IB/338 and PCT/IB/373) dated Aug. 7, 2012 issued by the International Bureau of WIPO in counterpart International Application No. PCT/JP2011/050488.
Office Action, dated Sep. 9, 2013, issued by the State Intellectual Property Office of P.R. China in counterpart Chinese Patent Application No. 201180006529.9.
International Search Report dated Apr. 12, 2011 issued in International Application No. PCT/JP2011/050488 (PCT/ISA/210).
Written Opinion dated Apr. 12, 2011 issued in International Application No. PCT/JP2011/050488 (PCT/ISA/237).

*Primary Examiner* — Terressa Boykin
(74) *Attorney, Agent, or Firm* — Sughrue Mion, PLLC

(57) ABSTRACT

To provide a polyester resin composition being able to maintain a long-wavelength ultraviolet-blocking effect for a long period of time, ensuring high solubility for a solvent, and having excellent light resistance. A polyester resin composition comprising a compound represented by the following formula (1) and a polyester resin:

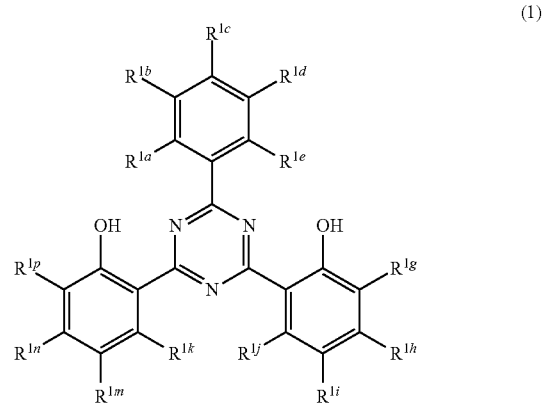

(1)

wherein each of $R^{1a}$, $R^{1b}$, $R^{1c}$, $R^{1d}$ and $R^{1e}$ independently represents a hydrogen atom or a monovalent substituent excluding OH, at least one of the substituents represents a substituent having a positive Hammett's σp value, and the substituents may combine with each other to form a ring; and each of $R^{1g}$, $R^{1h}$, $R^{1i}$, $R^{1j}$, $R^{1k}$, $R^{1m}$, $R^{1n}$ and $R^{1p}$ independently represents a hydrogen atom or a monovalent substituent, and the substituents may combine with each other to form a ring.

26 Claims, 1 Drawing Sheet

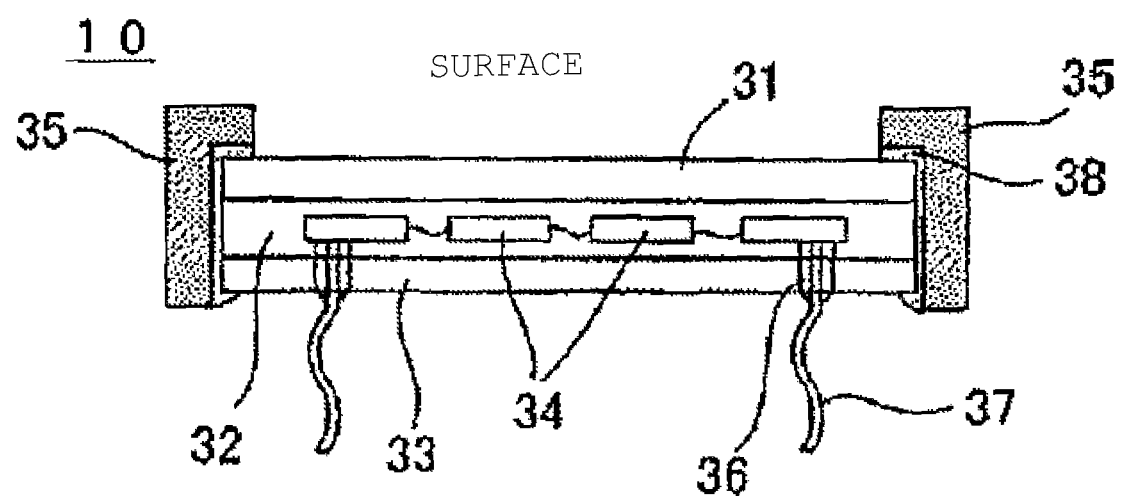

POLYESTER RESIN COMPOSITION

TECHNICAL FIELD

The present invention relates to a polyester resin composition containing a triazine compound and a polyester resin, and a molded article using the composition.

BACKGROUND ART

Conventionally, it has been done to impart an ultraviolet absorbing property by using an ultraviolet absorber in combination with various resins or the like. An inorganic ultraviolet absorber or an organic ultraviolet absorber is used as the ultraviolet absorber. In the case of an inorganic ultraviolet absorber (see, for example, Patent Documents 1 to 3), the durability such as weather resistance and heat resistance is excellent, but since the absorption wavelength is determined by the band gap of the compound, the latitude in selection is narrow, leading to the fact that an absorber capable of absorbing light even in the long-wavelength ultraviolet (UV-A) region of around 400 nm is not known and an absorber capable of absorbing light in the long-wavelength ultraviolet region has absorption also in the visible region and therefore, involves coloring.

In contrast, the organic ultraviolet absorber has a wide latitude in designing the absorber structure and therefore, absorbers having various absorption wavelengths can be obtained by designing the absorber structure.

Systems using various organic ultraviolet absorbers have been heretofore studied, and Patent Document 4 discloses a triazole-based ultraviolet absorber. Also, Patent Document 5 describes a trisaryl-s-triazine having an alkoxy group and a hydroxy group at specific positions. However, those having a maximum absorption wavelength in the long-wavelength ultraviolet region are poor in the light resistance, and their ultraviolet blocking effect wears off with the passage of time.

Furthermore, a material applied to a solar cell or the like recently under development must be exposed to sunlight outdoors for a long period of time, and due to exposure to ultraviolet light over long term aging, the material is unavoidably deteriorated in its property. Accordingly, a compound exhibiting a blocking effect even in the UV-A region and being usable as an ultraviolet absorber with more excellent light resistance than ever is demanded.

On the other hand, the benzophenone-based or benzotriazole-based ultraviolet absorber has relatively good light resistance and when the concentration or film thickness is increased, can relatively clearly cut light up to a long-wavelength region (see, for example, Patent Documents 6 and 7). However, in the case of coating such an ultraviolet absorber by mixing it with a resin or the like, the film thickness is usually limited to about tens of μm at most. For cutting light up to a long-wavelength region with such a film thickness, an ultraviolet absorber must be added in a fairly high concentration, but mere addition in a high concentration is faced with a problem of causing precipitation of the ultraviolet absorber or bleed-out during long-term use. Addition in a high concentration may also bring about a problem in terms of odor. In addition, many of the benzophenone-based or benzotriazole-based ultraviolet absorbers have low solubility, and it has been difficult to coat the absorber by mixing it with a resin or the like in a high concentration.

RELATED ART DOCUMENT

Patent Document

Patent Document 1: JP-A-5-339033
Patent Document 2: JP-A-5-345639
Patent Document 3: JP-A-6-56466
Patent Document 4: JP-T-2002-524452
Patent Document 5: Japanese Patent 3,965,631
Patent Document 6: JP-A-6-145387
Patent Document 7: JP-A-2003-177235

SUMMARY OF THE INVENTION

Problems that the Invention is to Solve

An object of the present invention is to provide a polyester resin composition being able to maintain a long-wavelength ultraviolet-blocking effect for a long period of time, ensuring high solubility for a solvent and no problem in terms of odor, and having excellent light resistance. Another object of the present invention is to provide a molded article having a long-wavelength ultraviolet-blocking effect, such as film, where thanks to high solubility for a solvent, precipitation or bleed-out scarcely occurs with long-term aging and the color hue is kept from changing.

Means for Solving the Problems

As a result of intensive studies on the problems above, the present inventors have found a novel triazine-based compound that exhibits a blocking effect up to a UV-A region and highly solubility in an organic solvent as well as unprecedented light resistance, and by incorporating this compound into a polyester resin composition, the present invention has been accomplished.

That is, the objects of the present invention have been attained by the following means.

[1] A polyester resin composition comprising a compound represented by the following formula (1) and a polyester resin:

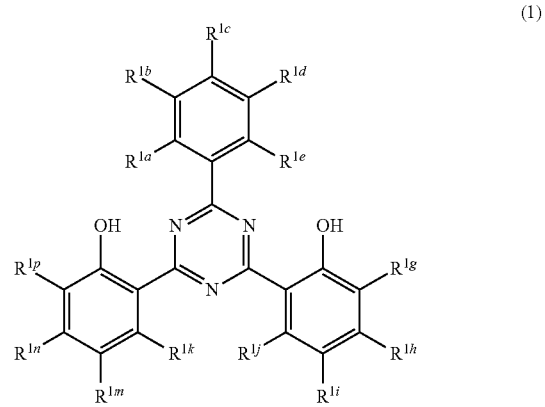

(1)

wherein
each of $R^{1a}, R^{1b}, R^{1c}, R^{1d}$ and $R^{1e}$ independently represents a hydrogen atom or a monovalent substituent excluding OH, at least one substituent represents a substituent having a positive Hammett's σp value, and
substituents may combine with each other to form a ring; and each of $R^{1g}, R^{1h}, R^{1i}, R^{1j}, R^{1k}, R^{1m}, R^{1n}$ and $R^{1p}$ independently represents a hydrogen atom or a monovalent substituent, and substituents may combine with each other to form a ring.

[2] The polyester resin composition as described in claim 1, wherein the monovalent substituent is a halogen atom, a substituted or unsubstituted alkyl group having a carbon number of 1 to 20, a cyano group, a carboxyl group, a substituted or unsubstituted alkoxycarbonyl group, a substituted or unsubstituted carbamoyl group, a substituted or unsubstituted alkylcarbonyl group, a nitro group, a substituted or unsubstituted amino group, a hydroxy group, an alkoxy group having a carbon number of 1 to 20, a substituted or unsubstituted aryloxy group, a substituted or unsubstituted sulfamoyl group, a thiocyanate group, or a substituted or unsubstituted alkylsulfonyl group, and in the case where the monovalent substituent has a substituent, the substituent is a halogen atom, an alkyl group having a carbon number of 1 to 20, a cyano group, a carboxyl group, an alkoxycarbonyl group, a carbamoyl group, an alkylcarbonyl group, a nitro group, an amino group, a hydroxy group, an alkoxy group having a carbon number of 1 to 20, an aryloxy group, a sulfamoyl group, a thiocyanate group, or an alkylsulfonyl group.

[3] The polyester resin composition as described in claim 1 or 2, wherein at least one of $R^{1b}$, $R^{1c}$ and $R^{1d}$ is a substituent having a positive Hammett's σp value.

[4] The polyester resin composition as described in any one of claims 1 to 3, wherein the Hammett's σp value is from 0.1 to 1.2.

[5] The polyester resin composition as described in any one of claims 1 to 4, wherein the substituent having a positive Hammett's σp value is a group selected from $COOR^r$, $CONR^s_2$, CN, $CF_3$, a halogen atom, $NO_2$, and $SO_3M$, wherein each of $R^r$ and $R^s$ independently represents a hydrogen atom or a monovalent substituent, and M represents a hydrogen atom or an alkali metal.

[6] The polyester resin composition as described in any one of claims 1 to 5, wherein the substituent having a positive Hammett's σp value is $COOR^r$ or CN, wherein $R^r$ represents a hydrogen atom or a monovalent substituent.

[7] The polyester resin composition as described in any one of claims 1 to 6, wherein $R^{1h}$ or $R^{1n}$ is a hydrogen atom.

[8] The polyester resin composition as described in any one of claims 1 to 7, wherein each of $R^{1g}$, $R^{1h}$, $R^{1i}$, $R^{1j}$, $R^{1k}$, $R^{1m}$, $R^{1n}$ and $R^{1p}$ is a hydrogen atom.

[9] The polyester resin composition as described in any one of claims 1 to 8, wherein pKa of the compound represented by formula (1) is from −5.0 to −7.0.

[10] The polyester resin composition as claimed in any one of claims 1 to 9, containing the compound represented by formula (1) in an amount of 0.01 to 30% by mass.

[11] The polyester resin composition as described in any one of claims 1 to 10, further comprising an additive.

[12] The polyester resin composition as described in any one of claims 1 to 11, wherein the polyester resin is at least one member selected from the group consisting of polyethylene terephthalate, polyethylene naphthalate, polybutylene terephthalate, poly-1,4-cyclohexanedimethylene terephthalate, and polyethylene-1,2-diphenoxyethane-4,4'-dicarboxylate.

[13] The polyester resin composition as described in any one of claims 1 to 12, wherein the polyester resin is polyethylene terephthalate.

[14] The polyester resin composition as described in any one of claims 11 to 13, wherein the additive is an ultraviolet absorber, a light stabilizer, an antioxidant, a heat stabilizer, a fluorescent brightener or a flame retardant.

[15] A polyester resin molded article comprising the polyester resin composition described in any one of claims 1 to 14, wherein the thickness is from 0.1 μm to 25 mm.

[16] A photovoltaic backsheet comprising the polyester resin composition described in any one of claims 1 to 14.

[17] A photovoltaic front sheet comprising the polyester resin composition described in any one of claims 1 to 14.

[18] A window film comprising the polyester resin composition described in any one of claims 1 to 14.

[19] A packaging film for food or medical use comprising the polyester resin composition described in any one of claims 1 to 14.

[20] An agricultural film comprising the polyester resin composition described in any one of claims 1 to 14.

[21] An optical film comprising the polyester resin composition described in any one of claims 1 to 14.

[22] A fiber comprising the polyester resin composition described in any one of claims 1 to 14.

[23] A photovoltaic module comprising the polyester resin composition described in any one of claims 1 to 14.

Advantage of the Invention

By virtue of containing the compound represented by formula (1), which exhibits high solubility in an organic solvent and an ultraviolet-blocking effect even in the long-wavelength ultraviolet region as well as light resistance, the polyester resin composition of the present invention maintains a long-wavelength ultraviolet-blocking effect for a long period of time, exhibits high solubility for a solvent, and is reduced in change of the color hue with long-term aging. Furthermore, by molding the composition, a molded article having a long-wavelength ultraviolet-blocking effect, such as film, where precipitation or bleed-out scarcely occurs with long-term aging and the color hue is kept from changing, can be obtained. In addition, although the ultraviolet absorber composition is preferably odorless depending on the application, the ultraviolet absorber composition of the present invention is odorless even when used in a high concentration and is excellent also in view of odor.

BRIEF DESCRIPTION OF THE DRAWINGS

FIGURE is a partial cross-sectional view showing the structure of the preferred photovoltaic module of the present invention.

MODE FOR CARRYING OUT THE INVENTION

The present invention is described in detail below.

The polyester resin composition of the present invention contains a compound represented by the following formula (1) and a polyester resin.

The compound represented by the following formula (1) exhibits high solubility in an organic solvent and an ultraviolet-blocking effect in a long-wavelength region as well as has light resistance. Therefore, when the compound is added as an ultraviolet absorber to a polyester resin, precipitation or bleed-out does not occur, the long-wavelength ultraviolet-absorbing ability can be maintained for a long period of time, and change in the color hue of the resin can be reduced.

First, the compound represented by formula (1) is described below.

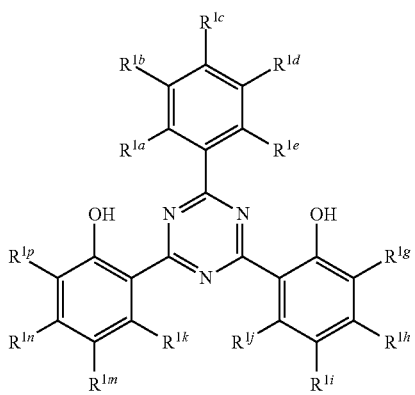

(1)

[wherein each of $R^{1a}$, $R^{1b}$, $R^{1c}$, $R^{1d}$ and $R^{1e}$ independently represents a hydrogen atom or a monovalent substituent excluding OH, at least one of the substituents represents a substituent having a positive Hammett's σp value, and the substituents may combine with each other to form a ring; and each of $R^{1g}$, $R^{1h}$, $R^{1i}$, $R^{1j}$, $R^{1k}$, $R^{1m}$, $R^{1n}$ and $R^{1p}$ independently represents a hydrogen atom or a monovalent substituent, and the substituents may combine with each other to form a ring].

Each of $R^{1a}$, $R^{1b}$, $R^{1c}$, $R^{1d}$ and $R^{1e}$ independently represents a hydrogen atom or a monovalent substituent excluding OH, and at least one of the substituents represents a substituent having a positive Hammett's σp value.

Out of the substituents represented by $R^{1a}$, $R^{1b}$, $R^{1c}$, $R^{1d}$ and $R^{1e}$, preferably, one to three members represent a substituent having a positive Hammett's σp value; and more preferably, one or two members represent a substituent having a positive Hammett's σp value.

Examples of the monovalent substituent (hereinafter referred to as the substituent A) in formula (1) include a halogen atom (e.g., fluorine atom, chlorine atom, bromine atom, iodine atom), an alkyl group having a carbon number of 1 to 20 (e.g., methyl, ethyl), an aryl group having a carbon number of 6 to 20 (e.g., phenyl, naphthyl), a cyano group, a carboxyl group, an alkoxycarbonyl group (e.g., methoxycarbonyl), an aryloxycarbonyl group (e.g., phenoxycarbonyl), a substituted or unsubstituted carbamoyl group (e.g., carbamoyl, N-phenylcarbamoyl, N,N-dimethylcarbamoyl), an alkylcarbonyl group (e.g., acetyl), an arylcarbonyl group (e.g., benzoyl), a nitro group, a substituted or unsubstituted amino group (e.g. amino, dimethylamino, anilino, substituted sulfoamino), an acylamino group (e.g., acetamide, ethoxycarbonylamino), a sulfonamido group (e.g., methanesulfonamido), an imido group (e.g., succinimido, phthalimido), an imino group (e.g., benzylideneamino), a hydroxy group, an alkoxy group having a carbon number of 1 to 20 (e.g., methoxy), an aryloxy group (e.g., phenoxy), an acyloxy group (e.g., acetoxy), an alkylsulfonyloxy group (e.g., methanesulfonyloxy), an arylsulfonyloxy group (e.g., benzenesulfonyloxy), a sulfo group, a substituted or unsubstituted sulfamoyl group (e.g., sulfamoyl, N-phenylsulfamoyl), an alkylthio group (e.g., methylthio), an arylthio group (e.g., phenylthio), a thiocyanate group, an alkylsulfonyl group (e.g., methanesulfonyl), an arylsulfonyl group (e.g., benzenesulfonyl), and a heterocyclic group having a carbon number of 6 to 20 (e.g., pyridyl, morpholino).

The substituent may be further substituted and when a plurality of substituents are present, they may be the same or different. In this case, examples of the substituent include the above-described monovalent substituent A. The substituents may combine with each other to form a ring.

Examples of the ring formed by combining the substituents with each other include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring, and a phosphole ring.

The monovalent substituent in formula (1) is preferably a halogen atom, a substituted or unsubstituted alkyl group having a carbon number of 1 to 20, a cyano group, a carboxyl group, a substituted or unsubstituted alkoxycarbonyl group, a substituted or unsubstituted carbamoyl group, a substituted or unsubstituted alkylcarbonyl group, a nitro group, a substituted or unsubstituted amino group, a hydroxy group, a substituted or unsubstituted alkoxy group having a carbon number of 1 to 20, a substituted or unsubstituted aryloxy group, a substituted or unsubstituted sulfamoyl group, a thiocyanate group, or a substituted or unsubstituted alkylsulfonyl group, more preferably $OR^u$ ($R^u$ represents a hydrogen atom or a monovalent substituent), an alkyl group or an amido group, still more preferably $OR^u$ or an alkyl group.

$R^u$ represents a hydrogen atom or a monovalent substituent, and examples of the monovalent substituent include the substituent A. In particular, a linear or branched alkyl group having a carbon number of 1 to 20 is preferred, and a linear or branched alkyl group having a carbon number of 1 to 6 is more preferred. Examples of the linear or branched alkyl group having a carbon number of 1 to 6 include methyl, ethyl, n-propyl, i-propyl, n-butyl, i-butyl, s-butyl, tert-butyl, n-pentyl, i-pentyl, tert-pentyl, n-hexyl, i-hexyl, tert-hexyl, n-octyl, tert-octyl, and i-octyl. Among these, methyl and ethyl are preferred, and methyl is more preferred.

In the present invention, a first preferred embodiment includes an embodiment where at least one of $R^{1a}$, $R^{1c}$ and $R^{1e}$ represents a substituent having a positive Hammett's σp value. More preferably, $R^{1c}$ represents a substituent having a positive Hammett's σp value.

It is still more preferred that $R^{1c}$ represents a substituent having a positive Hammett's σp value and each of $R^{1a}$, $R^{1b}$, $R^{1d}$ and $R^{1e}$ represents a hydrogen atom.

In the case where $R^{1c}$ represents a substituent having a positive Hammett's σp value, LUMO is stabilized by an electron-withdrawing group, and this advantageously yields short excitation life and enhanced light resistance.

Also, a second preferred embodiment includes an embodiment where each of $R^{1a}$, $R^{1c}$ and $R^{1e}$ represents a hydrogen atom and each of $R^{1b}$ and $R^{1d}$ independently represents a hydrogen atom or a substituent having a positive Hammett's σp value, with at least one being a substituent having a positive Hammett's σp value. Thanks to this configuration, the compound represented by formula (1) is excellent particularly in the solvent solubility and in turn, exhibits excellent compatibility with a polyester resin, and the polyester resin composition containing the compound has an effect of hardly allowing precipitation or bleed-out of the compound.

The solvent solubility means solubility in an organic solvent such as ethyl acetate, methyl ethyl ketone and toluene, and in view of compatibility with the polyester resin, the compound is preferably dissolved in a ratio of 10 mass % or more, more preferably 30 mass % or more, based on the solvent used.

<First Preferred Embodiment>

In the first embodiment, the substituent having a positive Hammett's σp value in formula (1) is preferably an electron-withdrawing group having a $\sigma_p$ value of 0.1 to 1.2. Specific examples of the electron-withdrawing group having a positive $\sigma_p$ value include $COOR^r$ ($R^r$ represents a hydrogen atom or a monovalent substituent and is a hydrogen atom or an alkyl group, preferably a hydrogen atom), $CONR^s_2$ ($R^s$ represents a hydrogen atom or a monovalent substituent), CN, a halogen atom, $NO_2$, $SO_3M$ (M represents a hydrogen atom or an alkali metal), an acyl group, a formyl group, an acyloxy group, an acylthio group, an alkyloxycarbonyl group, an aryloxycarbonyl group, a dialkylphosphono group, a diarylphosphono group, a dialkylphosphinyl group, a diarylphosphinyl group, a phosphoryl group, an alkylsulfinyl group, an arylsulfinyl group, an acylthio group, a sulfamoyl group, a thiocyanate group, a thiocarbonyl group, an imino group, an N atom-substituted imino group, a carboxy group (or a salt thereof), an alkyl group substituted with at least two or more halogen atoms (e.g., $CF_3$), an alkoxy group substituted with at least two or more halogen atoms, an aryloxy group substituted with at least two or more halogen atoms, an acylamino group, an alkylamino group substituted with at least two or more halogen atoms, an alkylthio group substituted with at least two or more halogen atoms, an aryl group substituted with another electron-withdrawing group having a $\sigma_p$ value of 0.2 or more, a heterocyclic group, a halogen atom, an azo group, and a selenocyanate group. Details of the Hammett's σp value are described in Hansch, C., Leo, A., and Taft, R. W., *Chem. Rev.*, 1991, 91, 165-195.

The substituent having a positive Hammett's σp value in formula (1) is more preferably $COOR^r$, $CONR^s_2$, CN, $CF_3$, a halogen atom, $NO_2$ or $SO_3M$ [wherein each of $R^r$ and $R^s$ independently represents a hydrogen atom or a monovalent substituent, and M represents a hydrogen atom or an alkali metal], still more preferably $COOR^r$ or CN, yet still more preferably $COOR^r$, because of excellent light resistance and solubility.

Each of $R^r$ and $R^s$ represents a hydrogen atom or a monovalent substituent, and examples of the monovalent substituent include the substituent A. In particular, a linear or branched alkyl group having a carbon number of 1 to 20 is preferred, and a linear or branched alkyl group having a carbon number of 1 to 6 is more preferred. Examples of the linear or branched alkyl group having a carbon number of 1 to 6 include methyl, ethyl, n-propyl, i-propyl, n-butyl, i-butyl, s-butyl, tert-butyl, n-pentyl, i-pentyl, tert-pentyl, n-hexyl, i-hexyl, tert-hexyl, n-octyl, tert-octyl, and i-octyl. Among these, methyl and ethyl are preferred, and methyl is more preferred.

In the compound represented by formula (1), $R^{1c}$ is preferably any one of $COOR^r$, $CONR^s_2$, CN, $CF_3$, a halogen atom, $NO_2$ and $SO_3M$ (M represents a hydrogen atom or an alkali metal), more preferably $COOR^r$ or CN, still more preferably CN.

In the present invention, when each of $R^{1g}$, $R^{1h}$, $R^{1i}$, $R^{1j}$, $R^{1k}$, $R^{1m}$, $R^{1n}$ and $R^{1p}$ represents a monovalent substituent, preferably, at least one of $R^{1g}$, $R^{1h}$, $R^{1i}$, $R^{1j}$, $R^{1k}$, $R^{1m}$, $R^{1n}$ and $R^{1p}$ represents the substituent having a positive Hammett's σp value; more preferably, at least one of $R^{1g}$, $R^{1h}$, $R^{1i}$ and $R^{1j}$ represents the substituent having a positive Hammett's σp value (preferably from 0.1 to 1.2); and still more preferably, $R^{1h}$ represents the substituent having a positive Hammett's σp value. Above all, it is preferred that both $R^{1c}$ and $R^{1h}$ represent the substituent having a positive Hammett's σp value (preferably 0.1 to 1.2). Because, the compound has excellent light resistance.

In the present invention, preferably, each of $R^{1h}$ and $R^{1n}$ is independently any one of $COOR^r$, $CONR^s_2$, CN, $CF_3$, a halogen atom, $NO_2$ and $SO_3M$ (M represents a hydrogen atom or an alkali metal); more preferably, $R^{1h}$ or $R^{1n}$ is a hydrogen atom; still more preferably, both $R^{1h}$ and $R^{1n}$ are a hydrogen atom; and yet still more preferably, each of $R^{1g}$, $R^{1h}$, $R^{1i}$, $R^{1j}$, $R^{1k}$, $R^{1m}$, $R^{1n}$ and $R^{1p}$ represents a hydrogen atom. Because, the compound exhibits excellent light resistance.

In the compound represented by formula (1), preferably, $R^{1c}$ is a substituent having a positive Hammett's σp value (preferably from 0.1 to 1.2) and each of $R^{1g}$, $R^{1h}$, $R^{1i}$, $R^{1j}$, $R^{1k}$, $R^{1m}$, $R^{1n}$ and $R^{1p}$ is a hydrogen atom; and more preferably, $R^{1c}$ is any one of $COOR^r$, $CONR^s_2$, CN, $CF_3$, a halogen atom, $NO_2$ and $SO_3M$ (M represents a hydrogen atom or an alkali metal) and each of $R^{1g}$, $R^{1h}$, $R^{1i}$, $R^{1j}$, $R^{1k}$, $R^{1m}$, $R^{1n}$ and $R^{1p}$ is a hydrogen atom. Because, the compound exhibits excellent light resistance.

The compound represented by formula (1) preferably has a pKa of −5.0 to −7.0, more preferably −5.2 to −6.5, still more preferably −5.4 to −6.0.

<Preferred Second Embodiment>

The second preferred embodiment includes an embodiment where each of $R^{1a}$, $R^{1c}$ and $R^{1e}$ represents a hydrogen atom and each of $R^{1b}$ and $R^{1d}$ independently represents a hydrogen atom or a substituent having a positive Hammett's σp value, with at least one being a substituent having a positive Hammett's σp value.

In the second embodiment where each of $R^{1a}$, $R^{1c}$ and $R^{1e}$ represents a hydrogen atom and each of $R^{1b}$ and $R^{1d}$ independently represents a hydrogen atom or a substituent having a positive Hammett's σp value, with at least one being a substituent having a positive Hammett's σp value, the substituent having a positive Hammett's σp value in formula (1) is preferably $COOR^r$, $CONR^s_2$, CN, $CF_3$, a halogen atom, $NO_2$ or $SO_3M$ [wherein each of $R^r$ and $R^s$ independently represents a hydrogen atom or a monovalent substituent, and M represents a hydrogen atom or an alkali metal]. Examples of the monovalent substituent of $R^r$ and $R^s$ include the substituent A.

The substituent having a positive Hammett's σp value in formula (1) is more preferably $COOR^r$ or a cyano group, still more preferably $COOR^r$. Because, the compound exhibits excellent light fastness when the substituent having a positive Hammett's σp value is a cyano group, and exhibits excellent solubility when the substituent having a positive Hammett's σp value is $COOR^r$.

$R^r$ preferably represents a hydrogen atom or an alkyl group, more preferably a linear or branched alkyl group having a carbon number of 1 to 20, still more preferably a linear or branched alkyl group having a carbon number of 1 to 15.

In view of solubility for a solvent, $R^r$ is more preferably a branched alkyl group having a carbon number of 5 to 15.

The branched alkyl group has a secondary or tertiary carbon atom and preferably contains from 1 to 5, preferably from 1 to 3, preferably 1 or 2, secondary or tertiary carbon atoms, more preferably 1 or 2 secondary or tertiary carbon atoms. It is also preferred to contain from 1 to 3 asymmetric carbons.

In view of solubility for a solvent, $R^r$ is still more preferably a branched alkyl group having a carbon number of 5 to 15 and containing 1 or 2 secondary or tertiary carbon atoms and 1 or 2 asymmetric carbons.

This is because the symmetry of the compound structure is lost and the solubility is enhanced.

On the other hand, in view of ultraviolet absorbing ability, a linear or branched alkyl group having a carbon number of 1 to 6 is more preferred.

Examples of the linear or branched alkyl group having a carbon number of 1 to 6 include methyl, ethyl, n-propyl, i-propyl, n-butyl, i-butyl, s-butyl, tert-butyl, n-pentyl, i-pentyl, tert-pentyl, n-hexyl, i-hexyl, tert-hexyl, n-octyl, tert-octyl, and i-octyl. Among these, methyl and ethyl are preferred, and methyl is more preferred.

In the present invention, when each of $R^{1g}$, $R^{1h}$, $R^{1i}$, $R^{1j}$, $R^{1k}$, $R^{1m}$, $R^{1n}$ and $R^{1p}$ represents a monovalent substituent, preferably, at least one of $R^{1g}$, $R^{1h}$, $R^{1i}$, $R^{1j}$, $R^{1k}$, $R^{1m}$, $R^{1n}$ and $R^{1p}$ represents the substituent having a positive Hammett's σp value; more preferably, at least one of $R^{1g}$, $R^{1h}$, $R^{1i}$ and $R^{1j}$ represents the substituent having a positive Hammett's σp value (preferably from 0.1 to 1.2); and still more preferably, $R^{1h}$ represents the substituent having a positive Hammett's σp value. In particular, it is preferred that $R^{1b}$ or $R^{1d}$ and $R^{1h}$ represent the substituent having a positive Hammett's σp value (preferably 0.1 to 1.2). Because, the compound exhibits excellent light resistance.

In the present invention, preferably, each of $R^{1h}$ and $R^{1n}$ is independently any one of a hydrogen atom, $COOR^r$, $CONR^s_2$, a cyano group, $CF_3$, a halogen atom, a nitro group and $SO_3M$ (M represents a hydrogen atom or an alkali metal); more preferably, $R^{1h}$ or $R^{1n}$ is a hydrogen atom; still more preferably, both $R^{1h}$ and $R^{1n}$ are a hydrogen atom; and yet still more preferably, each of $R^{1g}$, $R^{1h}$, $R^{1i}$, $R^{1j}$, $R^{1k}$, $R^{1m}$, $R^{1n}$ and $R^{1p}$ represents a hydrogen atom. Because, the compound exhibits excellent light resistance.

In the compound represented by formula (1), preferably, $R^{1b}$ or $R^{1d}$ represents a substituent having a positive Hammett's σp value (preferably from 0.1 to 1.2) and each of $R^{1g}$, $R^{1h}$, $R^{1i}$, $R^{1j}$, $R^{1k}$, $R^{1m}$, $R^{1n}$ and $R^{1p}$ represents a hydrogen atom; and more preferably, $R^{1b}$ or $R^{1d}$ is any one of $COOR^r$, $CONR^s_2$, a cyano group, $CF_3$, a halogen atom, a nitro group and $SO_3M$ (M represents a hydrogen atom or an alkali metal) and each of $R^{1g}$, $R^{1h}$, $R^{1i}$, $R^{1j}$, $R^{1k}$, $R^{1m}$, $R^{1n}$ and $R^{1p}$ is a hydrogen atom. Because, the compound exhibits excellent light resistance.

The compound represented by formula (1) preferably has a pKa of −5.0 to −7.0, more preferably from −5.2 to −6.5, still more preferably −5.4 to −6.0.

Specific examples of the compound represented by formula (1) are illustrated below, but the present invention is not limited thereto.

In specific examples, Me indicates a methyl group, Ph indicates a phenyl group, and —$C_6H_{13}$ indicates n-hexyl.

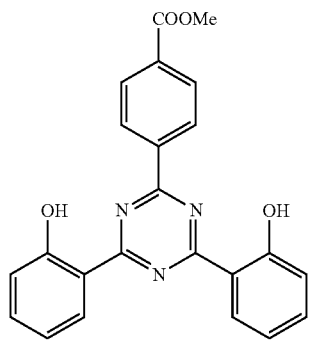

(1)

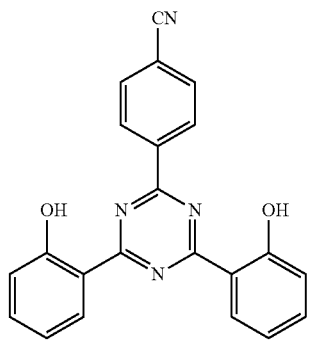

(2)

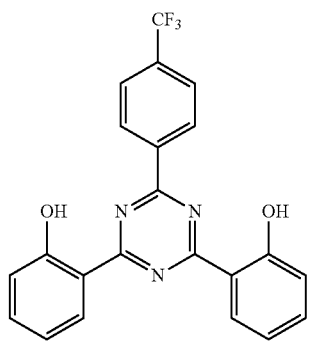

(3)

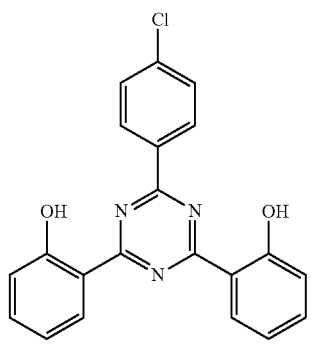

(4)

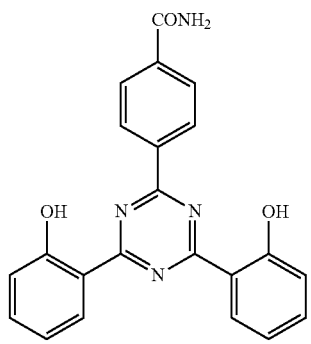

(5)

(6)
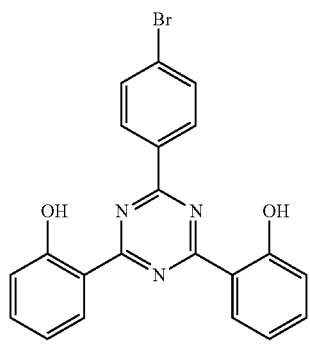
(7)
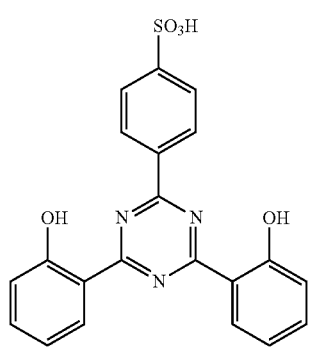
(8)
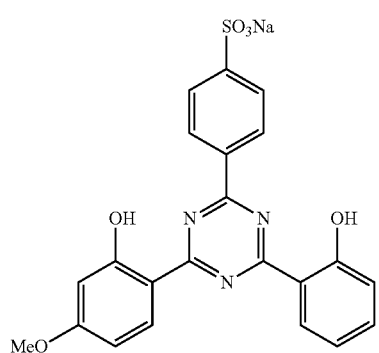
(9)
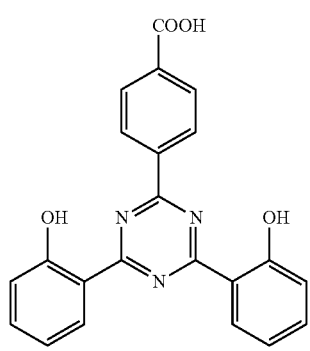
(10)
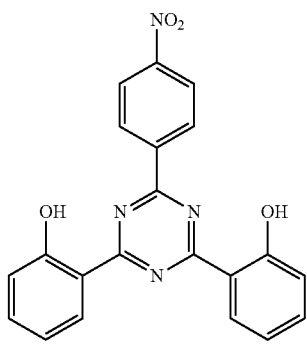
(11)
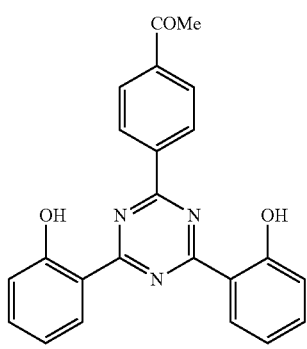
(12)
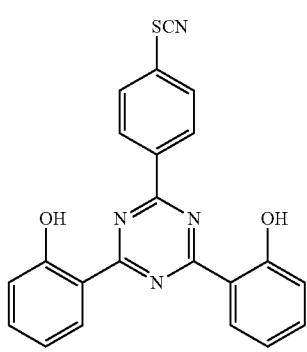
(13)
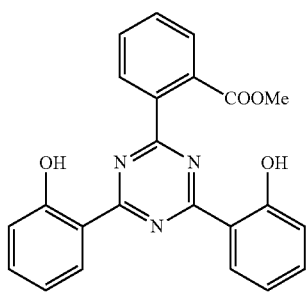
(14)
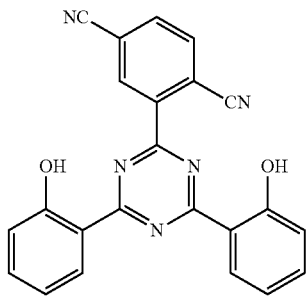

(15)
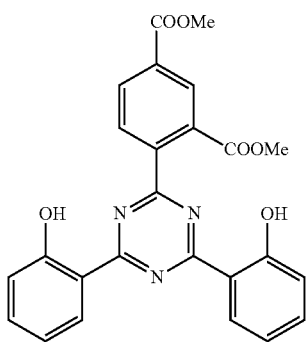
(16)
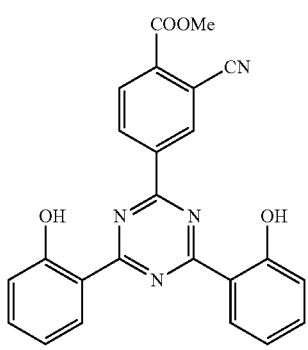
(17)
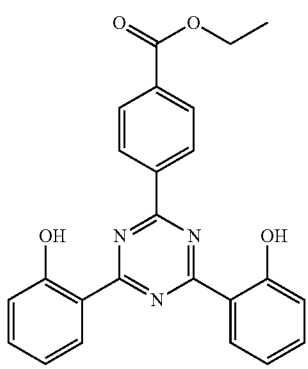
(18)
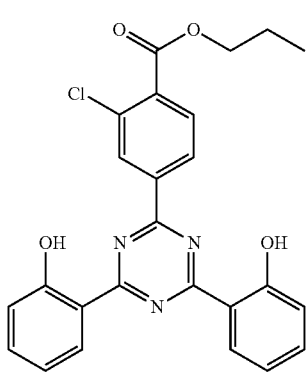
(19)
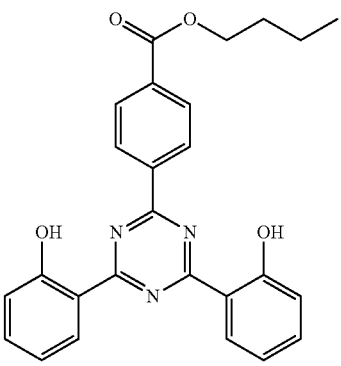
(20)
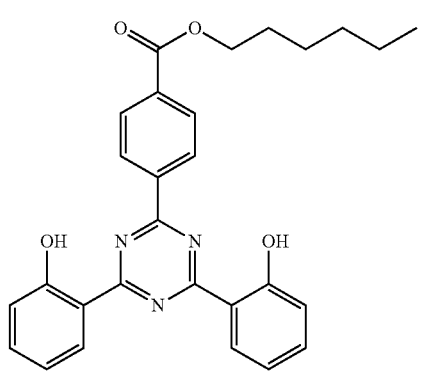
(21)
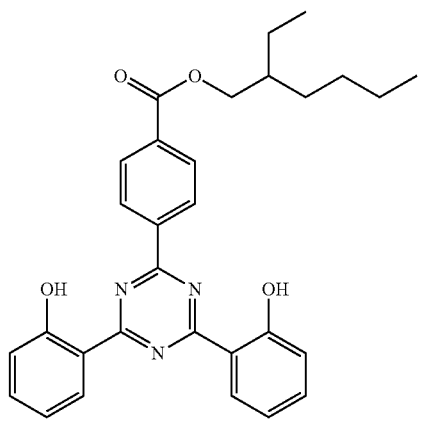
(22)
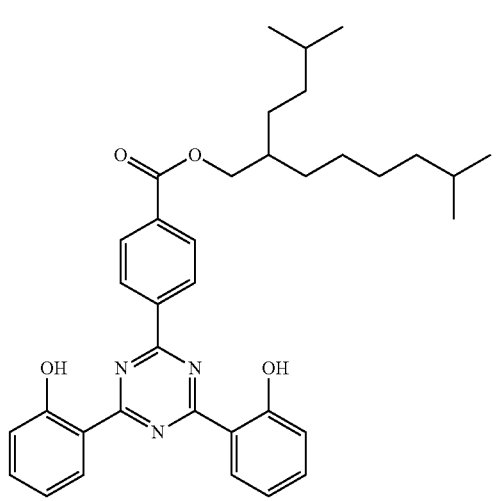

15
-continued
(23)
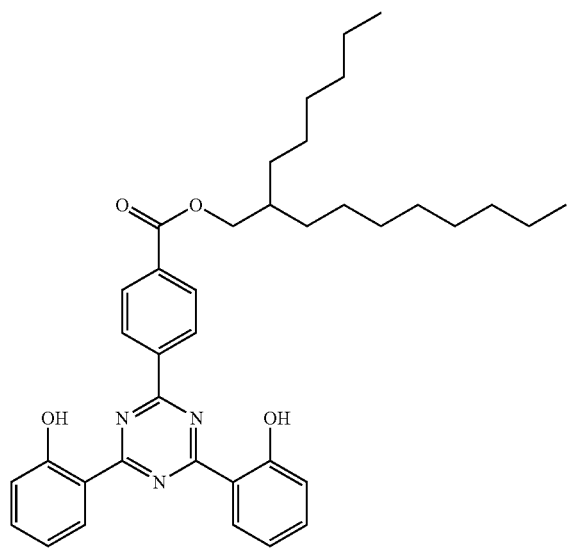
(24)
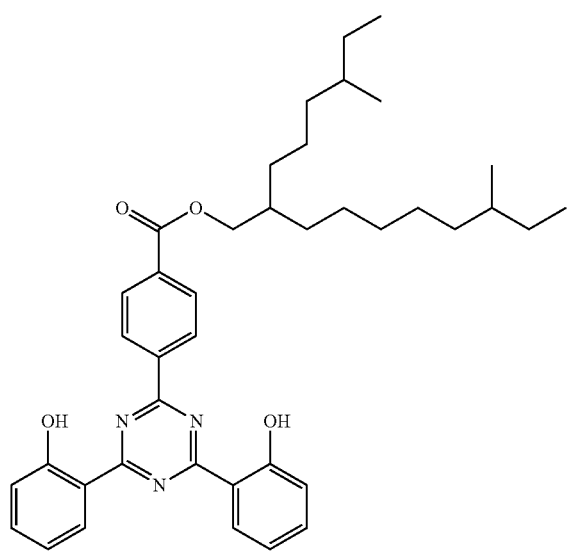
(25)
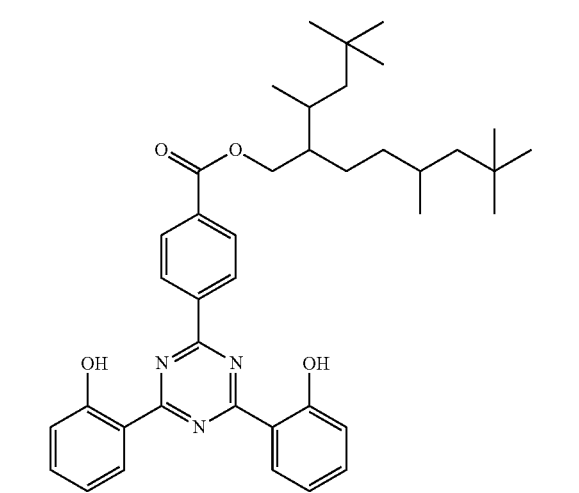
16
-continued
(26)
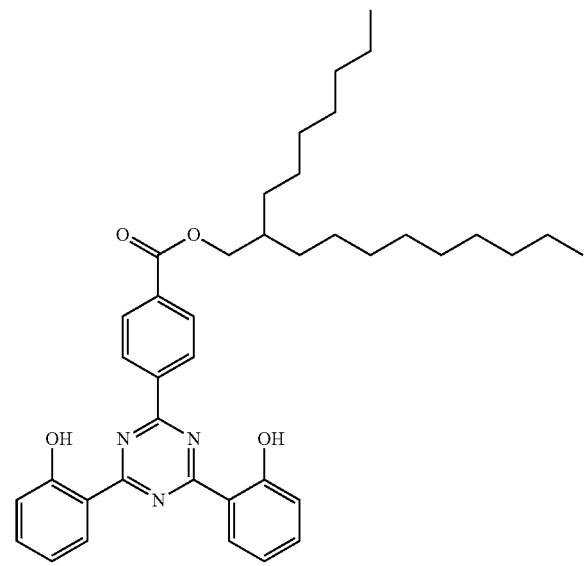
(27)
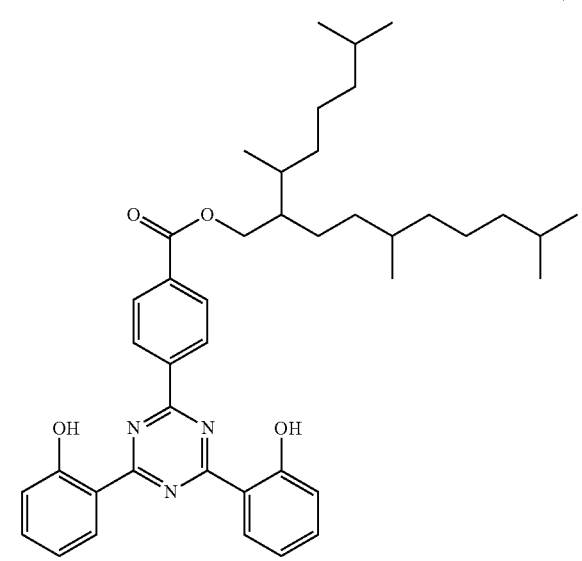
(28)
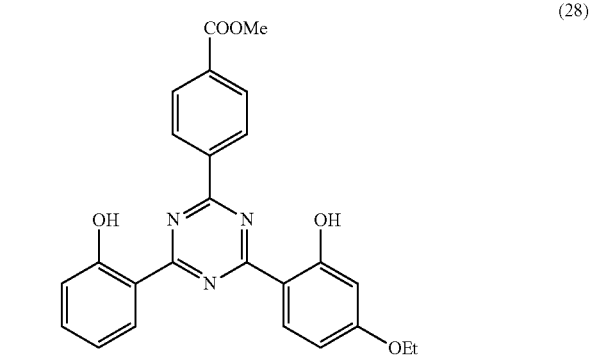

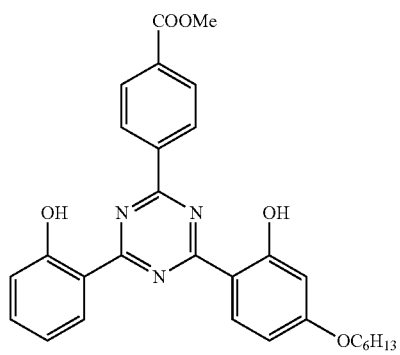
(29)
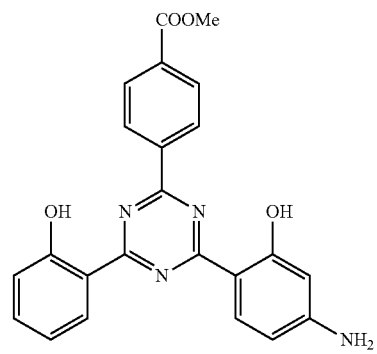
(33)
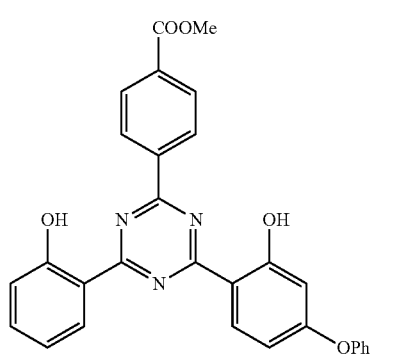
(30)
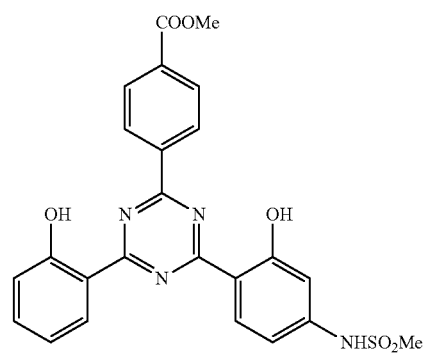
(34)
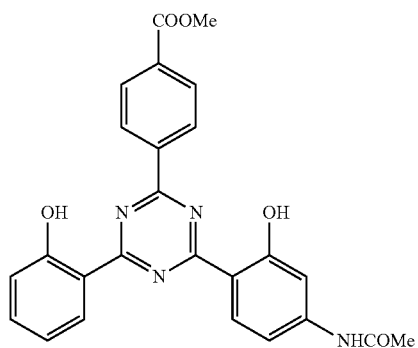
(31)
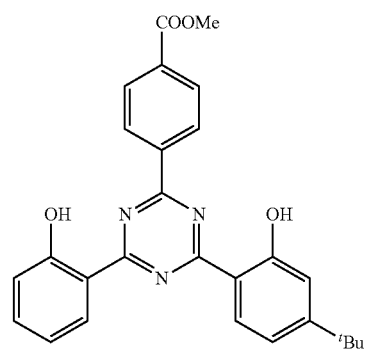
(35)
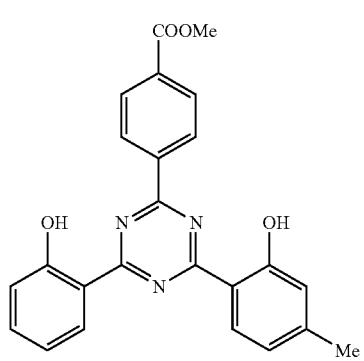
(32)
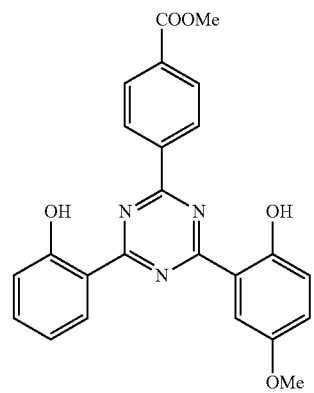
(36)

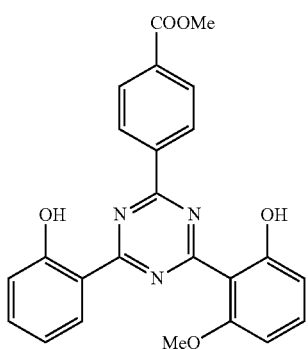 (37)
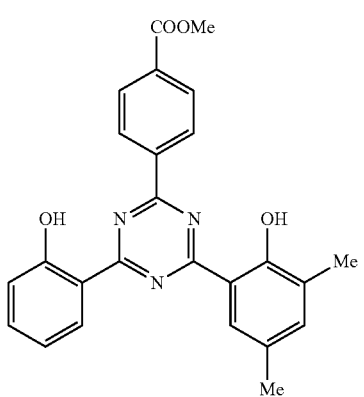 (38)
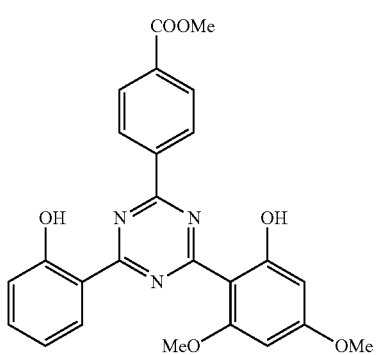 (39)
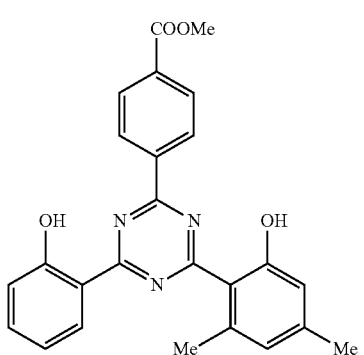 (40)
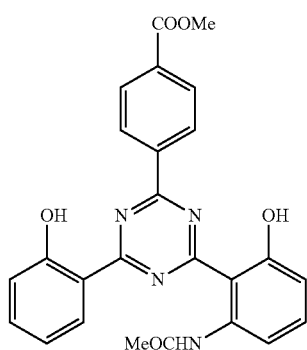 (41)
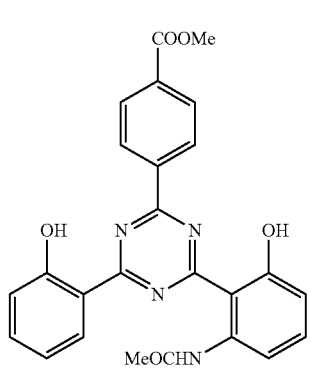 (42)
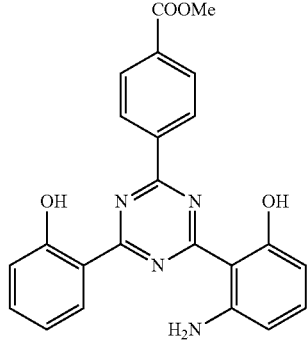 (43)
(44)

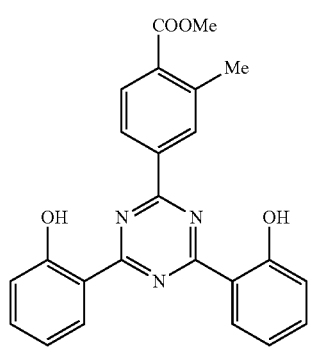
(45)
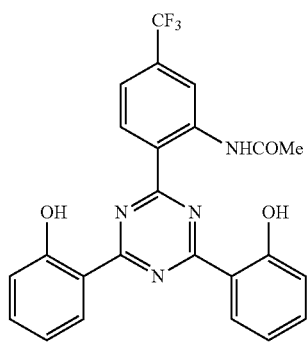
(49)
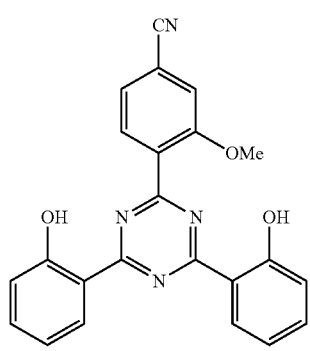
(46)
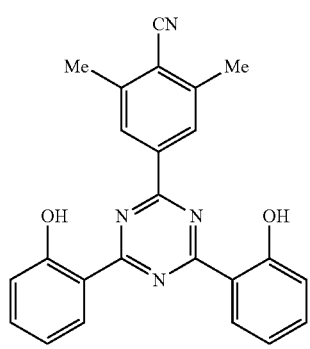
(50)
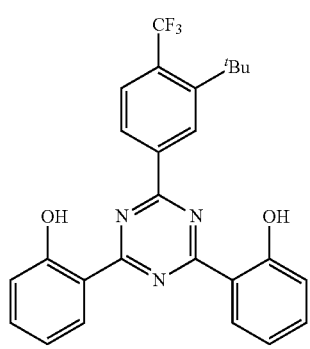
(47)
(51)
(48)
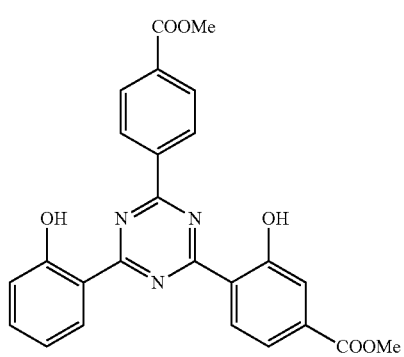
(55)

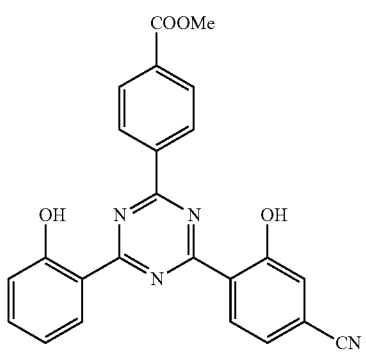 (56)
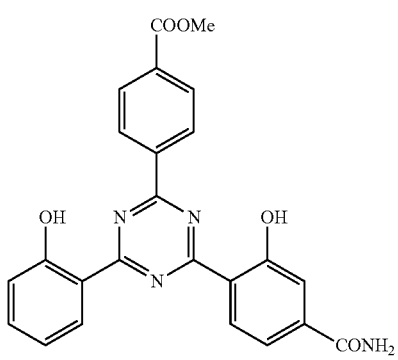 (57)
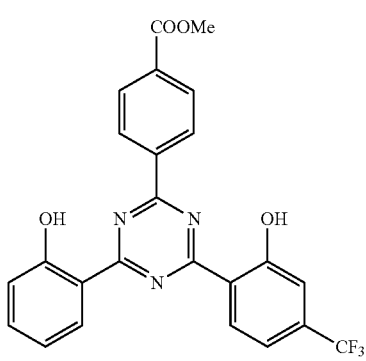 (58)
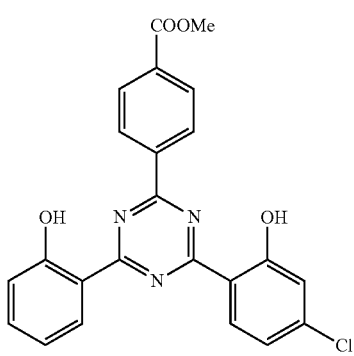 (59)
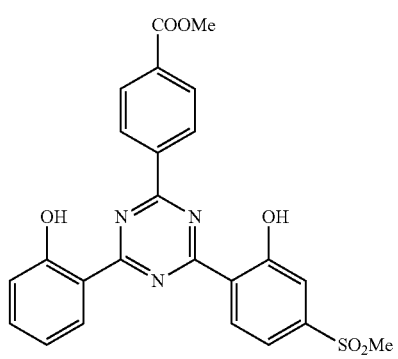 (60)
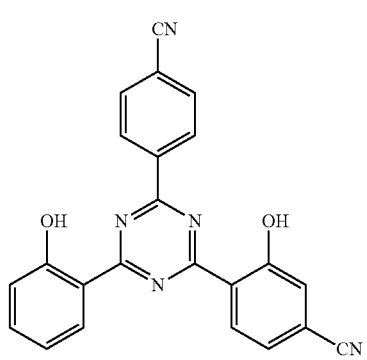 (61)
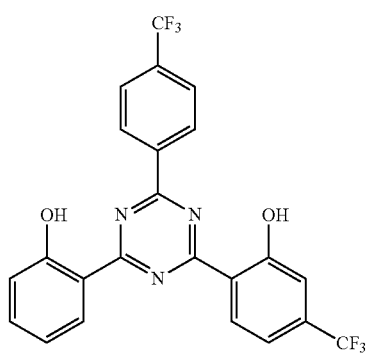 (62)
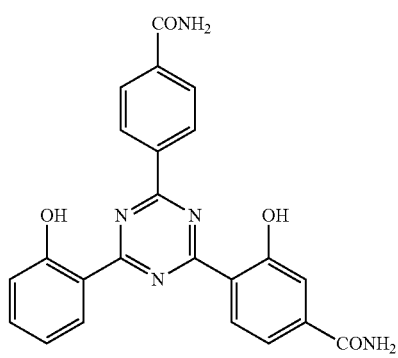 (63)

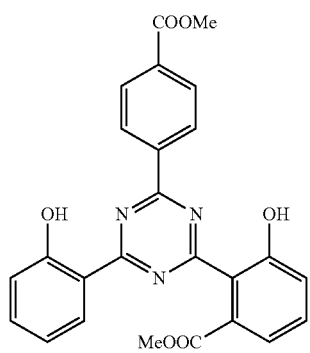
(64)
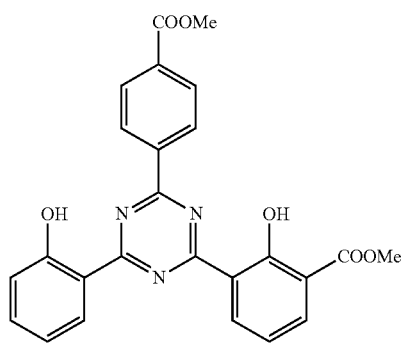
(65)
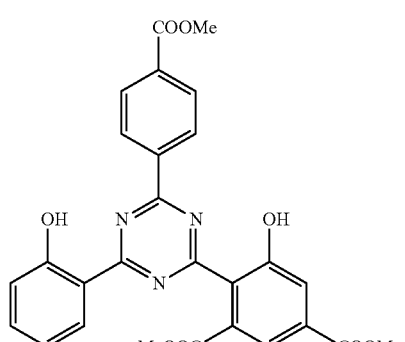
(66)
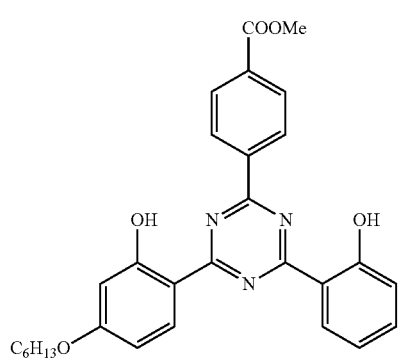
(67)
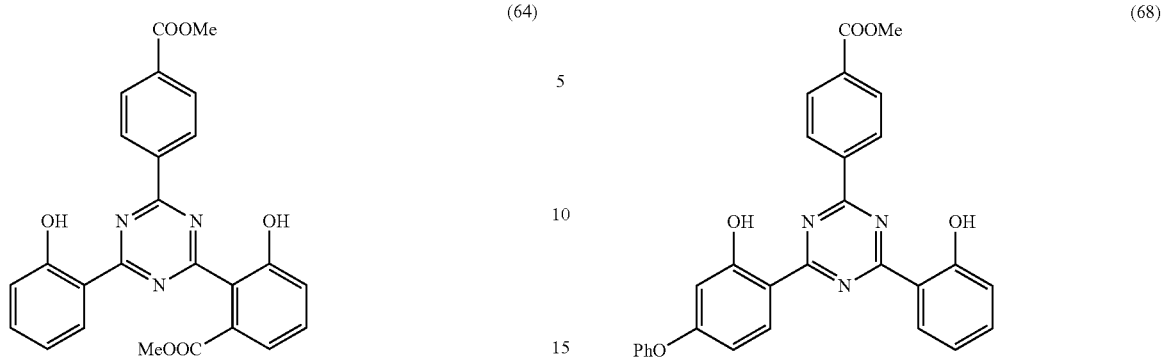
(68)
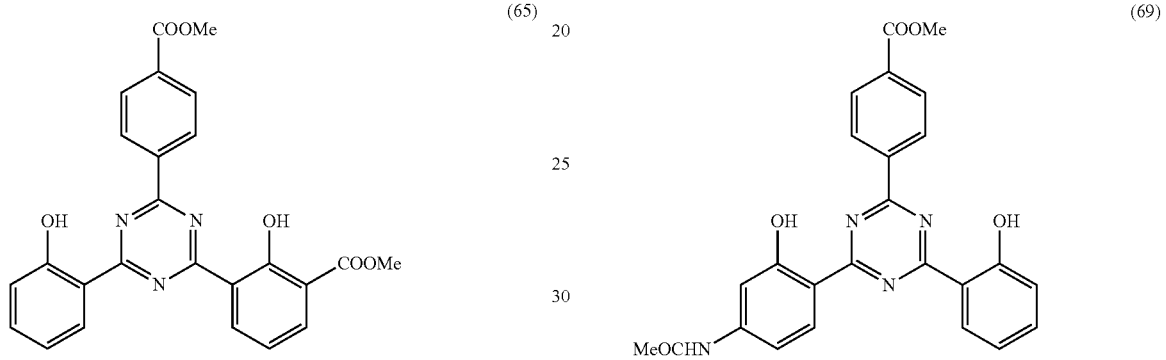
(69)
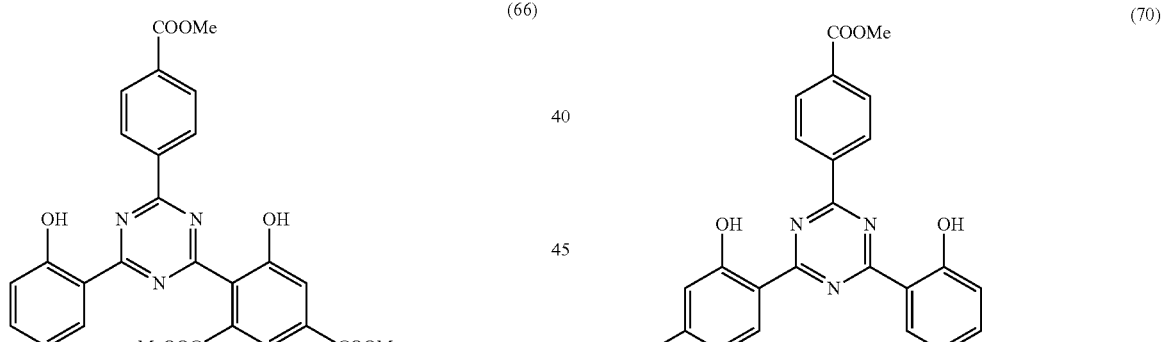
(70)
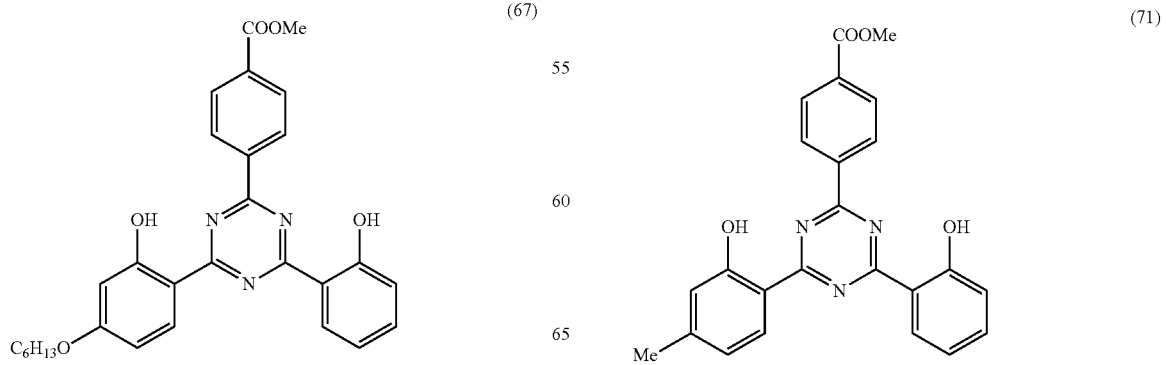
(71)

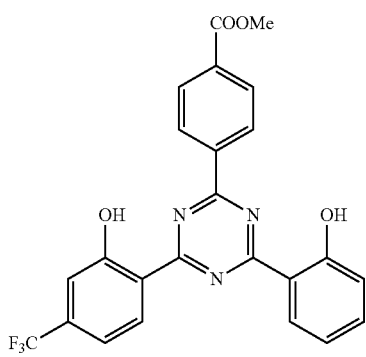
(72)
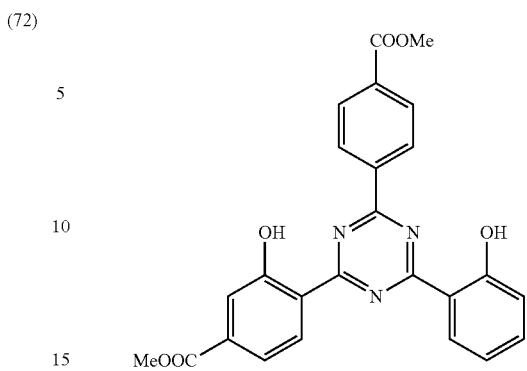
(76)
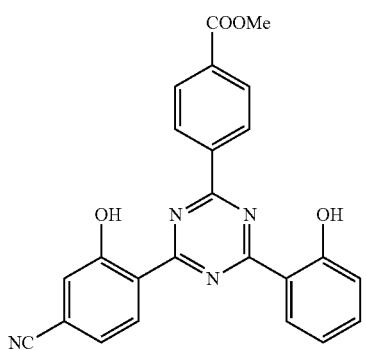
(73)
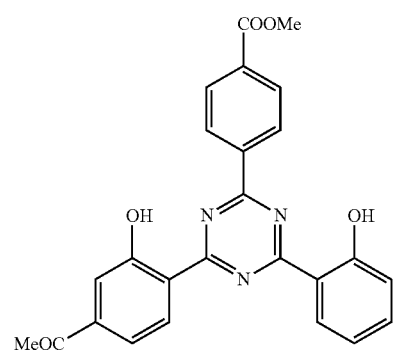
(77)
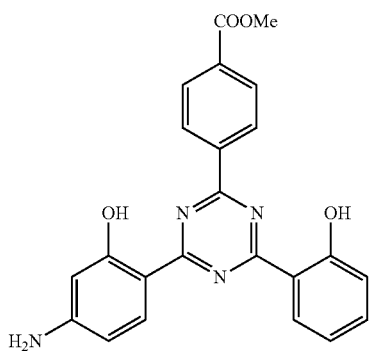
(74)
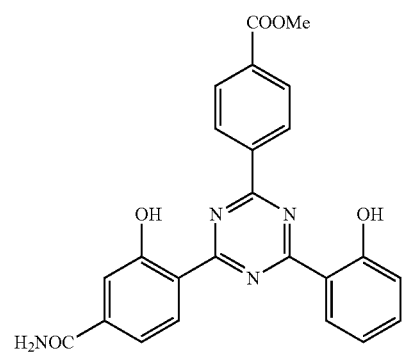
(78)
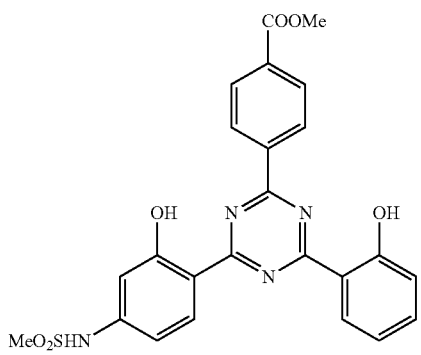
(75)
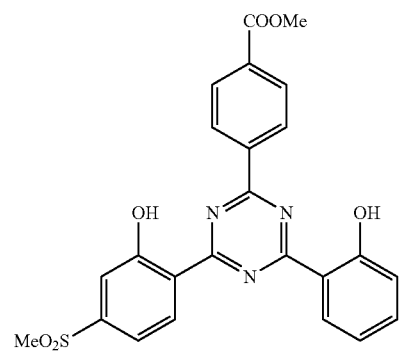
(79)

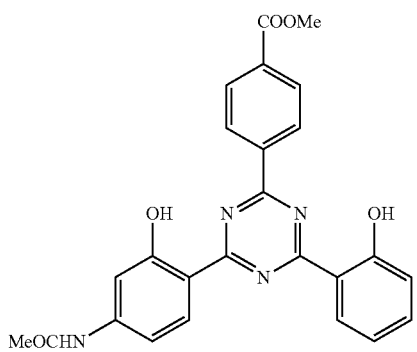
(80)
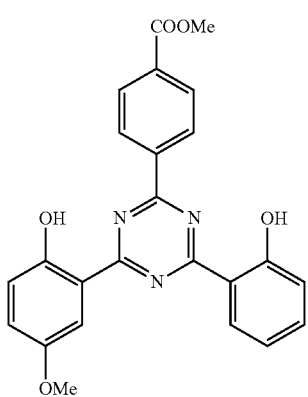
(81)
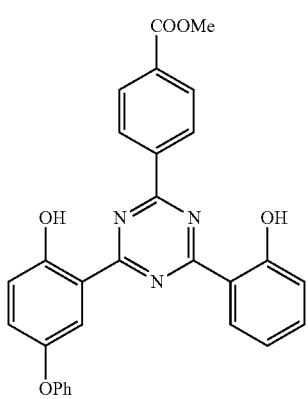
(82)
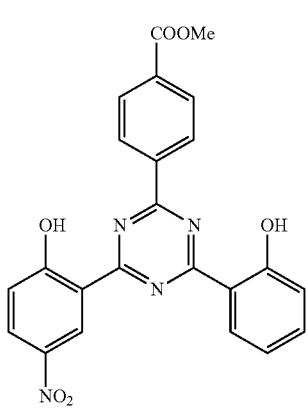
(83)
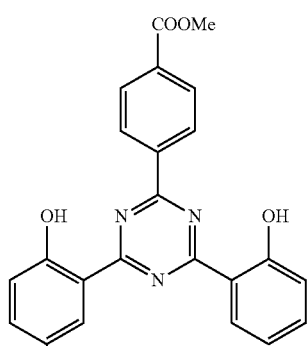
(84)
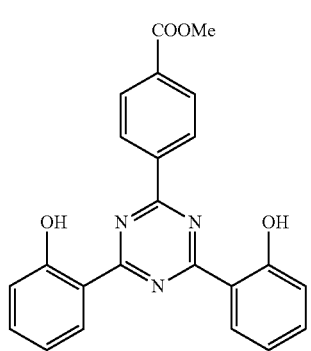
(85)
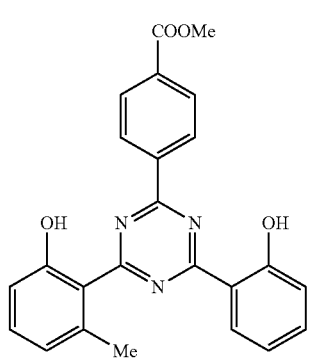
(86)
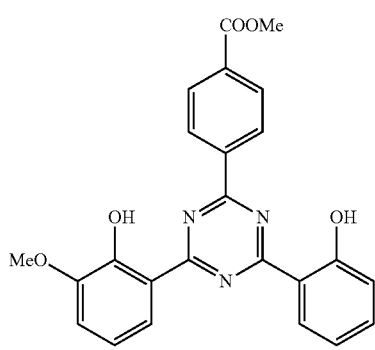
(87)

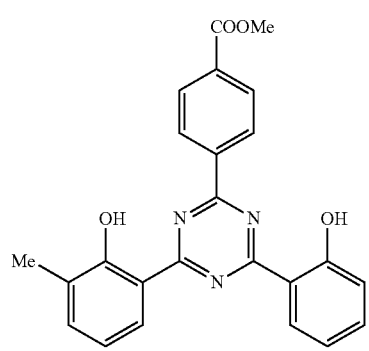
(88)
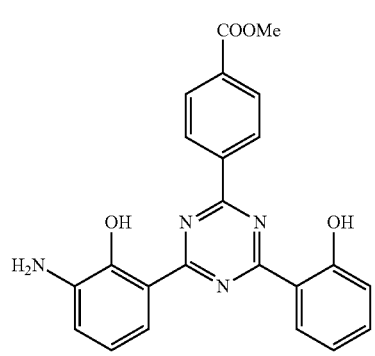
(89)
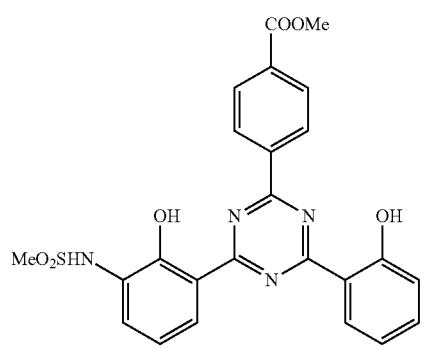
(90)
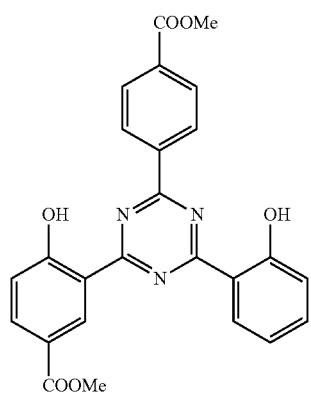
(91)
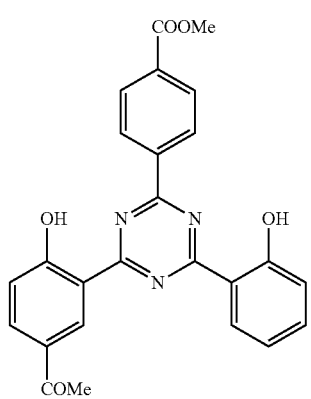
(92)
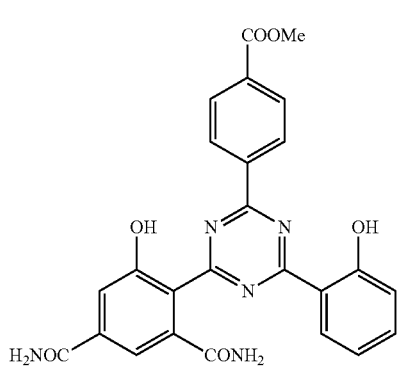
(93)
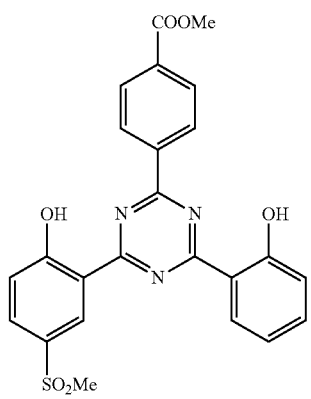
(94)
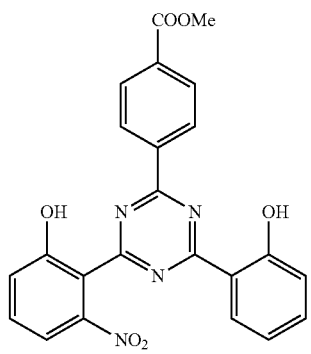
(95)

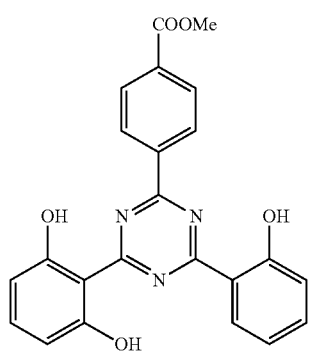
(96)
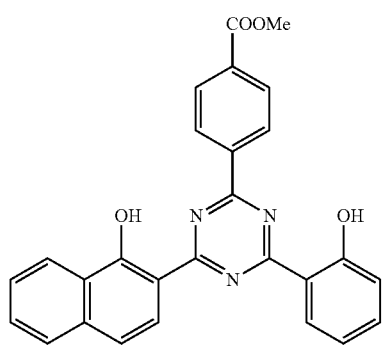
(97)
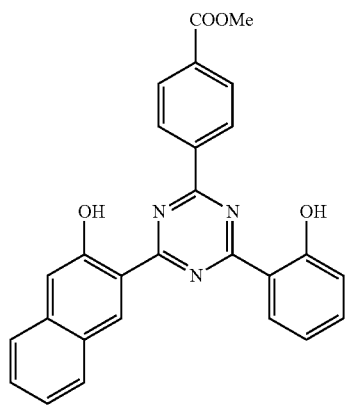
(98)
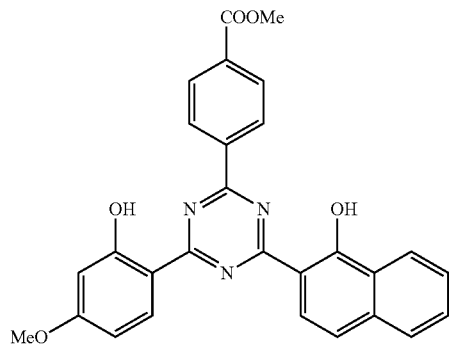
(99)
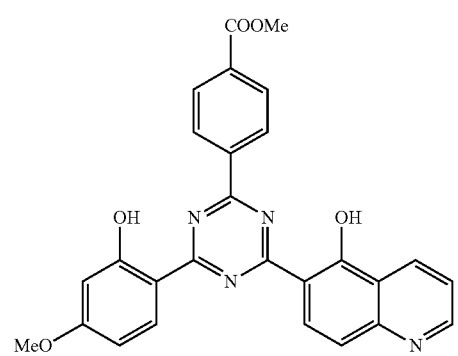
(100)
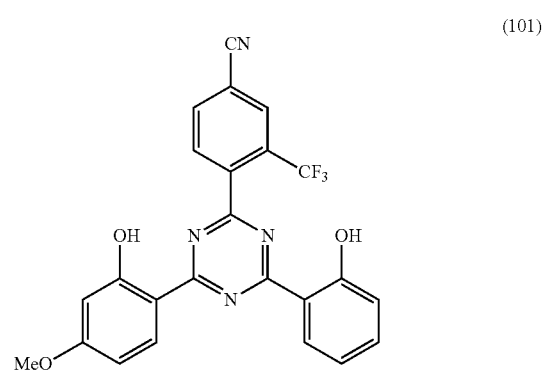
(101)
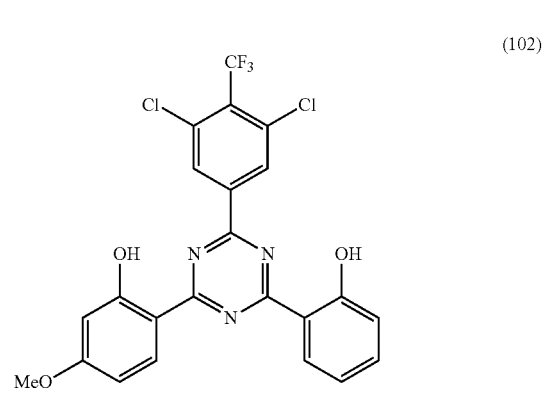
(102)
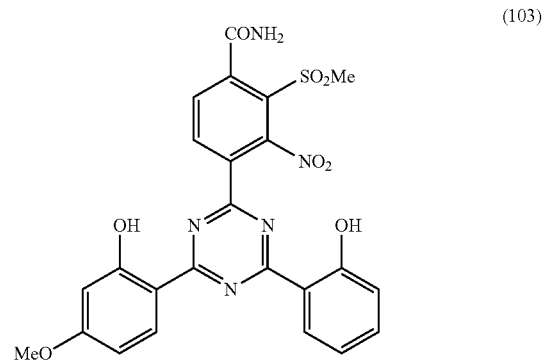
(103)

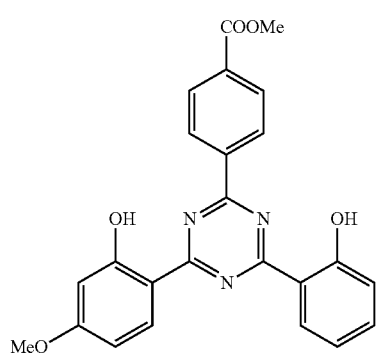
(104)
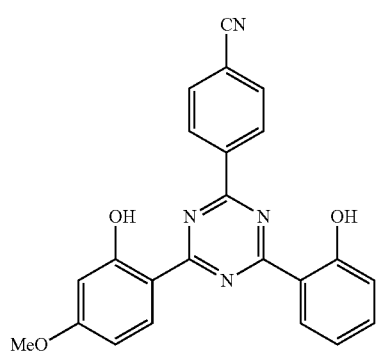
(105)
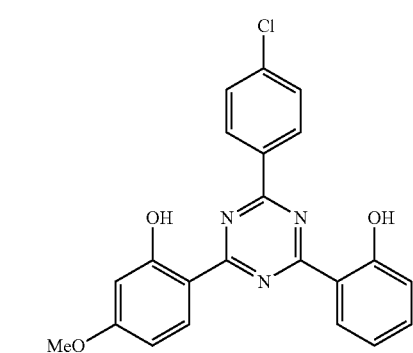
(106)
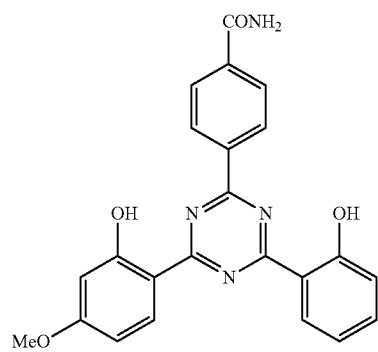
(107)
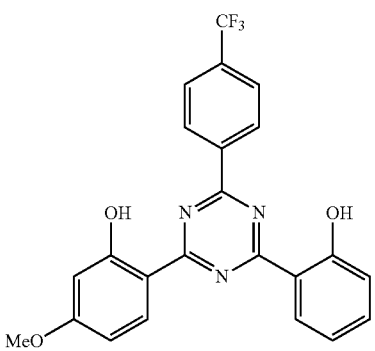
(108)
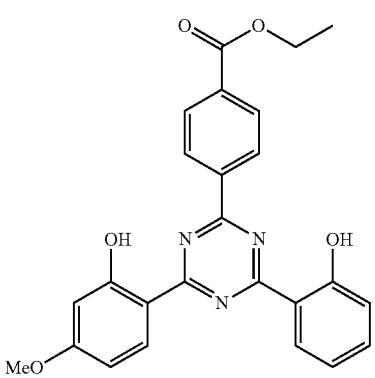
(109)
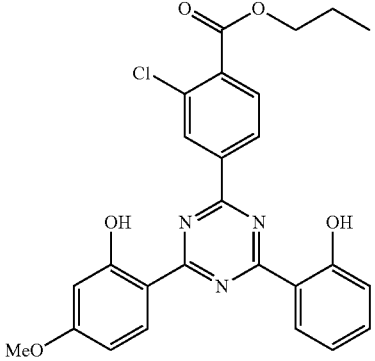
(110)
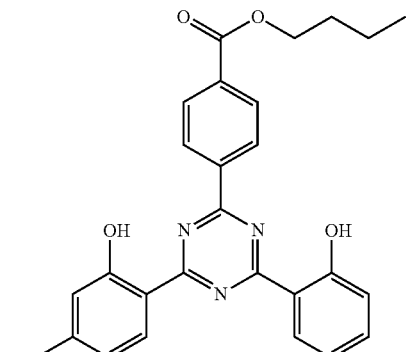
(111)

-continued
(112)
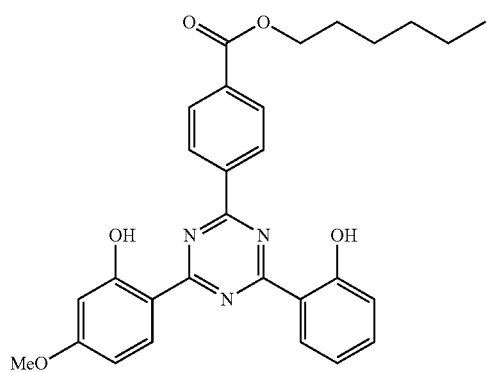
(113)
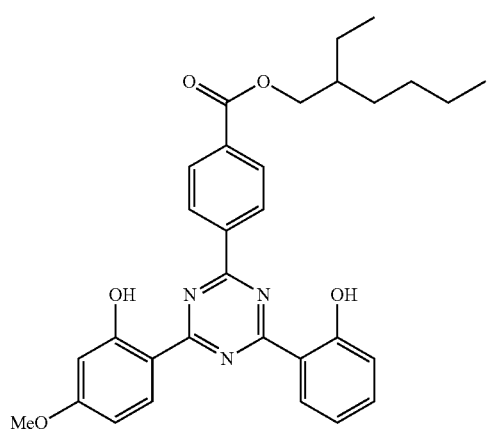
(114)
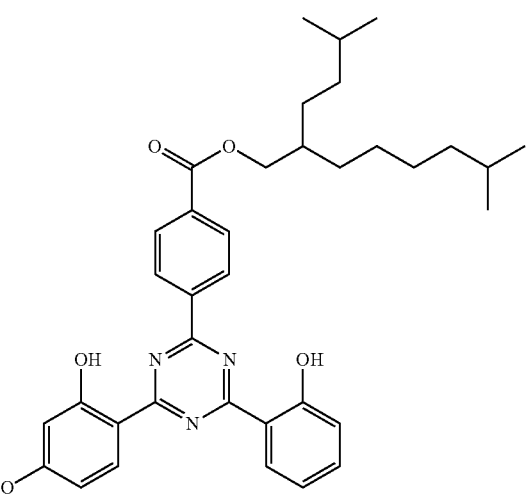
-continued
(115)
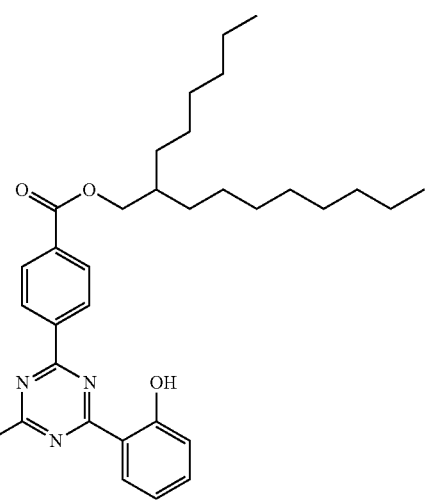
(116)
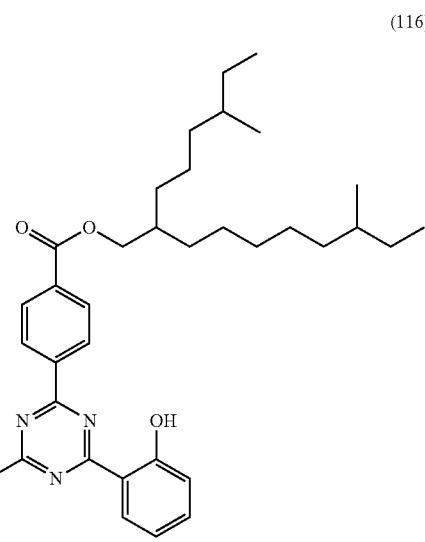
(117)
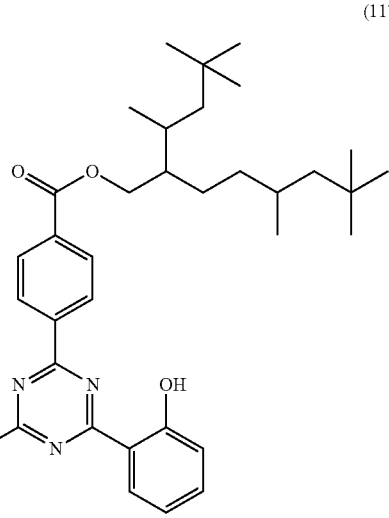

(118)
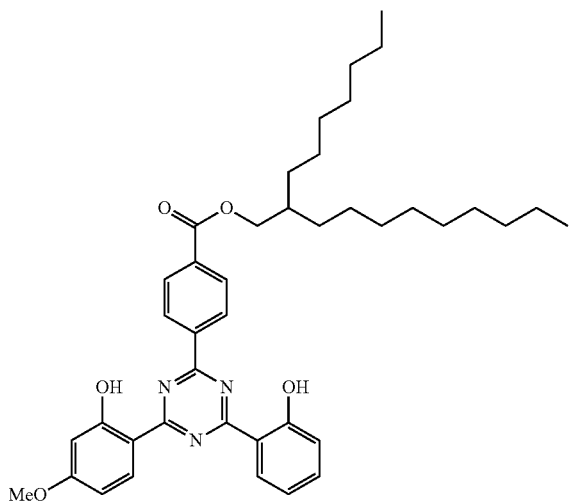
(119)
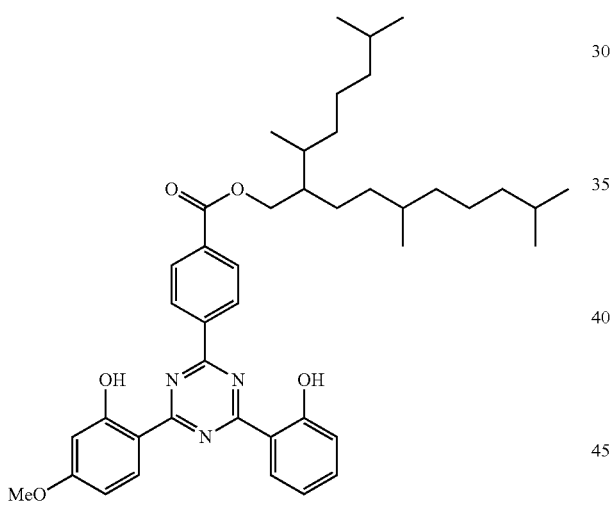
(120)
(m-1)
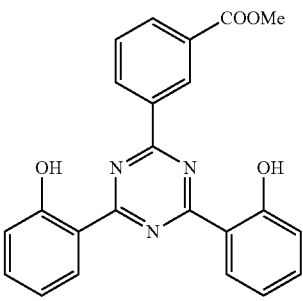
(m-2)
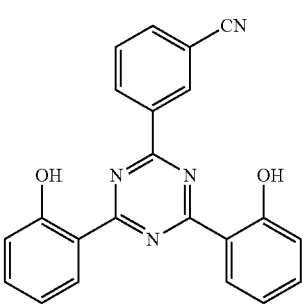
(m-3)
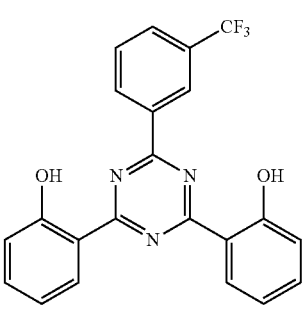
(m-4)
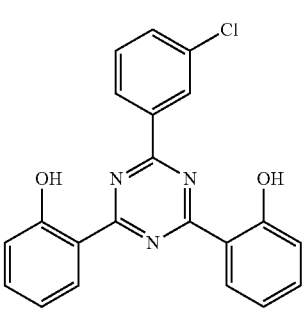
(m-5)
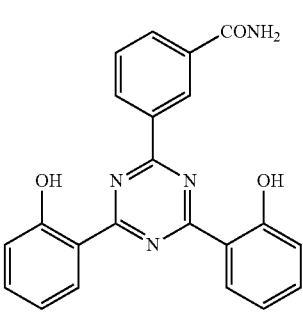

(m-6)
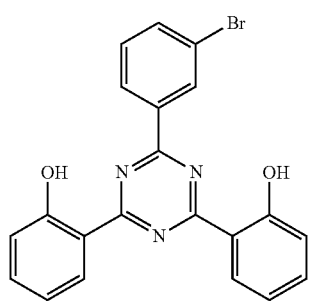
(m-7)
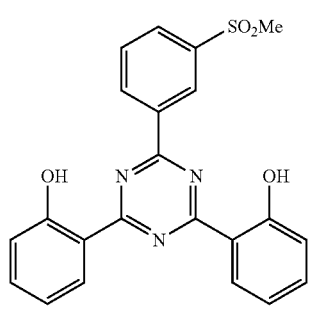
(m-8)
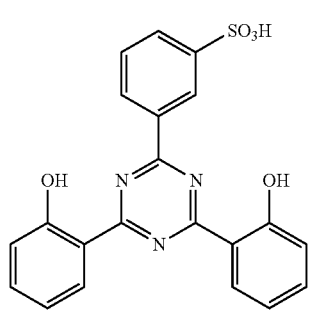
(m-9)
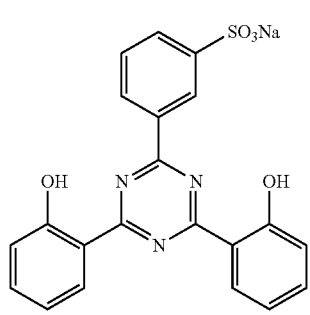
(m-10)
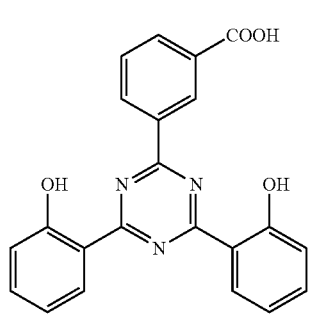
(m-11)
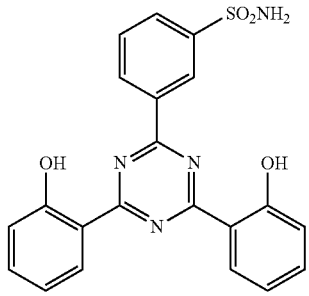
(m-12)
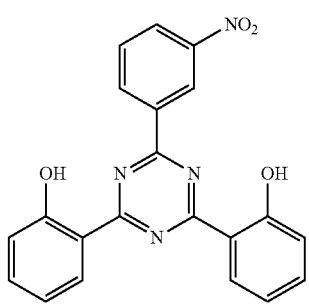
(m-13)
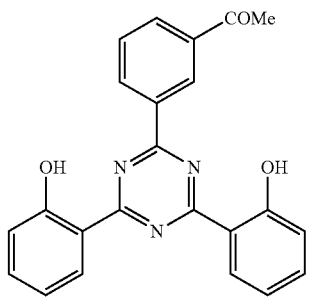
(m-14)
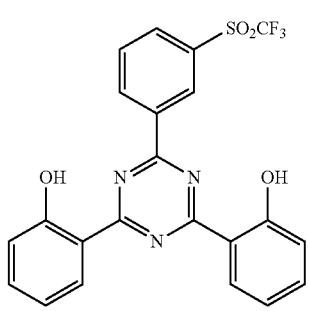
(m-15)
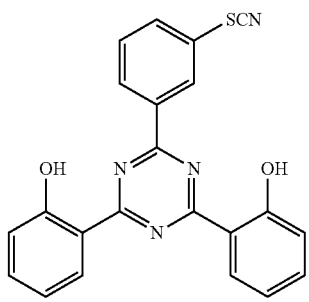

(m-16)
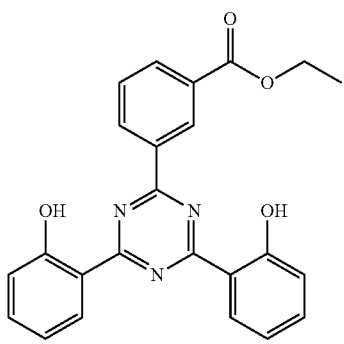
(m-17)
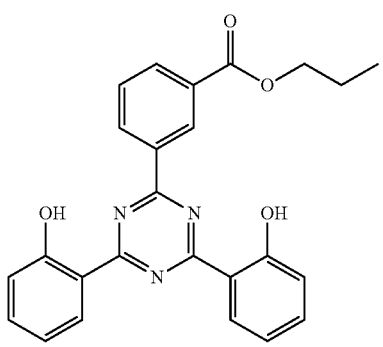
(m-18)
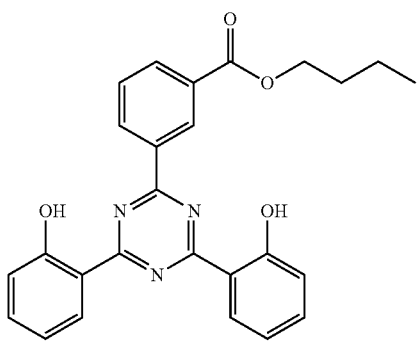
(m-19)
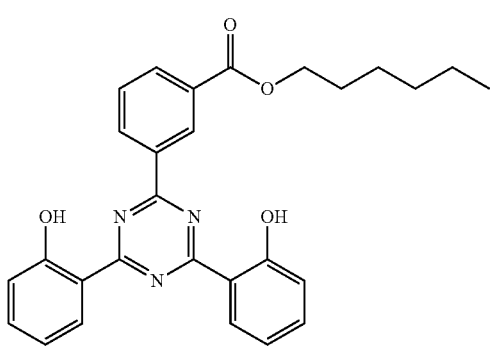
(m-20)
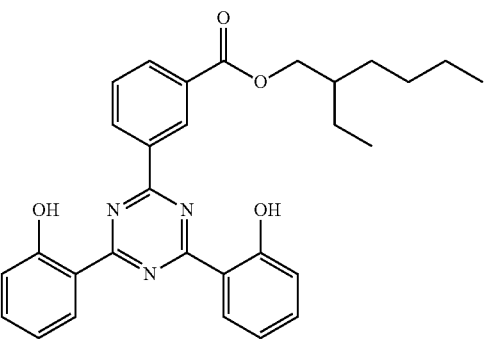
(m-21)
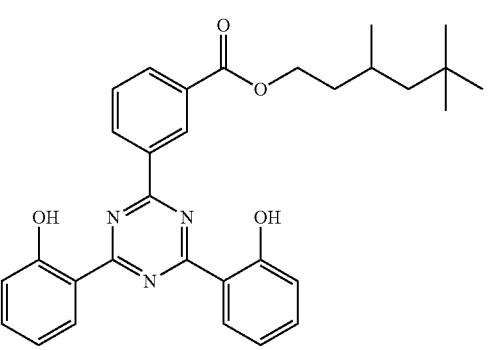
(m-22)
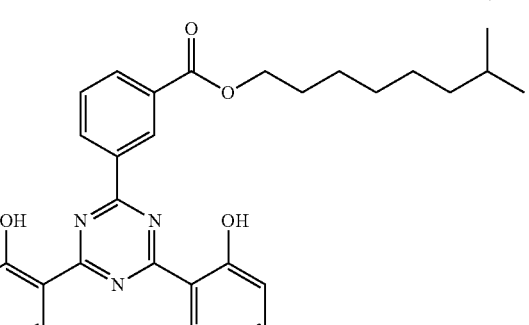
(m-23)
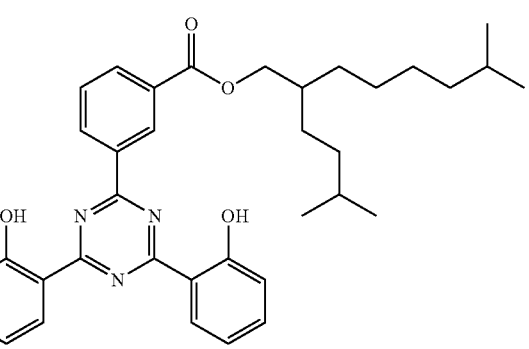

(m-24)
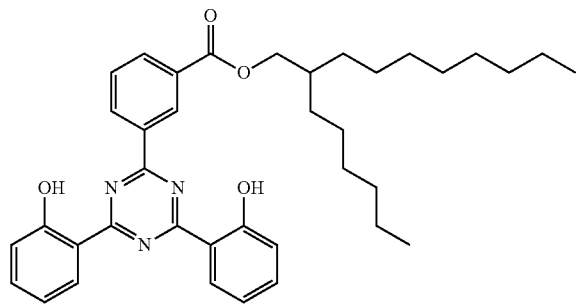
(m-25)
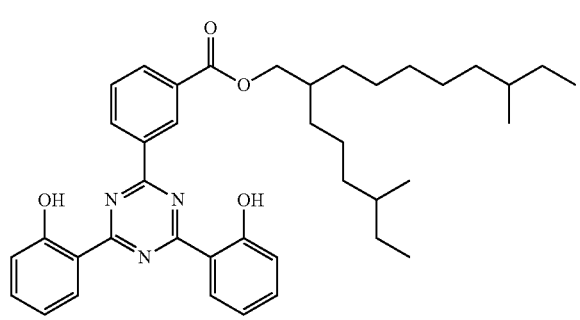
(m-26)
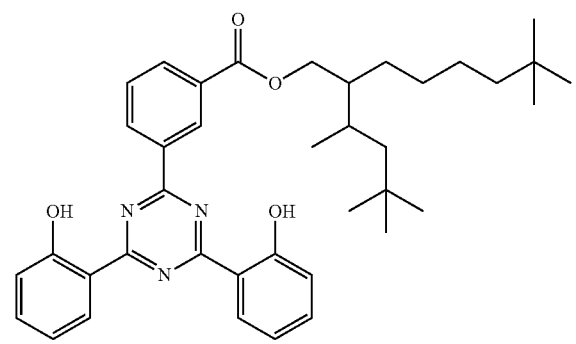
(m-27)
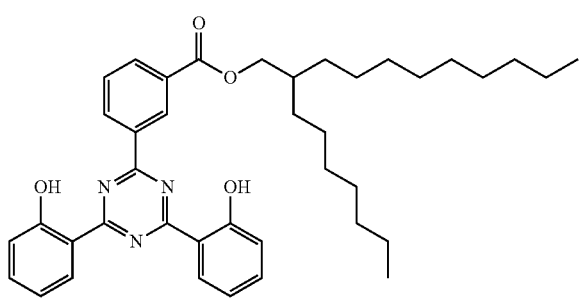
(m-28)
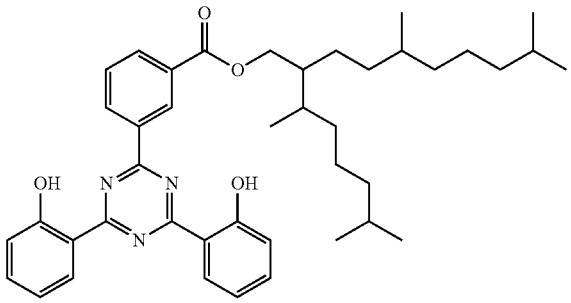
(m-29)
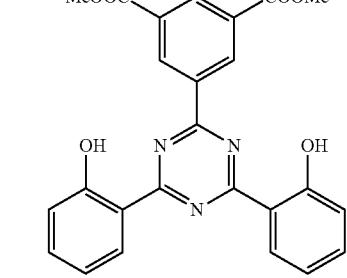
(m-30)
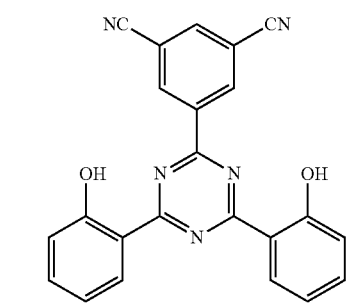
(m-31)
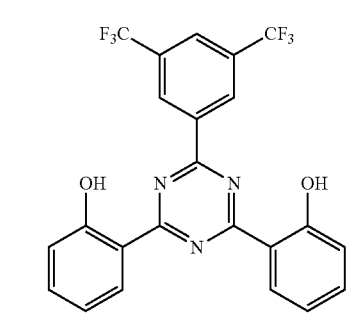
(m-32)
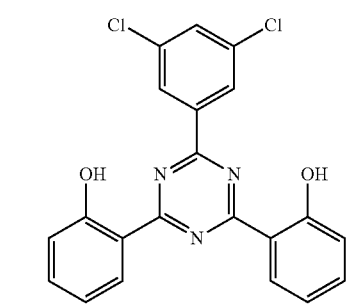

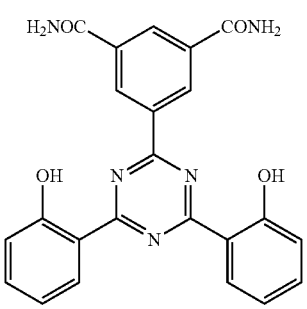 (m-33)
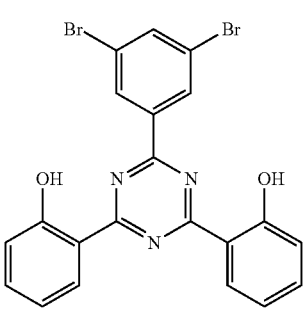 (m-34)
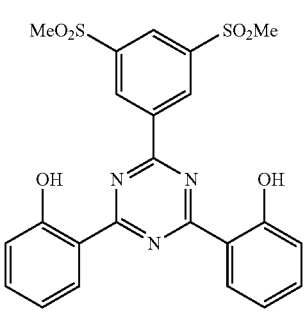 (m-35)
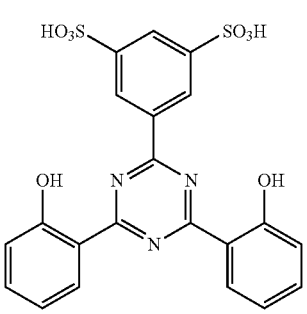 (m-36)
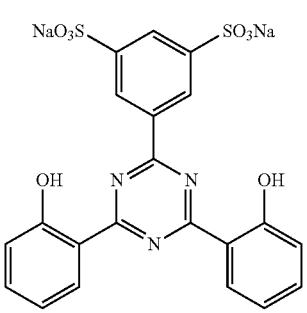 (m-37)
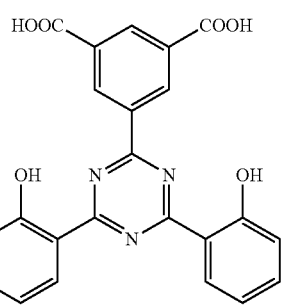 (m-38)
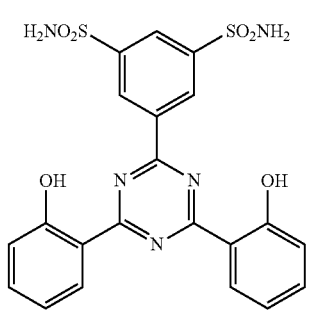 (m-39)
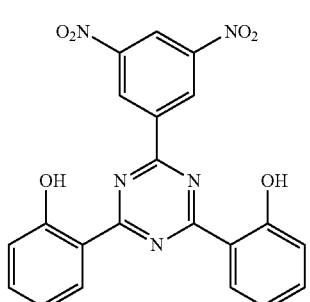 (m-40)
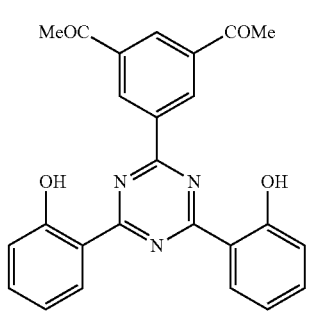 (m-41)
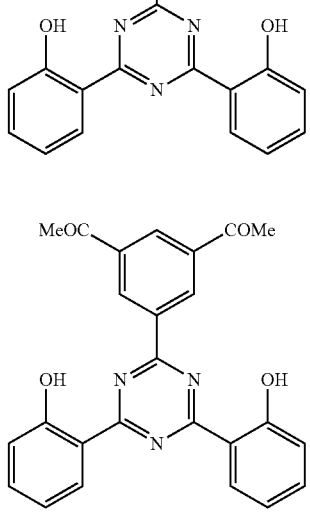 (m-42)

| (m-43) 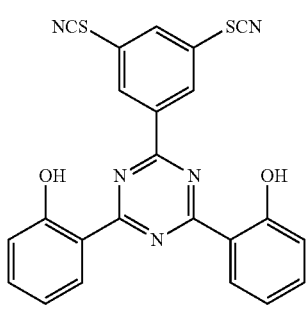 | (m-48) 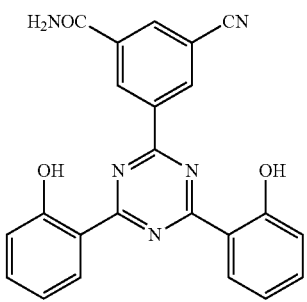 |
| (m-44) 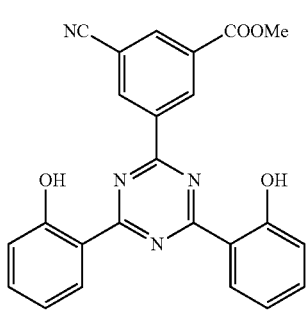 | (m-49) 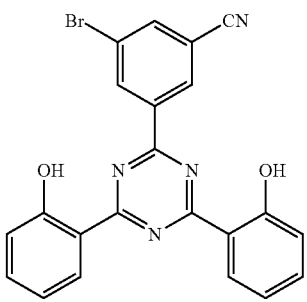 |
| (m-45) 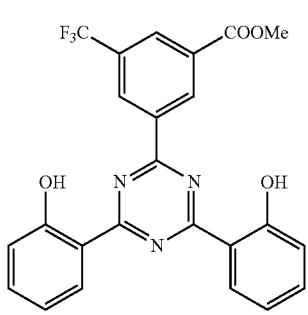 | (m-50) 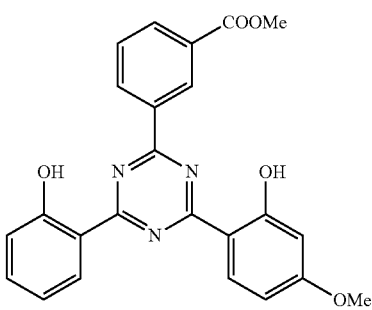 |
| (m-46) 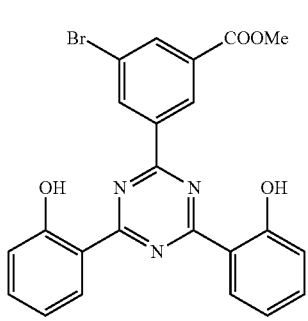 | (m-51) 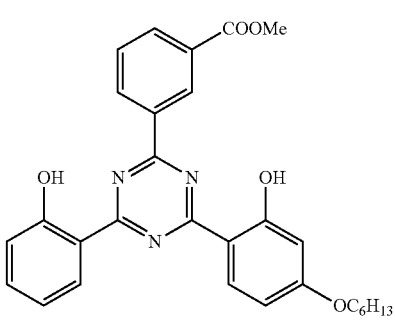 |
| (m-47) 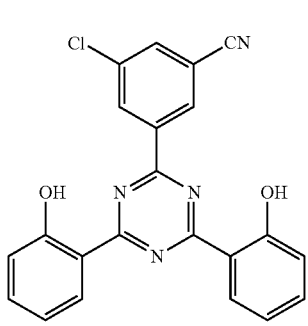 | (m-52) 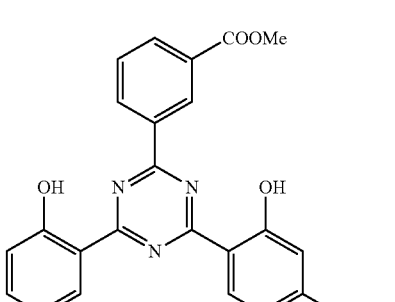 |

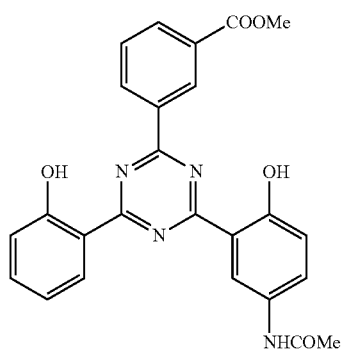
(m-53)
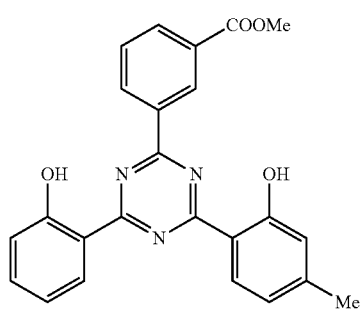
(m-54)
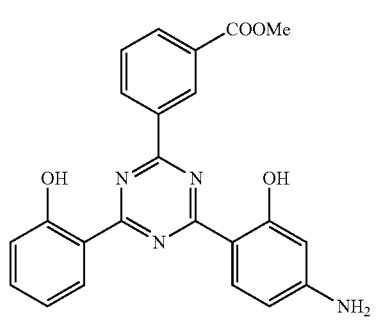
(m-55)
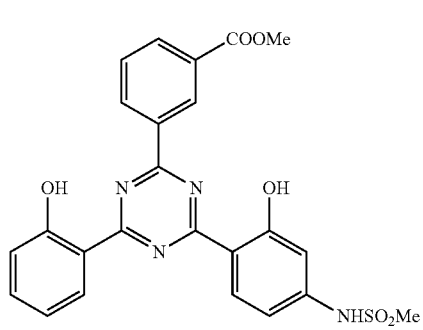
(m-56)
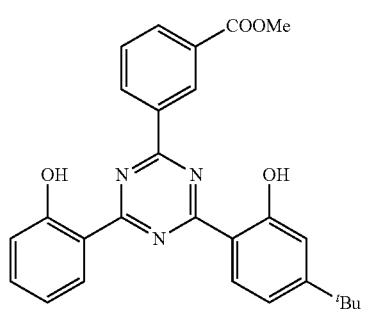
(m-57)
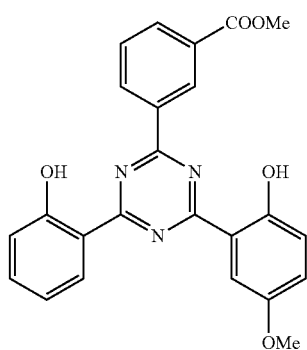
(m-58)
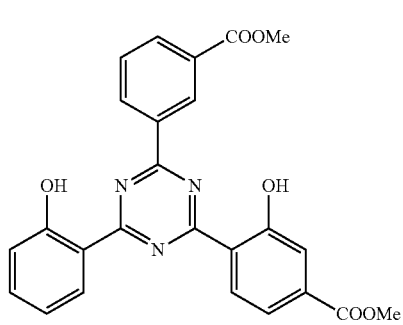
(m-59)
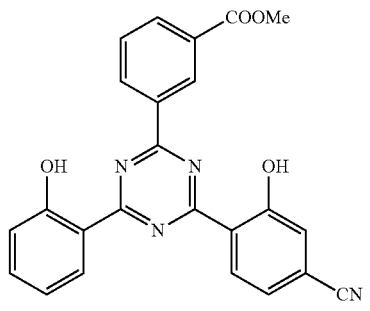
(m-60)
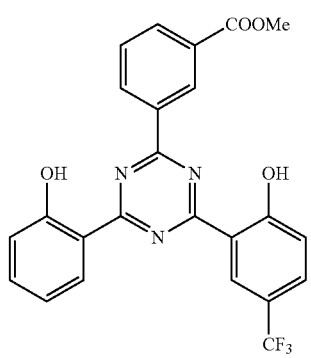
(m-61)

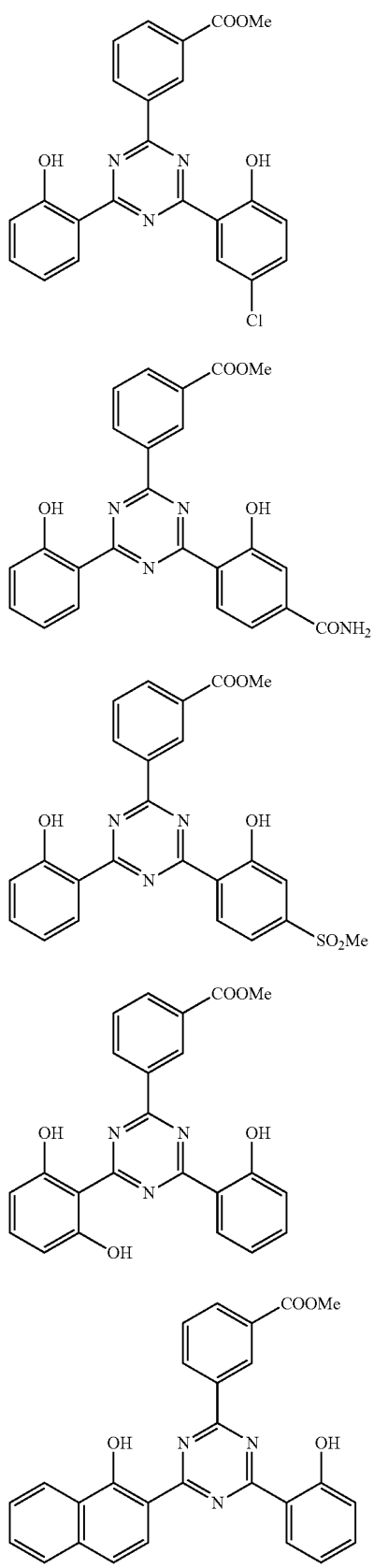
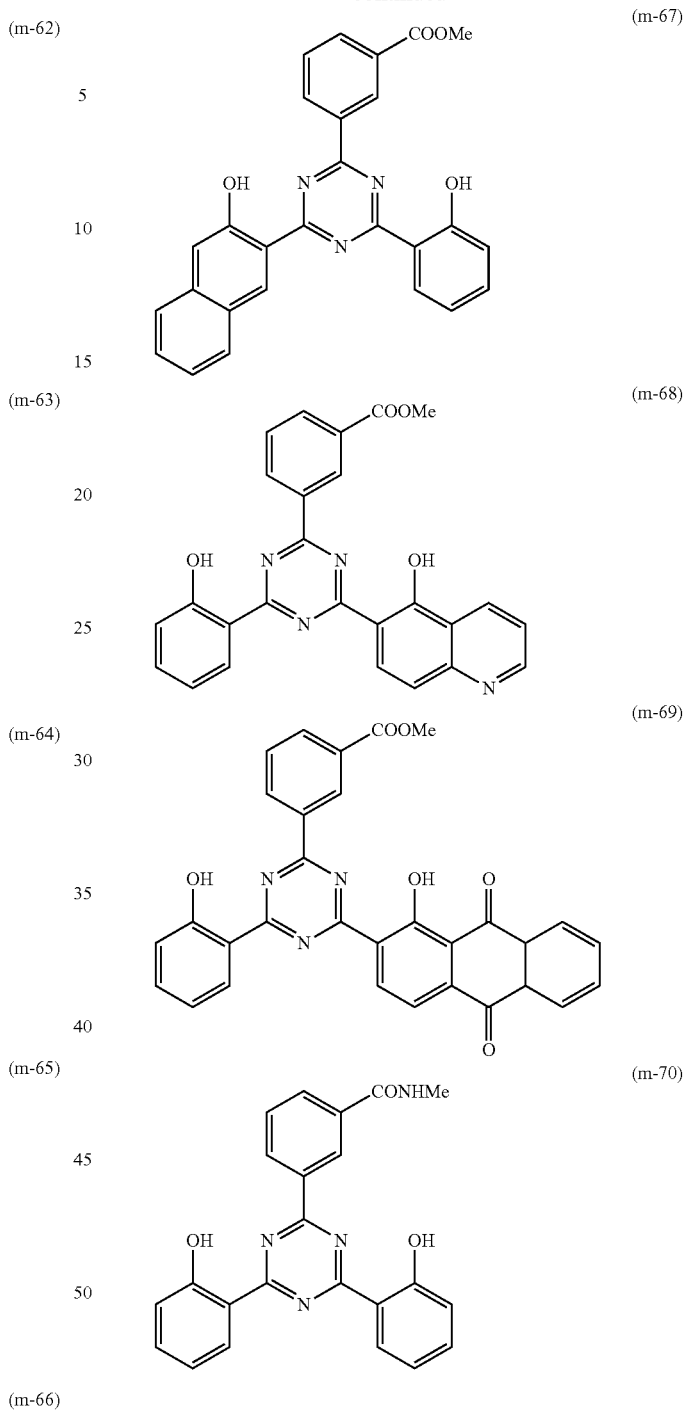

The compound represented by formula (1) may take a tautomer form depending on the structure and the environment. In the present invention, the compound is described by referring to one representative form, but a tautomer different from the compound described in the present invention is also included in the compound of the present invention.

The compound represented by formula (1) may contain an isotope (e.g., $^2H$, $^3H$, $^{13}C$, $^{15}N$, $^{17}O$, or $^{18}O$).

The compound represented by formula (1) can be synthesized by an arbitrary method.

For example, the compound can be synthesized by referring to known patent documents or non-patent documents such as JP-A-7-188190, JP-A-11-315072, JP-A-2001-

220385, and *Senryo to Yakuhin* (*Dyes and Chemicals*), Vol. 40, No. 12, pp. 325-339 (1995). Specifically, Compound (16) can be synthesized by reacting salicylamide with 3,5-bis(trifluoromethyl)benzoyl chloride and 2-hydroxybenzamidine hydrochloride or by reacting salicylamide with salicylic acid and 3,5-bis(trifluoromethyl)benzamidine hydrochloride.

The compound represented by formula (1) according to the present invention has a characteristic feature that the solubility for an organic solvent is excellent. Also, the compound has a characteristic feature that by virtue of containing a substituent having a positive Hammett's σp value at a specific position, LUMO is stabilized by an electron-withdrawing group and this yields short excitation life and excellent light resistance. Also, with respect to use as an ultraviolet absorber, in the case of a known triazine-based compound, when used in a high concentration, precipitation or bleed-out due to long-term use may occur or the compound may decompose and cause an adverse effect such as yellowing. In contrast, the compound represented by formula (1) according to the present invention has excellent solubility and light resistance and therefore, there is obtained an effect that even when used in a high concentration, precipitation or bleed-out does not occur and even when used for a long period of time, the compound does not decompose and causes no yellowing.

In the polyester resin composition of the present invention, as for the compound represented by formula (1), only one kind may be used, or two or more kinds having different structures may be used in combination.

In the polyester resin composition of the present invention, as for the compound represented by formula (1), only one kind may be used, or two or more kinds may be used in combination.

The compound above for use in the present invention is particularly suitable to stabilize an organic material against damages due to light/oxygen or heat. Above all, the compound represented by formula (1) can be suitably used as a light stabilizer, particularly as an ultraviolet absorber.

The compound represented by formula (1) contains a substituent having a positive Hammett's σp value at a specific position and thanks to this configuration, has a characteristic feature that LUMO is stabilized by an electron-withdrawing group and this yields short excitation life and excellent light resistance. Also, with respect to use as an ultraviolet absorber, in the case of using a known triazine-based compound, when used for a long period of time, the compound decomposes and causes an adverse effect such as yellowing.

In contrast, the compound represented by formula (1) has excellent light resistance and therefore, there is obtained an effect that even when used for a long period of time, the compound does not decompose and causes no yellowing.

The maximum absorption wavelength of the compound represented by formula (I) is not particularly limited but is preferably from 250 to 400 nm, more preferably from 280 to 380 nm, and the half-value width is preferably from 20 to 100 nm, more preferably from 40 to 80 nm.

The maximum absorption wavelength and half-value width specified in the present invention can be easily measured by one skilled in the art. The measuring method is described, for example, in *Dai 4-han Jikken Kagaku Koza 7, Bunko II* (*4th ed., Experimental Chemistry Course 7, Spectroscopy II*), pp. 180-186, edited by Chemical Society of Japan, Maruzen (1992). Specifically, the sample is dissolved in an appropriate solvent and the spectrum is measured in a spectrophotometer by using two quartz-made or glass-made cells, that is, one cell for the sample and another cell for control, whereby the maximum absorption wavelength and half-value width are determined. The properties required of the solvent used here are, for example, to dissolve the sample, have no absorption in the measurement wavelength region, cause little interaction with the solute molecule, and be not excessively volatile. An arbitrary solvent may be used as long as the requirements above are satisfied. In the present invention, the measurement is performed using ethyl acetate (EtOAc) as the solvent.

The maximum absorption wavelength and half-value width of the compound in the present invention are a value determined using a quartz cell having an optical path length of 10 mm after preparing a solution in a concentration of about $5 \times 10^{-5}$ mol·dm$^{-3}$ by using ethyl acetate as the solvent.

The spectral half-value width is described, for example, in *Dai 4-han Jikken Kagaku Koza 3, Kihon Sosa III* (*4th ed., Experimental Chemistry Course 3, Basic Operation III*), page 154, edited by Chemical Society of Japan, Maruzen (1991). Incidentally, the half-value width is described in the literature above by labeling the abscissa with a wavenumber scale, but the half-value width used in the present invention is a value when the axis is marked with a wavelength scale, and the unit of the half-value width is nm. Specifically, the half-value width indicates the width of the absorption band of ½ of the absorbance at the maximum absorption wavelength and is used as an indicator of the absorption spectral shape. A spectrum with a small half-value width is a sharp spectrum, and a spectrum with a large half-value width is a broad spectrum. The ultraviolet absorbing compound giving a broad spectrum has absorption also in a broad region on the longer wavelength side than the maximum absorption wavelength and therefore, in order to effectively block light in the long-wavelength ultraviolet range with no yellow tinting, an ultraviolet absorbing compound giving a spectrum with a small half-value width is preferred.

As described in Sumio Tokita, *Kagaku Seminar 9, Color Chemistry* (*Chemistry Seminar 9, Color Chemistry*), pp. 154-155, Maruzen (1982), the absorption intensity of light, namely, the oscillator intensity, is proportional to the integral of the molar extinction coefficient and when the absorption spectrum has good symmetry, the oscillator intensity is proportional to the product of the absorbance at the maximum absorption wavelength and the half-value width (here, the half-value width is a value when the axis is marked with a wavelength scale). This indicates that as long as the value of transition moment is the same, a compound having a spectrum with a small half-value width exhibits large absorbance at the maximum absorption wavelength. Use of such an ultraviolet absorbing compound is advantageous in that light in the region around the maximum absorption wavelength can be effectively blocked only by its use in a small amount, but absorbance at the wavelength a little distance away from the maximum absorption wavelength rapidly decreases, and this makes it impossible to block light over a wide region.

The molar extinction coefficient at the maximum absorption wavelength of the compound represented by formula (1) is preferably 20,000 or more, more preferably 30,000 or more, still more preferably 50,000 or more. With a molecular extinction coefficient of 20,000 or more, the absorption efficiency per mass of the compound represented by formula (1) is sufficiently high and the amount of the compound represented by formula (1) used for completely absorbing light in the ultraviolet region can be reduced. This is also preferred from the standpoint of preventing irritation to skin or accumulation in vivo and hardly causing bleed-out. Incidentally, the molar extinction coefficient used here is based on the definition described, for example, in *Shin-han Jikken Kagaku Koza 9, Bunseki Kagaku [II]* (*New Edition, Experimental Chemistry Course 9, Analytical Chemistry [II]*)", page 244, edited by Chemical Society of Japan, Maruzen (1977) and can be determined together at the time of determining the above-described maximum absorption wavelength and half-value width.

The polyester resin composition of the present invention can contain the compound represented by formula (1) in an arbitrary amount necessary to impart the desired performance. The content varies depending on the compound or resin used but can be appropriately determined. The content in the resin composition is preferably from 0.01 to 30 mass %, more preferably from 0.1 to 15 mass %, still more preferably from 1.0 to 4.0 mass %. The content in the range above is preferred, because a higher ultraviolet-blocking effect is obtained and the bleed-out can be more effectively suppressed.

The polyester resin composition of the present invention may contain, as the ultraviolet absorber, two or more kinds of compounds represented by formula (1) having different structures, as described above. Also, the compound represented by formula (1) and one or more kinds of ultraviolet absorbers having a structure other than the formula above may be used in combination. When two kinds (preferably three kinds) of ultraviolet absorbers differing in the basic framework structure are used, ultraviolet light in a wide wavelength region can be absorbed. Also, use of two or more kinds of ultraviolet absorbers has an action of stabilizing the dispersion state of the ultraviolet absorbers. As for the ultraviolet absorber having a structure other than formula (1), any ultraviolet absorber may be used, and examples thereof include triazine-based, benzotriazole-based, benzophenone-based, merocyanine-based, cyanine-based, dibenzoylmethane-based, cinnamic acid-based, cyanoacrylate-based and benzoic ester-based compounds. Other examples include the ultraviolet absorbers described in *Fine Chemical*, pp. 28-38 (May 2004), *Kobunshi-yo Kinousei Tenkabutsu no Shin Tenkai* (*New Development of Functional Additives for Polymers*), pp. 96-140, issued by Toray Research Center Inc., Technical Survey Dept. (Toray Research Center Inc., 1999), and Yasuichi Okatsu (supervisor), *Kobunshi Tenkazai no Kaihatsu to Kankyo Taisaku* (*Development of Polymer Additives and Environmental Measures*), pp. 54-64, CMC Publishing (2003).

The ultraviolet absorber having a structure other than formula (1) is preferably a benzotriazole-based compound, a benzophenone-based compound, a salicylic acid-based compound, a benzoxazinone-based compound, a cyanoacrylate-based compound, a benzoxazole-based compound, a merocyanine-based compound, or a triazine-based compound, more preferably a benzoxazinone-based compound, a benzotriazole-based compound, a benzophenone-based compound, or a triazine-based compound, still more preferably a benzoxazinone-based compound. The ultraviolet absorbers having a structure other than formula (1) are described in detail in paragraphs [0117] to [0121] of JP-A-2008-273950, and the materials described in this patent publication can be applied also in the present invention.

As described above, the polyester resin composition of the present invention preferably contains a compound represented by formula (1) and a benzoxazinone-based compound in combination. The compound represented by formula (1) has excellent light resistance also in the long-wavelength region and therefore, produces an effect of preventing deterioration of benzoxazinone that can block light up to a longer wavelength region, and thanks to use together with a benzoxazinone-based compound, the blocking effect up to a longer wavelength region can be advantageously maintained for a long period of time.

The polyester resin composition of the present invention can practically produce a sufficient ultraviolet-blocking effect only by using the compound represented by formula (1) as the ultraviolet absorber but, if the requirement is more strict, a white pigment having a strong hiding power, such as titanium oxide, may be used in combination. Also, when the appearance or color tone becomes a problem or is desired, a slight amount (0.05 mass % or less) of a colorant may be used in combination. In applications where transparency or whiteness is important, a fluorescent brightener may be used in combination. Examples of the fluorescent brightener include commercial products, and the compound of formula [1] and Compounds 1 to 35 described in JP-A-2002-53824.

The resin component such as polyester resin contained in the polyester resin composition of the present invention is described below.

The polyester resin is a polycondensate of a polyvalent carboxylic acid (dicarboxylic acid) and a polyalcohol (diol) and is a resin where an ester bond between a carboxyl group and a hydroxyl group is the main contributor to polymer formation. The polyester resin for use in the present invention is composed of, as monomer components, the following dicarboxylic acid, acid halide thereof or polyvalent carboxylic acid and a diol.

Examples of the dicarboxylic acid or acid halide thereof include an aliphatic or alicyclic dicarboxylic acid such as adipic acid, suberic acid, azelaic acid, sebacic acid, dodecanedioic acid, oxalic acid, malonic acid, succinic acid, glutaric acid, ethylsuccinic acid, pimelic acid, maleic acid, fumaric acid, itaconic acid, citraconic acid, mesaconic acid, 2-methylsuccinic acid, 2-methyladipic acid, 3-methyladipic acid, 3-methylpentanedioic acid, 2-methyloctanedioic acid, 3,8-dimethyldecanedioic acid, 3,7-dimethyldecanedioic acid, dimer acid, hydrogenated dimer acid, 1,2- or 1,3-cyclopentanedicarboxylic acids, and 1,2-, 1,3- or 1,4-cyclohexanedicarboxylic acids; and an aromatic dicarboxylic acid such as phthalic acid, isophthalic acid, terephthalic acid, 1,4-naphthalenedicarboxylic acid, 2,5-naphthalenedicarboxylic acid, 2,6-naphthalenedicarboxylic acid, naphthalic acid, biphenyldicarboxylic acid, 2-methylisophthalic acid, 3-methylphthalic acid, 2-methylterephthalic acid, 2,4,5,6-tetramethylisophthalic acid, 3,4,5,6-tetramethylphthalic acid, 2-chloroterephthalic acid, 2-methylterephthalic acid, 5-methylisophthalic acid, 5-sodium sulfoisophthalate, 2,6-naphthalenedicarboxylic acid, hexahydroterephthalic acid, hexahydroisophthalic acid, 3-chloroisophthalic acid, 3-methoxyisophthalic acid, 2-fluoroisophthalic acid, 3-fluorophthalic acid, 2-fluoroterephthalic acid, 2,4,5,6-tetrafluoroisophthalic acid, 3,4,5,6-tetrafluorophthalic acid, 4,4'-oxybisbenzoic acid, 3,3'-oxybisbenzoic acid, 3,4'-oxybisbenzoic acid, 2,4'-oxybisbenzoic acid, 3,4'-oxybisbenzoic acid, 2,3'-oxybisbenzoic acid, 4,4'-oxybisoctafluorobenzoic acid, 3,3'-oxybisoctafluorobenzoic acid, 1,4-naphthalenedicarboxylic acid, 2,6-naphthalenedicarboxylic acid, 4,4'-biphenyldicarboxylic acid, and 4,4'-diphenylethercarboxylic acid.

Examples of the polyvalent carboxylic acid other than the dicarboxylic acid include ethanetricarboxylic acid, propanetricarboxylic acid, butanetetracarboxylic acid, pyromellitic acid, trimellitic acid, trimesic acid, and 3,4,3',4'-biphenyltetracarboxylic acid.

As for the polyester resin used in the present invention, among these dicarboxylic acids and polyvalent carboxylic acid components, use of adipic acid, malonic acid, succinic acid, terephthalic acid, isophthalic acid, phthalic acid, 1,4-naphthalenedicarboxylic acid, 2,5-naphthalenedicarboxylic acid, 2,6-naphthalenedicarboxylic acid and trimellitic acid is preferred; use of terephthalic acid, isophthalic acid, 1,4-naphthalenedicarboxylic acid, 2,5-naphthalenedicarboxylic acid or 2,6-naphthalenedicarboxylic acid is more preferred; and use of terephthalic acid is most preferred.

Examples of the diol include an aliphatic glycol such as ethylene glycol, 1,2-propylene glycol, 1,3-propylene glycol, diethylene glycol, triethylene glycol, 1,2-butylene glycol, 1,3-butylene glycol, 2,3-butylene glycol, 1,4-butylene glycol, 1,5-pentanediol, neopentyl glycol, 1,6-hexanediol, 1,2-cyclohexanediol, 1,3-cyclohexanediol, 1,4-cyclohexanediol, 1,2-cyclohexanedimethanol, 1,3-cyclohexanedimethanol, 1,4-cyclohexanedimethanol, 1,4-cyclohexanediethanol, 1,10-decamethylene glycol, 1,12-dodecanediol, polyethylene glycol, polytrimethylene glycol, and polytetramethylene glycol; and an aromatic glycol such as hydroquinone, 4,4'-dihydroxybisphenol, 1,4-bis(β-hydroxyethoxy)benzene, 1,4-bis(β-hydroxyethoxyphenyl)sulfone, bis(p-hydroxyphenyl) ether, bis(p-hydroxyphenyl)sulfone, bis(p-hydroxyphenyl) methane, 1,2-bis(p-hydroxyphenyl)ethane, bisphenol A, bisphenol C, 2,5-naphthalenediol, and glycol formed by adding ethylene oxide to such a glycol.

As for the polyester resin used in the present invention, among these diol components, use of ethylene glycol, 1,3-propylene glycol, diethylene glycol, neopentyl glycol, hydroquinone, 4,4'-dihydroxybisphenol or bisphenol A is preferred; use of ethylene glycol or 4,4'-dihydroxybisphenol is more preferred; and use of ethylene glycol is most preferred.

The polyester resin for use in the present invention preferably has a glass transition point (Tg) of −80° C. to 200° C., more preferably from −30° C. to 180° C.

The polyester resin composition using a polyester resin exhibiting such Tg comes to have appropriate softness and hardness, leading to high working efficiency, and when the compound represented by formula (1) is used as the ultraviolet absorber, there is produced an effect of improving the light fastness of the ultraviolet absorber itself.

The polyester resin for use in the present invention preferably has a number average molecular weight of 18,500 to 40,000, more preferably from 19,000 to 35,000.

This resin is preferably a polyethylene terephthalate using a terephthalic acid as the dicarboxylic acid component and an ethylene glycol as the diol component, a polybutylene terephthalate using a terephthalic acid as the dicarboxylic acid component and a 1,4-butylene glycol as the diol component, a polyethylene naphthalate using a 2,6-naphthalenedicarboxylic acid as the dicarboxylic acid component and an ethylene glycol as the diol component, a poly-1,4-cyclohexanedimethylene terephthalate using a terephthalic acid as the dicarboxylic acid component and a 1,4-bishydroxymethylcyclohexane as the diol component, or a polyethylene-1,2-diphenoxyethane-4,4'-dicarboxylate, and most preferably a polyethylene terephthalate.

The polyester resin composition of the present invention may contain other resin components in combination with the polyester resin. The resin component which can be used in combination may be either a natural polymer or a synthetic polymer. Examples thereof include a polyolefin (for example, polyethylene, polypropylene, polyisobutylene, poly(1-butene), poly-4-methylpentene, polyvinylcyclohexane, polystyrene, poly(p-methylstyrene), poly(α-methylstyrene), polyisoprene, polybutadiene, polycyclopentene and polynorbornene), a copolymer of vinyl monomer (for example, an ethylene/propylene copolymer, an ethylene/methylpentene copolymer, an ethylene/heptene copolymer, an ethylene/vinylcyclohexane copolymer, an ethylene/cycloolefin copolymer (e.g., a cycloolefin copolymer (COC: Cyclo-Olefin Copolymer) such as ethylene/norbornene), a propylene/butadiene copolymer, an isobutylene/isoprene copolymer, an ethylene/vinylcyclohexene copolymer, an ethylene/alkyl acrylate copolymer, and an ethylene/alkyl methacrylate copolymer), an acrylic polymer (for example, polymethacrylate, polyacrylate, polyacrylamide and polyacrylonitrile), a polyvinyl chloride, a polyvinylidene chloride, a polyvinyl fluoride, a polyvinylidene fluoride, a vinyl chloride/vinyl acetate copolymer, a polyether (for example, polyalkylene glycol, polyethylene oxide and polypropylene oxide), a polyacetal (for example, polyoxymethylene), a polyamide, a polyimide, a polyurethane, a polyurea, a polycarbonate, a polyketone, a polysulfone polyether ketone, a phenol resin, a melamine resin, a cellulose ester (for example, diacetyl cellulose, triacetyl cellulose (TAC), propionyl cellulose, butyryl cellulose, acetylpropionyl cellulose, and nitrocellulose), a polysiloxane, and a natural polymer (for example, cellulose, rubber and gelatin).

The resin component which can be used in combination is preferably a synthetic polymer, more preferably a polyolefin, an acrylic polymer or a cellulose ester, still more preferably polyethylene, polypropylene, poly(4-methylpentene), polymethyl methacrylate, polycarbonate or triacetyl cellulose. The resin component which can be used in combination is preferably a thermoplastic resin.

The polyester resin composition of the present invention may appropriately contain an optional additive such as ultraviolet absorber having, as described above, a structure other than the compound represented by formula (1), light stabilizer, antioxidant, heat stabilizer, fluorescent brightener, and flame retardant.

The polyester resin composition of the present invention preferably further contains a phosphorus-based stabilizer as the antioxidant, because thermal stability can be improved. Examples of the phosphorus-based stabilizer include phosphorous acid, phosphoric acid, a phosphorous acid ester and a phosphoric acid ester. Among these, in terms of containing a trivalent phosphorus and readily exerting a discoloration-preventing effect, a phosphorous acid ester such as phosphite and phosphonite is preferred.

Examples of the phosphite include triphenyl phosphite, tris(nonylphenyl)phosphite, dilauryl hydrogenphosphite, triethyl phosphite, tridecyl phosphite, tris(2-ethylhexyl)phosphite, tris(tridecyl)phosphite, tristearyl phosphite, diphenyl monodecyl phosphite, monophenyl didecyl phosphite, diphenyl mono(tridecyl)phosphite, tetraphenyldipropylene glycol diphosphite, tetraphenyl tetra(tridecyl)pentaerythritol tetraphosphite, a hydrogenated bisphenol A phenol phosphite polymer, diphenyl hydrogenphosphite, 4,4'-butylidene-bis (3-methyl-6-tert-butylphenyl di(tridecyl)phosphite, tetra (tridecyl)-4,4'-isopropylidenediphenyl diphosphite, bis (tridecyl)pentaerythritol diphosphite, bis(nonylphenyl) pentaerythritol diphosphite, dilauryl pentaerythritol diphosphite, distearyl pentaerythritol diphosphite, tris(4-tert-butylphenyl)phosphite, tris(2,4-di-tert-butylphenyl)phosphite, a hydrogenated bisphenol A pentaerythritol phosphite polymer, bis(2,4-di-tert-butylphenyl)pentaerythritol diphosphite, bis(2,6-di-tert-butyl-4-methylphenyl)pentaerythritol diphosphite, 2,2'-methylenebis(4,6-di-tert-butylphenyl)octylphosphite, and bis(2,4-dicumylphenyl)pentaerythritol diphosphite.

Examples of the phosphonite include tetrakis(2,4-di-isopropylphenyl)-4,4'-biphenylene diphosphonite, tetrakis(2,4-di-n-butylphenyl)-4,4'-biphenylene diphosphonite, tetrakis (2,4-di-tert-butylphenyl)-4,4'-biphenylene diphosphonite, tetrakis(2,4-di-tert-butylphenyl)-4,3'-biphenylene diphosphonite, tetrakis(2,4-di-tert-butylphenyl)-3,3'-biphenylene diphosphonite, tetrakis(2,6-di-isopropylphenyl)-4,4'-biphenylene diphosphonite, tetrakis(2,6-di-n-butylphenyl)-4,4'-biphenylene diphosphonite, tetrakis(2,6-di-tert-butylphenyl)-4,4'-biphenylene diphosphonite, tetrakis(2,6-di-tert-butylphenyl)-4,3'-biphenylene diphosphonite, and tetrakis(2,6-di-tert-butylphenyl)-3,3'-biphenylene diphosphonite.

Examples of the acid phosphate include methyl acid phosphate, ethyl acid phosphate, propyl acid phosphate, isopropyl acid phosphate, butyl acid phosphate, butoxyethyl acid phosphate, octyl acid phosphate, 2-ethylhexyl acid phosphate, decyl acid phosphate, lauryl acid phosphate, stearyl acid phosphate, oleyl acid phosphate, behenyl acid phosphate, phenyl acid phosphate, nonylphenyl acid phosphate, cyclohexyl acid phosphate, phenoxyethyl acid phosphate, alkoxy polyethylene glycol acid phosphate, bisphenol A acid phosphate, dimethyl acid phosphate, diethyl acid phosphate, dipropyl acid phosphate, diisopropyl acid phosphate, dibutyl acid phosphate, dioctyl acid phosphate, di-2-ethylhexyl acid phosphate, dioctyl acid phosphate, dilauryl acid phosphate, distearyl acid phosphate, diphenyl acid phosphate, and bis-nonylphenyl acid phosphate.

The phosphorus-based stabilizer for use in the present invention may be contained by mixing two or more kinds thereof, but the total content ratio of phosphorus-based stabilizers is preferably from 0.0005 to 0.3 parts by mass, more preferably from 0.001 to 0.1 parts by mass, per 100 parts by mass of the polyester resin composition. Within this range, the stabilizer exerts a sufficient effect, and reduction in the molecular weight or deterioration of the color hue hardly occurs during molding.

In the present invention, it is particularly preferred that the compound represented by formula (1) accounts for 0.05 to 3 parts by mass and the phosphorus-based stabilizer accounts for 0.0005 to 0.3 parts by mass, per 100 parts by mass of the polyester resin composition.

The polyester resin composition of the present invention preferably further contains a hindered phenol-based stabilizer as the antioxidant, because the compound represented by formula (1) can be stabilized and in turn, the light stability of the polyester resin composition is increased.

Examples of the hindered phenol-based stabilizer include a compound having at least one substituent (for example, an alkyl group, an alkenyl group, an alkynyl group, an aryl group, a heterocyclic group, an alkoxy group, an aryloxy group or a substituted amino group) except for hydrogen atom, at the ortho-position of a phenolic hydroxyl group.

The hindered phenol-based stabilizer may be a compound known as an antioxidant and available on the market, and examples thereof include 2,6-di-tert-butyl-4-methylphenol, 2,6-di-tert-butyl-p-cresol (BHT), and the antioxidants produced by Ciba Specialty Chemicals.

The hindered phenol-based stabilizers for use in the present invention may be contained by mixing two or more kinds thereof, but the total content ratio of hindered phenol-based stabilizers is preferably from 0.0001 to 1 part by mass, more preferably from 0.001 to 0.1 parts by mass, per 100 parts by mass of the polyester resin composition.

The method for mixing the compound represented by formula (1) and the resin component such as polyester to prepare the polyester resin composition of the present invention is not particularly limited.

In the case where the compound represented by formula (1) has compatibility with the resin component such as polyester, the compound represented by formula (1) can be directly added to the resin component such as polyester. Other examples include a method of melt-kneading the mixture by a melt-kneader typified by a vented twin-screw extruder and pelletizing it by a device such as pelletizer.

The compound represented by formula (1) may be dissolved in an auxiliary solvent having compatibility with the resin component such as polyester, and the solution may be added to the resin component such as polyester. Also, the compound represented by formula (1) may be dispersed in a high boiling-point organic solvent or a polymer, and the dispersion may be added to the resin component such as polyester.

The timing for the addition and mixing may be before or after the resin component such as polyester is formed by polymerization.

The polyester resin composition of the present invention may be a composition formed by dissolving the polyester resin in an arbitrary solvent.

Examples of the high boiling-point organic solvent include a phosphoric acid ester, a phosphonic acid ester, a benzoic acid ester, a phthalic acid ester, a fatty acid ester, a carbonic acid ester, an amide, an ether, a halogenated hydrocarbon, an alcohol and a paraffin. Among these, a phosphoric acid ester, a phosphonic acid ester, a phthalic acid ester, a benzoic acid ester and a fatty acid ester are preferred.

The polyester resin composition of the present invention is usable for all applications using a synthetic resin but is suitably usable in particular for an application that is likely to be exposed to sunlight or ultraviolet ray-containing light. Specific examples thereof include a glass alternative and a surface-coating material therefor; a coating material for window glass, lighting glass and light source-protecting glass in house, facility, transport vehicle and the like; an interior or exterior material and an interior or exterior paint for house, facility, transport vehicle and the like, and a coating formed by the paint; an alkyd resin lacquer paint and a coating formed by the paint; an acrylic lacquer paint and a coating formed by the paint; a member for ultraviolet-emitting light sources such as fluorescent lamp and mercury lamp; a member for precision machines and electric/electronic devices; a material for blocking electromagnetic and other waves emitted from various displays; a container or packaging material for food, chemicals, drugs and the like; a sheet or film material for special packages such as bottle, box, blister and cup or for compact disk coat and agricultural/industrial usage; a discoloration inhibitor for printed matter, dyed matter, dye/pigment and the like; a protective film for polymer supports (such as plastic-made components, e.g., mechanical or automotive component); an overcoat for printed matters; an inkjet medium coat; a laminate with matte finish; an optical light film; a safety glass/front glass intermediate layer; an electrochromic/photochromic application; an over-lamination film; a solar heat-controlling film; a cosmetic material such as anti-sunburn cream, shampoo, rinse and hair dressing; an apparel fiber product and the fiber, such as sport wear, stockings and cap; a home interior product such as curtain, carpet and wall paper; a medical device such as plastic lens, contact lens and artificial eye; an optical material such as optical filter, backlight display film, prism, mirror and photographic material; a mold film; a transfer-type sticker; an anti-graffiti film; a stationery product such as tape and ink; and an indicator board or device and the surface-coating material therefor.

The molded article of the present invention is described below.

The molded article of the present invention can be formed from the polyester resin composition of the present invention.

The shape of the molded article of the present invention formed from the above-described polyester resin composition may be any form of flat film, powder, spherical particle, crushed particle, continuous block, fiber, tube, hollow yarn, granule, plate and porous solid, but in view of balance between the effect of preventing precipitation or bleed-out and the long-wavelength ultraviolet-blocking effect, for example, a flat film or plate having a thickness of 0.1 µm to 25 mm is preferred.

The polyester resin composition of the present invention contains a polyester resin and therefore, can be transparent and in this case, the composition can be molded as an ultraviolet absorbing filter or an ultraviolet absorbing film.

At this time, the polyester resin composition of the present invention may contain other transparent resins.

Examples of other transparent resins include a polycarbonate, a cellulose ester (e.g., diacetyl cellulose, triacetyl cellulose (TAC), propionyl cellulose, butyryl cellulose, acetylpropionyl cellulose, nitrocellulose), a polyamide, a polystyrene (e.g., syndiotactic polystyrene), a polyolefin (e.g., polyethylene, polypropylene, polymethylpentene), a polymethyl methacrylate, a syndiotactic polystyrene, a polysulfone, a polyethersulfone, a polyether ketone, a polyetherimide, and a polyoxyethylene.

The molded article of the present invention obtained from the above-described polyester resin composition can be a transparent support, and the transmittance of the transparent support is preferably 80% or more, more preferably 86% or more.

The molded article of the present invention is formed by molding the polyester resin composition and because of having an excellent long-wavelength ultraviolet absorbing ability, can be used as an ultraviolet absorbing filter or container or can be used to protect a compound sensitive to ultraviolet ray. For example, the molded article of the present invention can be obtained as a container or the like by molding the polyester resin composition by an arbitrary method such as extrusion molding or injection molding. Also, a solution of the polyester resin composition of the present invention can be coated on a separately produced molded article and dried to obtain a molded article coated with an ultraviolet absorbing film composed of the polyester resin composition.

In view of effectively utilizing the long-wavelength ultraviolet-blocking effect and the transparency of the polyester resin composition of the present invention, the polyester resin composition of the present invention is particularly suitable for use in a photovoltaic backsheet, a window film, a food/medical packaging film, an agricultural film, an optical film, and a fiber.

In the present invention, the matters described in paragraphs [0192] to [0230] of JP-A-2009-209343 can be applied.

The packaging material containing the polyester resin composition of the present invention is described below. The packaging material containing the polyester resin composition of the present invention may be a packaging material composed of any kind of polymer as long as it contains the above-described polyester resin composition. Examples thereof include a thermoplastic resin, a polyvinyl alcohol, a polyvinyl chloride, a styrene-based resin, a polyolefin, and ROMP. For example, a resin having a thin-film layer formed by deposition of an inorganic material may be used. Also, for example, paper coated with a resin containing the polyester resin composition may be used.

The packaging material containing the polyester resin composition of the present invention may be used for packaging any of food, beverages, medicament, cosmetics, individual care products and the like. Examples thereof include food packaging, colored liquid packaging, liquid preparation packaging, medicine container packaging, medical sterilization packaging, photographic light-sensitive material packaging, photographic film packaging, ultraviolet curable ink packaging, and shrink label.

The packaging material containing the polyester resin composition of the present invention may be a transparent package or a light-blocking package.

The packaging material containing the polyester resin composition of the present invention not only has an ultraviolet light-blocking property but also may have other performances. Examples thereof include those having also a gas barrier property, those containing an oxygen indicator, and those formed by combining the polyester resin composition and a fluorescent brightener.

The packaging material containing the polyester resin composition of the present invention may be produced using any method. Examples thereof include a method of forming an ink layer, a method of melt-extruding and stacking a resin containing the polyester resin composition, a method of coating the composition on a base film, and a method of dispersing the polyester resin composition in an adhesive.

The container comprising the polyester resin composition of the present invention is described below. The container comprising the polyester resin composition of the present invention may be a container composed of any kind of polymer as long as it comprises the above-described polyester resin composition. Examples thereof include a thermoplastic resin container, a polyester-made container, a polyethylene naphthalate-made container, a polyethylene-made container, a cyclic olefin-based resin composition-made container, a plastic container, and a transparent polyamide container. For example, the container may be a paper container comprising a resin or may be a glass container having a polyester resin layer.

As for the usage of the container comprising the polyester resin composition of the present invention, the container may used for containing any of food, beverages, medicament, cosmetics, individual care products, shampoos and the like. Examples thereof include a liquid fuel-storing container, a golf ball container, a food container, a liquor container, a medicament-filling container, a beverage container, an oily food container, an analytical reagent solution container, an instant noodle container, a light-resistant cosmetic material container, a medical product container, a high-purity chemical solution container, a liquid container, an ultraviolet curable ink container, and a W plastic ampoule.

The container comprising the polyester resin composition of the present invention not only has an ultraviolet-blocking property but also may have other performances. Examples thereof include an antimicrobial container, a flexible container, a dispenser container, and a biodegradable container.

The container comprising the polyester resin composition of the present invention may be produced using any method. Examples thereof include a two-layer stretching blow-molding method, a multilayer co-extrusion blow-molding method, a method of forming an ultraviolet-absorbing layer on the external surface of a container, a method using a shrinkable film, and a method using a supercritical fluid.

The coating material and the coating film each containing the polyester resin composition of the present invention are described below. The coating material containing the polyester resin composition of the present invention may be a coating material composed of any component as long as it contains the compound represented by formula (1). Examples thereof include acrylic resin-based, urethane resin-based, aminoalkyd resin-based, epoxy resin-based, silicone resin-based and fluororesin-based coating materials. Such a resin can be arbitrarily blended with a base compound, a curing agent, a diluent, a leveling agent, an anti-repelling agent and the like.

For example, in the case where an acrylic urethane resin or a silicon acrylic resin is selected as the transparent resin component, polyisocyanate or the like can be used as the curing agent, and a hydrocarbon-based solvent such as toluene and xylene, an ester-based solvent such as isobutyl acetate, butyl acetate and amyl acetate, or an alcohol-based solvent such as isopropyl alcohol and butyl alcohol, can be used as the diluent. The acrylic urethane resin as used herein indicates an acrylic urethane resin obtained by reacting a methacrylic acid ester (typically, methyl)/hydroxyethyl methacrylate copolymer with a polyisocyanate. In this case, examples of the polyisocyanate include tolylene diisocyanate, diphenylmethane diisocyanate, polymethylene polyphenylene polyisocyanate, tolidine diisocyanate, naphthalene diisocyanate, hexamethylene diisocyanate, isophorone diisocyanate, xylylene diisocyanate, dicyclohexylmethane diisocyanate, and hexamethylene diisocyanate. Other examples of the transparent resin component include polymethyl methacrylate, a polymethyl methacrylate/styrene copolymer, polyvinyl chloride, and polyvinyl acetate. In addition to these components, for example, a leveling agent such as acrylic resin or silicone resin, and an anti-repelling agent such as silicone-based or acrylic anti-repelling agent may be blended, if desired.

As for the intended use, the coating material containing the polyester resin composition of the present invention may be used for any application. Examples thereof include an ultraviolet-blocking paint, an ultraviolet/near infrared-blocking paint, an electromagnetic wave-blocking paint, a clear paint, a metallic paint composition, a cationic electrodeposition paint, an antimicrobial and lead-free cationic electrodeposition paint, a powder paint, an aqueous middle coat paint, an aqueous metallic paint, an aqueous clear paint, a topcoat paint used for automobiles, architectures or civil works, a curable paint, a coat-forming composition used for plastic materials such as automobile bumper, a paint for metal plates, a cured gradient coating, a paint material for electric wires, a vehicle refinishing paint, an anionic electrodeposition paint, an automotive paint, a paint for coated steel sheets, a paint for stainless steels, an insecticidal paint for lamps, an ultraviolet curable paint, an antimicrobial paint, an eyestrain protection paint, an antifogging paint, an ultra-weather-resistant paint, a gradient paint, a photocatalyst paint, a strippable paint, a concrete separation paint, an anticorrosion paint, a protective paint, a water-repellent protective paint, a paint for preventing sheet glass scattering, an alkali-soluble protective paint, an aqueous temporary protective paint composition, a floor paint, an emulsion paint, a two-liquid aqueous paint, a one-liquid paint, a UV-curable paint, an electron beam-curable paint composition, a thermosetting paint composition, an aqueous paints for baking lacquers, a powder paint, a slurry paint, a repair paint, a water dispersion of powder paint, a paint for plastics, and an electron beam-curable paint.

The coating material containing the polyester resin composition of the present invention is generally composed of a coating material (containing a transparent resin component as the main component) and the polyester resin composition and is preferably formulated to contain the polyester resin composition in a ratio of 0 to 20 mass %. In applying the coating material, the thickness is preferably from 2 to 1,000 μm, more preferably from 5 to 200 μm. The method for applying such a coating material is arbitrary but includes, for example, a spray method, a dipping method, a roller coating method, a flow coater method and a flow coating method. Drying after coating is preferably performed at a temperature of generally from room temperature to 120° C. for approximately from 10 to 90 minutes, though these conditions may vary according to the components of the coating material.

The coating film containing the polyester resin composition of the present invention is a coating film containing the polyester resin composition composed of the compound represented by formula (1), and this is a coating film formed using a coating material containing the polyester resin composition of the present invention.

The ink containing the polyester resin composition of the present invention is described below. The ink containing the polyester resin composition of the present invention may be an ink in any form as long as it contains the polyester resin composition above. Examples thereof include a dye ink, a pigment ink, an aqueous ink and an oil-based ink. Also, the ink may be used for any application. Examples of the application include a screen printing ink, a flexographic printing ink, a gravure printing ink, a lithographic offset printing ink, a letterpress printing ink, a UV ink, and an EB ink. Other examples include an inkjet ink, a photochromic ink, a thermal transfer ink, a masking ink, a security ink, and a DNA ink.

Also, any embodiment obtained using the ink containing the polyester resin composition of the present invention is included in the present invention. Examples thereof include a printed matter, a laminate obtained by laminating the printed matter, a packaging material or container using the laminate, and an ink receiving layer.

The fiber containing the polyester resin composition of the present invention is described below. The fiber containing the polyester resin composition of the present invention may be a fiber containing any kind of polymer as long as it contains the above-described polyester resin composition. Examples thereof include a polyester fiber, a polyphenylene sulfide fiber, a polyamide fiber, an aramid fiber, a polyurethane fiber, and a cellulose fiber.

The fiber containing the polyester resin composition of the present invention may be produced by any method. For example, a polymer previously containing the compound represented by formula (1) may be processed into a fiber shape or, for example, a fiber obtained by processing may be treated with a solution or the like containing the compound represented by formula (1). The treatment may be also performed using a supercritical fluid.

The fiber containing the polyester resin composition of the present invention can be used for various applications. Examples thereof include clothing, backing cloth, underwear, blanket, socks, artificial leather, insecticidal mesh sheet, architectural mesh sheet, carpet, moisture-permeable/waterproof sheet, nonwoven fabric, ultrafine fiber, fiber-made sheet material, refreshing clothing moisture-permeable waterproof sheet, flame-retardant synthetic suede-like structure, resin tarpaulin, film agent, external wall material, agricultural greenhouse, net or mesh for building material, filter backing, antifouling film agent, mesh fabric, land net, underwater net, ultrafine fiber, textile fiber, air-bag base cloth, and ultraviolet-absorbing fiber product.

The building material containing the polyester resin composition of the present invention is described below. The building material containing the polyester resin composition of the present invention may be a building material containing any kind of polymer as long as it contains the above-described polyester resin composition. Examples thereof include a vinyl chloride-based material, an olefin-based material, a polyester-based material, a polyphenylene ether-based material, and a polycarbonate-based material.

The building material containing the polyester resin composition of the present invention may be produced by any method. For example, a material containing the polyester resin composition may be formed into a desired shape; a laminate may be formed by stacking a material containing the polyester resin composition; a coated layer using the compound represented by formula (1) may be formed; or a coating material containing the polyester resin composition may be applied to form the material.

The building material containing the polyester resin composition of the present invention can be used for various applications. Examples thereof an exterior building material, an architectural wood structure, an architectural roofing material, an antimicrobial building material, an architectural base material, an antifouling building material, a flame-retardant material, a ceramic building material, a decorative building material, an architectural painted article, a cosmetic material, a building material net, an architectural moisture-permeable waterproof sheet, an architectural mesh sheet, an architectural film, a decorative film, an architectural coating material, an architectural adhesive composition, a civil engineering construction structure, a walking path coating material, a sheet-like photocurable resin, a wood-protecting paint, a push-switch cover, a bond-sheeting agent, an architectural backing, a wall paper, a decorative polyester film, a decorative polyester film for molded members, and a floor material The recording medium containing the polyester resin composition of the present invention is described below. The recording medium containing the polyester resin composition of the present invention may be any recording medium as long as it contains the compound represented by formula (1). Examples thereof include an inkjet recording medium, a sublimation transfer image-receiving sheet, an image-recording medium, a heat-sensitive recording medium, a reversible heat-sensitive recording medium, and an optical information recording medium.

The image display device containing the polyester resin composition of the present invention is described below. The image display device containing the polyester resin composition of the present invention may be any device as long as it contains the compound represented by formula (1). Examples thereof include an image display device using an electrochromic element, a so-called electronic paper image display device, a plasma display, and an image display device using an organic EL element. The polyester resin composition of the present invention may be used, for example, to form an ultraviolet-absorbing layer in a laminate structure, or the polyester resin composition may be contained in a necessary member such as circularly polarizing plate.

The solar cell protective sheet containing the polyester resin composition of the present invention is described below. The solar cell applied in the present invention may be a solar cell composed of an element in any form, such as crystalline silicon solar cell, amorphous silicon solar cell and dye-sensitized solar cell. In a crystalline silicon solar cell or an amorphous silicon solar cell, a cover material is used as a protective member for imparting antifouling property, impact resistance and durability. In a dye-sensitized solar cell, since a metal oxide-based semiconductor capable of becoming active upon excitation by light (in particular, ultraviolet light) is used as the electrode material and this is accompanied by a problem that the dye adsorbed as a photosensitizer is deteriorated and the solar power efficiency is gradually reduced, it is proposed to provide an ultraviolet-absorbing layer. In this connection, the solar cell protective sheet containing the pressure-sensitive adhesive composition of the present invention can maintain the long-wavelength ultraviolet-blocking effect for a long period of time and therefore, produces an effect of exhibiting excellent light resistance.

The solar cell protective sheet containing the polyester resin composition of the present invention may contain any kind of polymer, in addition to the polyester resin. Examples of the polymer include a thermosetting transparent resin, an α-olefin polymer, a polypropylene, a polyether sulfone, an acrylic resin, and a transparent fluororesin.

The solar cell protective sheet containing the polyester resin composition of the present invention may further contain other components, if desired. Examples of other components include a crosslinking agent, a crosslinking aid, an antioxidant, a flame retardant, a light stabilizer, a heat stabilizer, and a fluorescent brightener.

The solar cell protective sheet containing the polyester resin composition of the present invention may be produced by any method. For example, an ultraviolet-absorbing layer may be formed; layers each containing the polyester resin composition may be stacked; the polyester resin composition may be contained in a filler layer resin; or a film may be formed from a polymer containing the polyester resin composition.

The solar cell protective sheet containing the polyester resin composition of the present invention may be in any form and is, for example, in a form of film, sheet, laminate film or cover glass structure. Examples thereof include the film and sheet described in JP-A-2000-91610 and JP-A-11-261085; the laminate film described, for example, in JP-A-11-40833; the cover glass structure described in JP-A-11-214736. In view of versatility, a sheet form is preferred. In the case of the solar cell protective sheet is in a sheet or film form, the thickness thereof may be arbitrarily determined according to the specification for use and is not particularly limited but is preferably from 30 to 300 μm, more preferably from 50 to 200 μm. The thickness in this range is preferred, because higher rigidity and mechanical strength can be obtained. The solar cell protective sheet in a sheet form can be used for both a photovoltaic front sheet and a photovoltaic backsheet.

The solar cell protective sheet is described in detail below.

As the solar cell protective sheet, various materials such as PET or PEN containing the polyester resin of the present invention, liquid EVA (ethylene vinyl acetate), film-form EVA and vinylidene fluoride copolymer-acrylic resin mixture, may be used according to the purpose, for example, for the purpose of imparting weather resistance, imparting electrical insulation, enhancing current collection efficiency, or enhancing cell protection (impact resistance).

At the time of fixing the solar cell protective sheet on the cell, a method suited for physical properties of the material is used. There may be used various methods such as, in the case of a film-form material, roll compression followed by heat fusion or vacuum compression followed by heat fusion, and in the case of a liquid or past-form material, roll coating, bar coating, spray coating or screen printing.

In the case where a flexible material containing the polyester resin of the present invention, such as PET and PEN, is used as the solar cell protective sheet, after a roll-form support is unrolled and the cell is constructed thereon, the solar cell protective sheet can be continuously laminated by the above-described method, and this ensures high productivity.

The solar cell protective sheet is preferably composed of a photovoltaic front sheet and a photovoltaic backsheet. The polyester composition of the present invention may be used for both of the photovoltaic front sheet and the photovoltaic backsheet of the solar cell protective sheet.

The photovoltaic module containing the polyester resin composition of the present invention is described below. From the standpoint of enhancing durability and the like, the solar cell preferably uses a protective sheet. For the protective sheet, the polyester resin composition of the present invention can be used, and the protective sheet includes a solar cell protective sheet composed of a photovoltaic front sheet and a photovoltaic backsheet.

The photovoltaic module containing the polyester resin composition of the present invention preferably has a structure where a cell is constructed on a supporting substrate, the top thereof is covered with, for example, a solar cell protective sheet such as PET or PEN containing a filling resin or the polyester resin of the present invention, and light is collected from the opposite side of the supporting substrate. The photovoltaic module may also has a structure where a transparent material such as hardened glass is used for the supporting substrate, a cell is constructed thereon, and light is collected from the transparent supporting substrate side. A module is assembled by the method described, for example, in JP-A-2007-128943, JP-A-2006-100527, JP-A-2002-134767 and JP-A-2010-27714, and a solar cell protective sheet using the polyester resin composition may be used for the module.

As to the particle diameter of titanium dioxide, for the purpose of keeping the viscosity of the liquid dispersion high, the average primary particle diameter is preferably from 2 to 50 nm, and an ultrafine particle having an average primary particle diameter of 2 to 30 nm is more preferred. Two or more kinds of fine particles differing in the particle diameter distribution may be mixed and in this case, the average size of the smaller particle is preferably 5 nm or less. Also, for the purpose of scattering the incident light and enhancing the light capturing ratio, a large particle having an average particle diameter exceeding 50 nm may be added in a low percentage to the above-described ultrafine particle. In this case, the content percentage of the large particle is preferably 50% or less, more preferably 20% or less, based on the mass of the particle having an average particle diameter of 50 nm or less. The average particle diameter of the large particle added and mixed for the above-described purpose is preferably 100 nm or more, more preferably 250 nm or more.

As for the dispersion solvent of the titanium dioxide liquid dispersion, water and/or various organic solvents can be used. Examples of the organic solvent include alcohols such as methanol, ethanol, isopropyl alcohol, polyvinyl alcohol, citronellol and terpineol, ketones such as acetone, esters such as ethyl acetate, dichloromethane, and acetonitrile.

At the dispersion, for example, a polymer such as polyethylene glycol, hydroxyethyl cellulose and carboxymethyl cellulose, a surfactant, an acid, or a chelate may be used as a dispersion aid in a small amount, if desired.

FIG. 1 is a schematic view showing one example of the photovoltaic module of the present invention. In FIG. 1, 31 is a hardened glass, 32 is a resin layer, 33 is the solar cell encapsulating material of the present invention, 34 is a solar battery (cell), 35 is a frame, 36 is an encapsulating resin, 37 is wiring, and 38 is an adhesive layer. In the photovoltaic module of FIG. 1, light enters the surface.

The production method of the photovoltaic module above is described below by referring to FIG. 1. (1) An EVA (ethylene vinyl acetate copolymer) sheet 32 is placed on a clean hardened glass 31 and a solar battery (cell) 34 is disposed thereon. (2) The solar cell encapsulating material 33 of the present invention is stacked thereon and in this state, the assembly is heated for about 1 hour to crosslink the EVA layer. (3) The excess EVA and back encapsulating material (back sheet) are cut along the hardened glass. (4) The produced member is pushed into a frame 35 with the hardened glass 31 side (working out to the front surface where sunlight enters) first. (5) The EVA layer 32 and the solar cell encapsulating material 33 of the present invention are partially cut, and wiring 37 is soldered to the terminal portion of the photovoltaic cell. (6) The cut part is coated with a silicone resin or a silicone rubber to encapsulate the terminal portion by an encapsulating resin 36. (7) A terminal box is provided, if desired, and wiring is installed.

The glass and glass coat each containing the polyester resin composition of the present invention are described below. The glass and glass coat each containing the polyester resin composition of the present invention may be in any form as long as they contain the compound represented by formula (1). Also, the glass and glass coat may be used for any application. Examples thereof include a heat ray-blocking glass, a window glass, a colored glass, an ultraviolet sharp-cut glass for high-intensity light sources such as mercury lamp and metal halide lamp, a frit glass, an ultraviolet-blocking glass for vehicles, a colored heat ray-absorbing glass, a fluorescent brightener-containing ultraviolet-absorbing insulated glass, an ultraviolet/heat ray-blocking glass for automobiles, an exterior stained glass, a water-repellent ultraviolet/infrared ray-absorbing glass, a glass for head-up display device of vehicles, a dimming heat barrier multilayer window, an ultraviolet/infrared cut glass, an ultraviolet cut glass, an ultraviolet/infrared-absorbing window glass, an ultraviolet/infrared-absorbing antifouling window film, a translucent panel for cultivation house, an ultraviolet/infrared-absorbing low-transmission glass, a low-reflectance low-transmittance glass, an edge light apparatus, a rough surface-forming sheet glass, a laminated display glass, an electrically conductive film-attached glass, an antiglare glass, an ultraviolet/infrared-absorbing middle-transmission glass, a privacy-protection window glass for vehicles, an antifogging glass for vehicles, a glass for paving materials, a water droplet adhesion-preventing and heat ray-blocking glass sheet, an ultraviolet/infrared-absorbing bronze glass, a laminated glass, a glass with ID identification function, a PDP optical filter, and a skylight window. The glass containing the polyester resin composition of the present invention may be produced by any method.

Other use examples include an illuminating device light source cover, an artificial leather, a sport goggle, a deflection lens, a hardcoat for various plastic products, a hardcoat for lamination to the exterior surface of window, a window film, a high-definition antiglare hardcoat film, an antistatic hardcoat film, a permeable hardcoat film, the anti-forgery paper described in JP-A-2002-113937, a purple blotch-preventing agent for lawn grass, a sealant for resin film sheet bonding, a light guiding element, a rubber coating agent, an agricultural covering material, a color candle, a cloth-rinsing agent composition, a prism sheet, a protective layer transfer sheet, a photocurable resin product, a floor sheet, a light-blocking printed label, a fuel cup, a hardcoat film-coated article, an intermediate transfer recording medium, an artificial hair, a low-temperature heat-shrinkable film for label, a fishing article, a microbead, a pre-coated metal plate, a thin-wall film, a heat-shrinkable film, an in-mold shape-forming label, a projection screen, a decorative sheet, a hot-melt adhesive, an adhesive, an electrodeposited coat, a basecoat, a wood surface protection, a dimming material, a dimming film, a dimming glass, a moth-repellent lamp, a touch panel, a sealant for resin film sheet bonding, a polycarbonate film coating, an optical fiber tape, and a solid wax.

In these use methods, the polyester resin composition of the present invention not only may be used alone but also may be used by combining it with other materials and forming layers. Examples thereof include provision of a pressure-sensitive adhesive layer, provision of a hardcoat layer, provision of an infrared-blocking layer, provision a heat insulator layer, provision of a surface modifier layer, provision of a release agent layer, and provision of an antifogging functional layer.

These layers may be stacked by any method, and examples of the method include a method of melt-extruding and stacking the layer, a method of coating the layer, and a method of stacking the layer on the polyester resin composition film by using an adhesive.

The resin usable for the pressure-sensitive adhesive layer is not particularly limited and may be appropriately selected according to the situation from conventionally known various pressure-sensitive adhesives, but in view of weather resistance and the like, an acrylic, urethane-based or silicone-based pressure-sensitive adhesive is suitable.

For example, in the case where an infrared-blocking layer is provided on the polyester resin film, a release sheet can be provided on the surface opposite the infrared-blocking layer side through a pressure-sensitive adhesive layer.

The thickness of the pressure-sensitive adhesive layer is usually from 5 to 100 µm, preferably from 10 to 60 µm.

Examples of the release sheet that is provided on the pressure-sensitive adhesive layer include a sheet obtained by coating a release agent such as silicone resin on paper such as glassine paper, coated paper and laminated paper, or various plastic films. The thickness of the release sheet is not particularly limited but is usually on the order of 20 to 150 µm. Incidentally, an ultraviolet absorber or a light stabilizer may be incorporated into the pressure-sensitive adhesive layer, if desired.

Also, for example, provision of a hardcoat layer is described in detail below.

Examples of the resin which can be used for the hardcoat layer include a polyester resin having an acrylate-based functional group, an acrylic resin, a urethane resin, a resin using an oligomer or prepolymer of such a resin as the main component, and a silicone-based resin. These resins are a resin that is caused to undergo crosslinking by adding energy such as heat, ultraviolet ray and electron beam. In the case of using a resin that is caused to undergo crosslinking by ultraviolet irradiation, a photopolymerization initiator such as acetophenones, benzophenones, α-hydroxy ketone, benzyl dimethyl ketal, α-aminoketone, and bisacylphosphine oxide is preferably mixed.

In particular, from the standpoint of hardcoat property, a silicone-based hardcoat layer is preferred.

The thickness of the hardcoat layer formed is usually from 0.05 to 30 µm, preferably from 1.0 to 20 µm. The hardcoat layer is formed on one surface of the polyester resin film of the present invention or may be formed on one surface of a multilayer film containing the polyester resin film of the present invention. In the case of a laminate of the resin film of the present invention and an impact-resistant resin film, the hardcoat layer is preferably provided on the surface of a weather-resistant resin film.

The silicone-based hardcoat layer is a layer containing a silicon compound having a siloxane bond, and preferred examples thereof include a layer containing an inorganic silica-based compound (including polysilicic acid) and/or a polyorganosiloxane-based compound as the main component.

The inorganic silica-based compound, the polyorganosiloxane-based compound, or a mixture thereof can be produced by various methods described below.

For example, a method where an alkoxysilane compound represented by formula [1]:

$$R^1{}_n Si(OR^2)_{4-n} \quad [1]$$

[wherein $R^1$ is a non-hydrolyzable group and is an alkyl group, a substituted alkyl group (substituent: for example, a halogen atom, an epoxy group, or a (meth)acryloyloxy group), an alkenyl group, an aryl group or an aralkyl group, $R^2$ is a lower alkyl group, and n is 0 or an integer of 1 to 3, provided that when a plurality of $R^1$ or a plurality of $OR^2$ are present, the plurality of $R^1$ may be the same or different or the plurality of $OR^2$ may be the same or different] is partially or completely hydrolyzed by using an inorganic acid such as hydrochloric acid and sulfuric acid, or an organic acid such as oxalic acid and acetic acid, and then polycondensed, is preferably used. In this case, when a compound where n is 0, that is, a tetraalkoxysilane, is completely hydrolyzed, an inorganic silica-based binder is obtained, and when the compound is partially hydrolyzed, a polyorganosiloxane-based binder or a mixed binder of an inorganic silica-based binder and a polyorganosiloxane-based binder is obtained. On the other hand, a compound where n is from 1 to 3 has a non-hydrolyzable group and therefore, when partially or completely hydrolyzed, a polyorganosiloxane-based binder is obtained. At this time, in order to uniformly perform the hydrolysis, an appropriate organic solvent may be used.

Examples of the alkoxysilane compound represented by formula [1] include tetramethoxysilane, tetraethoxysilane, tetra-n-propoxysilane, tetraisopropoxysilane, tetra-n-butoxysilane, tetraisobutoxysilane, tetra-sec-butoxysilane, tetra-tert-butoxysilane, methyltrimethoxysilane, methyltriethoxysilane, methyltripropoxysilane, methyltriisopropoxysilane, ethyltrimethoxysilane, ethyltriethoxysilane, propyltriethoxysilane, butyltrimethoxysilane, phenyltrimethoxysilane, phenyltriethoxysilane, γ-glycidoxypropyltrimethoxysilane, γ-acryloyloxypropyltrimethoxysilane, γ-methacryloyloxypropyltrimethoxysilane, dimethyldimethoxysilane, methylphenyldimethoxysilane, vinyltrimethoxysilane, vinyltriethoxysilane, divinyldimethoxysilane, divinyldiethoxysilane, trivinylmethoxysilane, and trivinylethoxysilane. One of these may be used alone, or two or more thereof may be used in combination. Also, at this time, an aluminum compound such as aluminum chloride and trialkoxyaluminum may be added in an appropriate amount, if desired.

As another method, a method where sodium metasilicate, sodium orthosilicate or water glass (sodium silicate mixture) is used for the raw material silicon compound and is subjected to a hydrolysis treatment by causing an acid such as hydrochloric acid, sulfuric acid and nitric acid, or a metal compound such as magnesium chloride and calcium sulfate to act thereon, may be used. By this hydrolysis treatment, a free silicic acid is produced, but the product is readily polymerized and is a mixture of chain, cyclic and network structures, though this may vary depending on the kind of the raw material. In the polysilicic acid obtained from water glass, the principal structure is a chain structure represented by formula [2]:

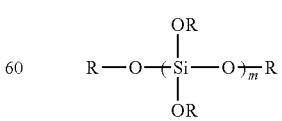

[2]

(wherein m represents the degree of polymerization, and R is hydrogen, silicon or a metal such as magnesium and aluminum). In this way, a complete inorganic silica-based binder is obtained. As the inorganic silica-based binder, silica gel (SiO$_x$.nH$_2$O) may be also used. In the hardcoat layer, the hardcoat performance is important and therefore, it is preferred to contain as much inorganic silica-based compound as possible within a range where the required adherence is maintained. Also, in the hardcoat layer, an inorganic ultraviolet scattering agent may be incorporated, if desired, as long as the scratch resistance is not impaired. The hardcoat layer can be formed by coating a hardcoat agent-containing coating solution on the multilayer substrate by a known method such as bar coating, knife coating, roll coating, blade coating, die coating and gravure coating, and then heating and thereby curing the coating.

The resin which can be used for the infrared-blocking layer is not particularly limited and may be appropriately selected according to the situation from various resins. Examples of the film include a film composed of a polyolefin-based resin such as polyethylene, polypropylene, poly-4-methylpentene-1 and polybutene-1, a polyester-based resin such as polyethylene terephthalate and polyethylene naphthalate, a polycarbonate-based resin, a polyvinyl chloride-based resin, a polyphenylene sulfide-based resin, a polyether sulfone-based resin, a polyethylene sulfide-based resin, a polyphenylene ether-based resin, a styrene-based resin, an acrylic resin, a polyamide-based resin, polyimide-based resin, or a cellulose-based resin such as cellulose acetate; and a laminate film thereof. The thickness of this transparent substrate film is not particularly limited and may be appropriately selected according to the intended use but is usually from 5 to 200 µm, preferably from 10 to 100 µm.

Also, the resin may contain an antioxidant, an ultraviolet absorber and the like.

The infrared-blocking agent which can be used for the infrared-blocking layer can be roughly classified into an inorganic infrared-blocking agent and an organic infrared-blocking agent. Examples of the former inorganic infrared-blocking agent include titanium oxide, zinc oxide indium oxide, tin oxide and zinc sulfide, and above all, a metal oxide such as tin oxide, ATO (antimony-doped tin oxide) and ITO (tin-doped indium oxide) is preferred. Examples of the organic infrared-blocking agent include a cyanine-based compound, a squarylium-based compound, a thiol nickel complex salt-based compound, a phthalocyanine-based compound, a triallylmethane compound, a naphthoquinone-based compound, an anthraquinone-based compound, and an amino compound such as perchlorate of N,N,N',N'-tetrakis(p-di-n-butylaminophenyl)-p-phenylenediaminium, chlorine salt of phenylenediaminium, hexafluoroantimonate of phenylenediaminium, fluoborate of phenylenediaminium, fluorine salt of phenylenediaminium, and perchlorate of phenylenediaminium.

The method for evaluating the light resistance of the polymer material is described below. The method for evaluating the light resistance of the polymer material can be referred to, for example, *Kobunshi no Hikari Anteika Gijutsu (Technique for Photostabilizing Polymers)*, pp. 85-107, CMC Publishing (2000), *Koseino Toryo no Kiso to Bussei (Basis and Physical Properties of High Functional Coating Materials)*, pp. 314-359, CMC Publishing (2003), *Kobunshi Zairyo to Fukugouzai Seihin no Talkyusei (Durability of Polymer Materials and Composite Material Products)*, CMC Publishing (2005), *Kobunshi Zairyo no Chojumyo-ka to Kankyo Taisaku (Elongation of Lifetime of Polymer Materials and Environmental Measures)*, CMC Publishing (2000), H. Zweifel (compiler), *Plastics Additives Handbook 5th Edition*, pp. 238-244, Hanser Publishers, and Tadahiko Kutsura, *Kiso Koza 2, Plastic Housou Yoki no Kagaku (Basic Seminar 2, Science of Plastic Packaging Container)*, Chapter 8, Society of Packaging Science & Technology, Japan (2003).

Also, the evaluations in each application can be achieved by the following known evaluation methods. The degradation of the polymer material due to light can be evaluated by the methods of JIS-K7105:1981, JIS-K7101:1981, JIS-K7102: 1981, JIS-K7219:1998, JIS-K7350-1:1995, JIS-K7350-2: 1995, JIS-K7350-3:1996, JIS-K7350-4:1996 and JIS-C-2318-1997:5331, or a method based thereon.

The light resistance in use for packaging/container can be determined by the method of JIS-K7105 or a method based thereon. Specific examples of the method include an evaluation of light transmittance or transparency of a bottle body, a sensory test evaluation of the bottle content after exposure to ultraviolet light from a xenon light source, a haze value evaluation after xenon lamp irradiation, a haze value evaluation using a halogen lamp as the light source, a yellowness index evaluation by a blue wool scale after exposure to a mercury lamp, a haze value evaluation using a sunshine weather meter, a visual evaluation of colorability, an ultraviolet transmittance evaluation, an ultraviolet blocking rate evaluation, a light transmittance evaluation, evaluations of viscosity and light transmittance of ink in an ink container, an evaluation with an eye or based on the color difference ΔE of the sample in a container after exposure to sunlight, evaluations of ultraviolet transmittance, light transmittance, color difference, light transmittance, haze value, color tone, yellowness index and light-blocking property after white fluorescent lamp irradiation, a whiteness evaluation using the color difference formula of the L*a*b* color system, a yellowing evaluation based on the color difference ΔEa*b* of the exposed sample for each wavelength after dispersion of xenon light, an ultraviolet absorbance evaluation after exposure to ultraviolet light, a tensile elongation evaluation of the film after exposure using a sunshine weather meter, an antimicrobial evaluation after exposure using a xenon weather meter, a discoloration evaluation of the package content after fluorescent lamp irradiation, evaluations of peroxide and color tone of oil after exposing a salad oil-filled bottle to a fluorescent lamp, an absorbance difference evaluation after chemical lamp irradiation, evaluations of surface gloss retention and appearance after exposure using a sunshine weather meter, evaluations of color difference and flexural strength after exposure using a sunshine weatherometer, a light blocking ratio evaluation, and an evaluation of peroxide production in kerosene.

The long-term durability in use for coating material/coating film can be evaluated by the methods of JIS-K5400, JIS-K5600-7-5:1999, JIS-K5600-7-6:2002, JIS-K5600-7-7: 1999, JIS-K5600-7-8:1999 and JIS-K8741, or a method based thereon. Specific examples thereof include an evaluation based on the color density, the color difference ΔEa*b* in the CIE L*a*b* color coordinates or the residual gloss after exposure using a xenon light resistance tester and an UVCON apparatus, an absorbance evaluation after exposure of a film on a quartz slide by using a xenon arc light resistance tester, an evaluation based on the color density or the color difference ΔEa*b* in the CIE L*a*b* color coordinates after exposing the wax to a fluorescent lamp or an UV lamp, a color hue evaluation after exposure using a Metalweather weather resistance tester, an evaluation of gloss retention or an evaluation based on the color difference ΔEa*b* after an exposure test using a metal halide lamp, an evaluation of glossiness after exposure using a sunshine carbon arc light source, an evaluation based on the color difference ΔEa*b* or an evaluation of the gloss retention or appearance after exposure using a Metalweather weather resistance tester, an evaluation of gloss retention after exposure using a sunshine weatherometer, an evaluation based on the color difference ΔEa*b* or an evaluation of gloss retention after exposure using a QUV weather resistance tester, an evaluation of gloss retention after exposure using a sunshine weatherometer, an appearance evaluation of the coated plate after exposure using a sunshine weatherometer, an evaluation of gloss retention or change in brightness after exposure using a sunshine weatherometer, an appearance evaluation of the coating film in a deteriorated state after exposure of the coating film to dew cycle WOM, an evaluation of ultraviolet transmittance of the coating film, an evaluation of ultraviolet blocking rate of the coating film, a comparative evaluation of the time until the gloss retention rate of the coating film is reduced to 80% by using a sunshine weatherometer, an evaluation of rusting after exposure using a Dewpanel light control weather meter, an evaluation of strength of the concrete against the coated formwork after outdoor exposure, an evaluation based on the color difference ΔEa*b* after outdoor exposure, a grid adhesion evaluation, a surface appearance evaluation, a gloss retention evaluation after outdoor exposure, and an evaluation of yellowing degree (ΔYI) after exposure using a carbon arc light source.

The light resistance in use for ink can be evaluated by the methods of JIS-K5701-1:2000, JIS-K7360-2 and ISO105-B02, or a method based thereon. Specific examples thereof include an evaluation based on the color density or the measurement of the CIE L*a*b* color coordinates after exposure using an office fluorescent lamp or a discoloration tester, an electrophoretic evaluation after exposure to ultraviolet light from a xenon arc light source, a density evaluation of the printed matter by using a xenon fade meter, a deinking evaluation using a 100 W chemical lamp, an evaluation of dye residual ratio in the image formed region by using a weather meter, evaluations of chalking and discoloration of the printed matter by using an Eye Super UV tester, an evaluation based on the color difference ΔEa*b* of the CIE L*a*b* color coordinates for a printed matter after exposure using a xenon fade meter, and a reflectance evaluation after exposure using a carbon arc light source.

The light resistance of the solar cell module can be evaluated by the methods of JIS-C8917:1998 and JIS-C8938:1995, or a method based thereon. Specific examples thereof include an I-V measurement photovoltaic efficiency evaluation after exposure using a xenon lamp light source equipped with a sunlight-simulating compensation filter, an evaluation of discoloration gray scale degree after exposure using a sunshine weather meter or a fade mater, and an evaluation of color, appearance and adherence.

The light resistance of the fiber and fiber product can be evaluated by the methods of JIS-L1096:1999, JIS-A5905:2003, JIS-L0842, JIS-K6730, JIS-K7107, DIN75.202, SAEJ1885, SN-ISO-105-B02 and AS/NZS4399, or a method based thereon. Examples thereof include an ultraviolet transmittance evaluation, a blue scale discoloration evaluation after exposure using a xenon light source or a carbon arc light source, a UV protection evaluation, an ultraviolet-blocking effect evaluation, a blue scale discoloration evaluation after dry cleaning and exposure using a carbon arc light source, an evaluation of the color difference ΔE* based on lightness index and chromaticness index after exposure using a fadeometer, a tensile strength evaluation after exposure using a UV tester or a sunshine weather meter, a total transmission evaluation, a strength retention evaluation, an ultraviolet protection factor (UPF) evaluation, a discoloration gray scale evaluation after exposure using a high-temperature fade meter, an appearance evaluation after outdoor exposure, evaluations of yellowness index (YI) and yellowing degree (ΔYI) after exposure to ultraviolet light, and a conventional reflectance evaluation.

The light resistance of the architectural material can be evaluated by the method of JIS-A1415:1999 or a method based thereon. Specific examples thereof include a surface color tone evaluation after exposure using a sunshine weatherometer, an appearance evaluation after exposure using a carbon arc light source, an appearance evaluation after exposure using an Eye Super UV tester, an absorbance evaluation after exposure, an evaluation of chromaticity and color difference after exposure, an evaluation based on the color difference ΔEa*b* of the CIE L*a*b* color coordinates after exposure using a metal halide lamp light source, a gloss retention evaluation, the evaluation of change in the haze value after exposure using a sunshine weather meter described in JP-A-10-44352 and JP-A-2003-211538, an elongation retention evaluation using a tensile tester after exposure, an ultraviolet transmittance evaluation after dipping in a solvent, a visual appearance evaluation after exposure using an Eye Super UV tester, an evaluation of change in the glossiness after a QUV test, a gloss retention evaluation after exposure using a sunshine weatherometer, an evaluation based on the color difference ΔEa*b* after exposure to ultraviolet light using a black light blue fluorescent lamp, an adherence retention evaluation after exposure using a UVCON acceleration tester, an ultraviolet-blocking effect evaluation, an appearance evaluation after outdoor exposure (JIS-A1410), a total light transmittance evaluation, a haze change evaluation, a tensile shear adhesive strength evaluation, a total light transmittance evaluation after exposure using a xenon weather meter, a haze evaluation, a yellowness index evaluation, and evaluations of yellowing degree (ΔYI) and ultraviolet absorber residual ratio after exposure using a sunshine weatherometer.

The light resistance in use for recording medium can be evaluated by the method of JIS-K7350 or a method based thereon. Specific examples thereof include an evaluation of change in the base color difference in the printing region after fluorescent lamp irradiation, an image density residual ratio evaluation after exposure using a xenon weather meter, an evaluation of change in the optical reflection density due to exposure using a xenon weather meter, a yellowing degree evaluation based on the L*a*b* evaluation system after exposure using a Suntest CPS photofading tester, a discoloration evaluation after exposure using a fade meter, a visual discoloration evaluation after exposure using a xenon fade meter, a color density retention evaluation after exposure to indoor sunlight, a color density retention evaluation after exposure using a xenon weather meter, a C/N evaluation after exposure using a fade meter, a fog density evaluation after exposure to a fluorescent lamp, an optical reflection density evaluation after exposure using a fluorescent lamp, an erasure evaluation, a color difference ΔE* evaluation after exposure using an Atlas fade meter, a visual evaluation of discoloration after exposure using a carbon are fade meter, an evaluation of color conversion retention of an organic EL device, and a measurement/evaluation of organic EL display luminance after exposure by a xenon discoloration tester.

As for other evaluation methods, the evaluation can be performed by the methods of JIS-K7103 and ISO/DIS9050, or a method based thereon. Specific examples thereof include an appearance evaluation of a polycarbonate coat film after exposure by a UV tester, a blue scale evaluation of artificial hair after exposure to ultraviolet light, an evaluation of water contact angle on a processed cloth for evaluation after exposure using an accelerated weather resistance tester, the visual evaluation of the image projected on a projection screen after exposure using a weather resistance tester described in JP-A-2005-55615, a visual evaluation of the sample surface deterioration and change in the design property after exposure using a sunshine weather meter or a metal weather meter, a visual appearance evaluation after exposure to lighting using a metal lamp reflector, a light transmittance evaluation of bottle label, a polypropylene deterioration evaluation after exposure using a xenon weather meter under humid condition, a deterioration evaluation of hardcoat film by using a sunshine weatherometer, evaluations of deterioration, hydrophilicity and scratch resistance of base material, a gray scale evaluation of color difference of artificial leather after exposure using a xenon lamp light source, an evaluation of liquid crystal device characteristics after exposure using a mercury lamp, an adherence evaluation after exposure using a sunshine weatherometer, a purple blotch degree evaluation of lawn grass, an ultraviolet transmittance evaluation after exposure using a xenon arc light source, a tensile strength evaluation, a concrete adhesion velocity evaluation, evaluations of appearance and coating film adherence after exposure using a sunshine weatherometer, an evaluation of yellowing degree and adherence after exposure using a carbon arc light source, an adhesive performance evaluation using an ultraviolet fade meter, an evaluation of flying prevention of insects during lighting, an evaluation of yellowing degree (ΔYI) of the laminated glass by using an Eye Super UV tester, evaluations of surface appearance and gloss retention after QUV irradiation and humidity-resistance test, an evaluation of color difference with aging using a Dewpanel light control weather meter, evaluations of glossiness (DI) and yellowness index (YI) of the wood base material in a coated state after exposure using a xenon weatherometer, an ultraviolet absorbance evaluation after repeating ultraviolet irradiation and darkness, and an evaluation of dye discoloration based on color difference ΔE after exposure to ultraviolet light.

EXAMPLE

The present invention is described in greater detail below, but the present invention is not limited thereto.

Synthesis Example

Synthesis Example 1

Preparation of Compound (2)

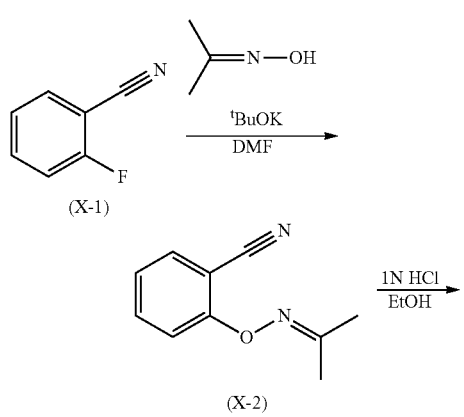

(X-1)

(X-2)

-continued

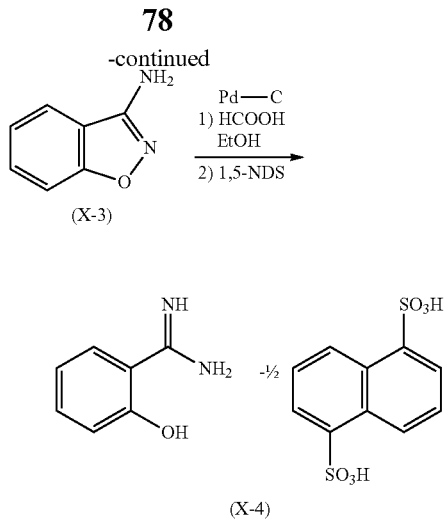

(X-3)

(X-4)

(Synthesis of X-2)

In a three-neck flask, 39.5 g (1.1 molar equivalents) of acetoxime, 600 mL of DMF (N,N-dimethylformamide) and 60.6 g (1.1 molar equivalents) of potassium tert-butoxide were charged, and the mixture was stirred at room temperature for 30 minutes. The inner temperature was then set to 0° C. and thereto, 60 g (1.0 molar equivalent) of Compound (X-1) was slowly added dropwise. After the dropwise addition, the inner temperature was raised to 25° C., and the mixture was stirred at this temperature for 1 hour.

The resulting reaction mixture was subjected to an extraction/separation operation with an aqueous ammonium chloride solution and ethyl acetate, and the obtained organic phase was washed by adding saturated brine and then separated. The thus-obtained organic phase was concentrated in a rotary evaporator to obtain the residue as a crude product of Compound (X-2).

(Synthesis of X-3)

In a three-neck flack, the entire amount of the crude product of Compound (X-2) obtained above was charged and after adding 700 mL of ethanol and 500 mL of aqueous 1 mol/L hydrochloric acid, the reaction mixture was heated to an inner temperature of 80° C. and stirred at this temperature for 3 hours.

The reaction mixture was cooled to an inner temperature of 25° C. and then subjected to an extraction/separation operation with an aqueous saturated sodium hydrogencarbonate solution and ethyl acetate, and the obtained organic phase was washed by adding saturated brine and separated. The thus-obtained organic phase was concentrated in a rotary evaporator to yield the residue as a crude product of Compound (X-3).

(Synthesis of X-4)

In a three-neck flask, after filling the inside of flask with nitrogen gas, 6.5 g of 10% Pd—C (produced by Wako Pure Chemical Industries, Ltd.) was added, and 2,000 mL of ethanol and the entire amount of the crude product of Compound (X-3) obtained above were added, followed by heating/refluxing. Thereto, 55 mL (3 molar equivalents) of formic acid was slowly added dropwise, and the mixture was stirred at this temperature for 5 hours. The resulting reaction mixture was cooled to an inner temperature of 25° C. and then filtered by Celite filtration, and to the mother solution separated by filtration, 105 g of 1,5-naphthalenedisulfonic acid was added. After raising the inner temperature to 70° C., the mixture was stirred for 30 minutes and then gradually cooled to room temperature, and the crystal was separated by filtration to obtain 100 g of Compound (X-4). The yield was 72% based on Compound (X-1) as the starting material. The obtained crystal was pale brown. $^1$H NMR (deuterated DMSO): δ6.95-6.98 (1H), δ7.02-7.04 (1H), δ7.40-7.51 (3H), δ7.90-7.95 (1H), δ8.75 (1H), δ8.85-8.88 (2H), δ9.03 (2H), δ10.89 (1H).
(Synthesis of Synthetic Intermediate C)

Acetonitrile (600 mL) and 355.2 g of DBU were added to 160.0 g of salicylamide and dissolved. To this solution, 193.2 g of 4-cyanobenzoyl chloride was added, and the mixture was stirred at room temperature for 24 hours. To the resulting reaction solution, 1,200 mL of water and 150 mL of hydrochloric acid were added, and the obtained solid was filtered and washed with water to obtain 292.8 g of Synthetic Intermediate C (yield: 94%).

(Synthetic Intermediate C)

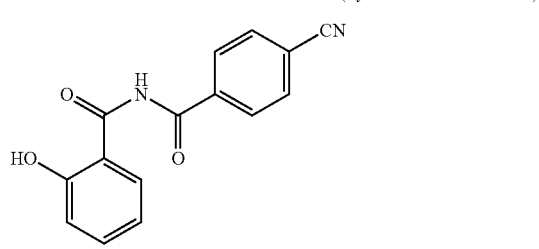

Acetonitrile (1,200 mL) and 110.5 g of sulfuric acid were added to 200.0 g of Synthetic Intermediate C, and the mixture was stirred at 90° C. for 4 hours. To the resulting reaction solution, 600 mL of triethylamine was added, and the mixture was cooled to room temperature. The obtained solid was filtered and washed with water to obtain 177.2 g of Synthetic Intermediate D (yield: 95%).

(Synthetic Intermediate D)

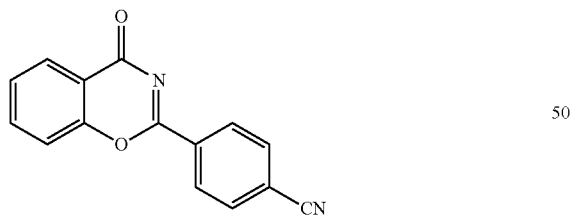

Methanol (50 mL) and 4.3 g of a 28% sodium methoxide methanol solution were added to 6.2 g of Compound (X-4). To this solution, 5.0 g of Synthetic Intermediate D was added, and the mixture was stirred at 60° C. for 3 hours. The resulting reaction solution was cooled to room temperature, and 0.2 mL of hydrochloric acid was added thereto. The obtained solid was filtered and washed with water and methanol to obtain 7.1 g of Compound (2) (yield: 96%). MS: m/z 367 (M+). $^1$H NMR (CDCl$_3$): δ7.01-7.13 (4H), δ7.56-7.59 (2H), δ7.91-7.93 (2H), δ8.52-8.54 (2H), 68.58-8.60 (2H), δ12.77 (2H) λmax=355 nm (EtOAc).

Synthesis Example 2

Preparation of Compound (m-2)

Acetonitrile (600 mL) and 355.2 g of DBU were added to 160.0 g of salicylamide and dissolved. To this solution, 193.2 g of 3-cyanobenzoyl chloride was added, and the mixture was stirred at room temperature for 24 hours. To the resulting reaction solution, 1,200 mL of water and 150 mL of hydrochloric acid were added, and the obtained solid was filtered and washed with water to obtain 296.0 g of Synthetic Intermediate M (yield: 95%).

(Synthetic Intermediate M)

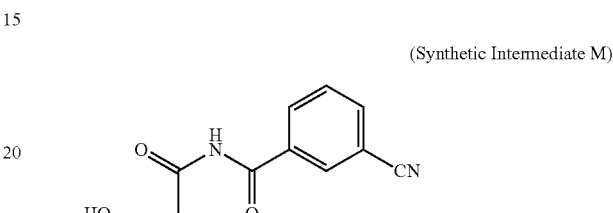

Acetonitrile (1,200 mL) and 110.5 g of sulfuric acid were added to 200.0 g of Synthetic Intermediate M, and the mixture was stirred at 90° C. for 4 hours. To the resulting reaction solution, 600 mL of triethylamine was added, and the mixture was cooled to room temperature. The obtained solid was filtered and washed with water to obtain 177.3 g of Synthetic Intermediate N (yield: 95%).

(Synthetic Intermediate N)

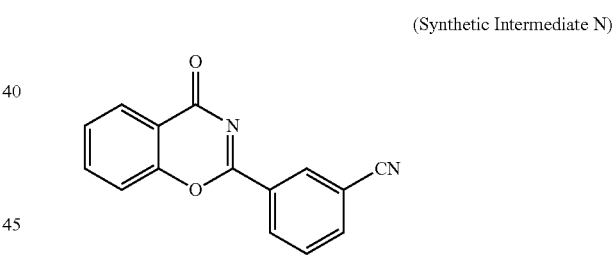

Methanol (50 mL) and 4.3 g of a 28% sodium methoxide methanol solution were added to 6.2 g of Compound (X-4). To this solution, 5.0 g of Synthetic Intermediate N was added, and the mixture was stirred at 60° C. for 3 hours. The resulting reaction solution was cooled to room temperature, and 0.2 mL of hydrochloric acid was added thereto. The obtained solid was filtered and washed with water and methanol to obtain 6.9 g of Compound (m-2) (yield: 93%). MS: m/z 367 (M+).

Compounds used in Examples were produced using the same method as above.

<Method for Measuring pKa>

Compound (2) was dissolved in acetonitrile to give an absorbance of 1 and to this solution, 70% perchloric acid (solvent: acetic acid) was added dropwise, thereby varying the pH. At this time, the absorption spectrum of solution was measured and based on the absorbance at λmax, the proportions of a triazine-free form and a proton adduct were calculated at each pH. From the point at which these values became equal, the pKa value was determined. Here, the triazine-free form indicates Compound (2) itself, and the proton adduct indicates a compound resulting from addition of a proton to the nitrogen atom of triazine ring of Compound (2). Compounds (21), (24), (120), (m-2), (m-3), (m-4), (m-21), (m-31), (m-20) and (m-1), and as comparative compounds, (Example A1) and (Example A2) were determined for the pKa value in the same manner. The absorption spectrum was measured using a spectrophotometer, UV-3600 (trade name), manufactured by Shimadzu Corporation, and the pH was measured using a pH meter, HM60G (trade name), manufactured by To a Denpa Kogyo. Incidentally, the absorbance is a value measured at the maximum absorption wavelength of each compound. The results are shown in Table 1.

TABLE 1

| Compound | pKa |
|---|---|
| (2) | −5.4 |
| (21) | −5.0 |
| (24) | −5.0 |
| (120) | −5.0 |
| (m-2) | −5.5 |
| (m-3) | −5.4 |
| (m-4) | −5.0 |
| (m-21) | −5.1 |
| (m-31) | −5.8 |
| (m-1) | −5.1 |
| (m-20) | −5.1 |
| (Example A1) | −4.9 |
| (Example A2) | −4.4 |

Example 1

A pellet of polyethylene terephthalate (PET) (VYLOPET EMC133, trade name, produced by Toyobo Co., Ltd.), which was dried at 170° C. for 6 hours, and the ultraviolet absorber shown by Compound (m-21) were mixed and charged into an extruder. The mixture was melt-mixed at a melting temperature of 280° C. to obtain an ultraviolet absorber-containing pellet. The contents of the pellet and the polyethylene terephthalate were adjusted such that the ultraviolet absorber has a net ratio of 2.3 mass %, and these were melt-mixed at 280° C. to obtain a film having a thickness of 99 µm±2 µm.

Example 2

A pellet of polyethylene naphthalate (PEN) (Teonex TN8065S, produced by Teijin Chemicals, Ltd.) and the ultraviolet absorber shown by Compound (21) were mixed and charged into an extruder. The mixture was melt-mixed at a melting temperature of 300° C. to obtain an ultraviolet absorber-containing pellet. The contents of the pellet and the polyethylene naphthalate were adjusted such that the ultraviolet absorber has a net ratio of 2.3 mass %, and these were melt-mixed at 280° C. to obtain a film having a thickness of 99 µm±2 µm.

Example 3

A pellet of polyethylene terephthalate (PET) (VYLOPET EMC133, trade name, produced by Toyobo Co., Ltd.), which was dried at 170° C. for 6 hours, and the ultraviolet absorber shown by Compound (m-31) were mixed and charged into an extruder. The mixture was melt-mixed at a melting temperature of 280° C. to obtain an ultraviolet absorber-containing pellet. The contents of the pellet and the polyethylene terephthalate were adjusted such that the ultraviolet absorber has a net ratio of 5.0 mass %, and these were melt-mixed at 280° C. to obtain a film having a thickness of 45 µm±2 µm.

Example 4

A pellet of polybutylene terephthalate (PBT) (TORAYCON 5101G-30U, produced by Toray Industries, Inc.) and the ultraviolet absorber shown by Compound (m-31) were mixed and charged into an extruder. The mixture was melt-mixed at a melting temperature of 260° C. to obtain an ultraviolet absorber-containing pellet. The contents of the pellet and the polybutylene terephthalate were adjusted such that the ultraviolet absorber has a net ratio of 2.5 mass %, and these were melt-mixed at 260° C. to obtain a film having a thickness of 99 µm±2 µm.

Example 5

A pellet of polyethylene terephthalate (PET) (VYLOPET EMC133, trade name, produced by Toyobo Co., Ltd.), which was dried at 170° C. for 6 hours, and the ultraviolet absorber shown by Compound (m-20) were mixed and charged into an extruder. The mixture was melt-mixed at a melting temperature of 280° C. to obtain an ultraviolet absorber-containing pellet. The contents of the pellet and the polyethylene terephthalate were adjusted such that the ultraviolet absorber has a net ratio of 2.9 mass %, and these were melt-mixed at 280° C. to obtain a film having a thickness of 99 µm±2 µm.

Example 6

A pellet of polyethylene terephthalate (PET) (VYLOPET EMC133, trade name, produced by Toyobo Co., Ltd.), which was dried at 170° C. for 6 hours, and the ultraviolet absorber shown by Compound (m-2) were mixed and charged into an extruder. The mixture was melt-mixed at a melting temperature of 280° C. to obtain an ultraviolet absorber-containing pellet. The contents of the pellet and the polyethylene terephthalate were adjusted such that the ultraviolet absorber has a net ratio of 1.6 mass %, and these were melt-mixed at 280° C. to obtain a film having a thickness of 100 µm±2 µm.

Example 7

A pellet of polyethylene terephthalate (PET) (VYLOPET EMC133, trade name, produced by Toyobo Co., Ltd.), which was dried at 170° C. for 6 hours, and the ultraviolet absorber shown by Compound (m-1) were mixed and charged into an extruder. The mixture was melt-mixed at a melting temperature of 280° C. to obtain an ultraviolet absorber-containing pellet. The contents of the pellet and the polyethylene terephthalate were adjusted such that the ultraviolet absorber has a net ratio of 0.5 mass %, and these were melt-mixed at 280° C. to obtain a film having a thickness of 320 µm±2 µm.

Example 8 to Example 13

Resin films containing the ultraviolet absorber and additive shown in the Table below were formed in the same manner as in Example 1.

Comparative Examples 1 and 2

A film containing the ultraviolet absorber shown by (Example A1) was formed in the same manner as in Example 1 (Comparative Example 1).

The film of Comparative Example 2 was formed in the same manner as above.

<<Evaluation>>[Light Resistance]

Each of the films produced was irradiated with light by using a metal halide lamp (in the presence of a 350 nm or less cut filter) (EYE Super UV Tester, manufactured by Iwasaki Electric Co., Ltd.) under the conditions of an illuminance of 90 mW/cm$^2$, a temperature of 63° C. and a humidity of 50%. The evaluation was made by rating the yellowing degree ($\Delta$Y.I.) and the retention of strength at break. The strength at break was measured using Strograph VE10D manufactured Toyo Seiki Seisaku-sho, Ltd.) and by taking the strength of a fresh film as 100%, the relative ratio of the strength after 24 hours was calculated as the retention (%) of strength. Assuming that the retention of strength of Comparative Example 1 is 1, the test was performed according to the following criteria.

AA: In the case of 4 or more based on Comparative Example 1.

A: In the case of from 2 to less than 4 based on Comparative Example 1.

B: In the case of from 1 to less than 2 based on Comparative Example 1.

C: In the case of from 0.1 to less than 1 based on Comparative Example 1.

[Solubility]

The solubility in the resin at the production of each film was evaluated. When charging the compound together with the resin into an extruder and kneading the mixture at each melting temperature, the time required for melting was rated according to the following criteria by taking the time required in the production of the film of Comparative Example 1 as 1.

AA: In the case of less than 0.8 times that of Comparative Example 1.

A: In the case of from less than 1.0 times to 0.8 times or less that of Comparative Example 1.

B: In the case of 1.0 times that of Comparative Example 1.

C: In the case of more than 1.0 times that of Comparative Example 1.

[Yellowness]

The yellowness (YI) is the degree to which the color hue is shifted toward yellow from colorless or white. As for the method to measure the yellowness, tristimulus values X, Y and Z were determined using a white measuring colorimeter, and the yellowness is calculated according to the following formula.

[Yellowing Degree]

The yellowing degree ($\Delta$YI) is used for evaluating the deterioration of a plastic exposed to light, heat or other environments and indicated by the difference between the initial yellowness and yellowness after exposure. The yellowing degree is determined according to the following formula.

$$\Delta YI = YI - YIo$$

$\Delta$YI: yellowing degree,

YI: yellowness after exposure, and

YIo: initial yellowness of test film.

TABLE 2

| | Ultraviolet Absorber | | Additive | | Resin | Yellowing Degree ($\Delta$Y.I.) | Retention of Strength (%) | Solubility | Light Resistance |
|---|---|---|---|---|---|---|---|---|---|
| | Kind | Amount Added | Kind | Amount Added | | | | | |
| Example 1 | (m-21) | 2.3% | — | — | PET | 0.1 | 27 | AA | AA |
| Example 2 | (21) | 2.3% | — | — | PEN | 0.4 | 19 | A | A |
| Example 3 | (m-31) | 5.0% | — | — | PET | 0.5 | 17 | AA | A |
| Example 4 | (m-31) | 2.5% | — | — | PBT | 0.4 | 16 | A | A |
| Example 5 | (m-20) | 2.9% | — | — | PET | 0.6 | 16 | AA | A |
| Example 6 | (m-2) | 1.6% | — | — | PET | 0.4 | 15 | A | A |
| Example 7 | (m-1) | 0.5% | — | — | PET | 0.5 | 14 | A | A |
| Example 8 | (m-21) | 2.3% | (Example A1) | 2.0 wt % | PET | 0.1 | 25 | A | AA |
| Example 9 | (120) | 2.3% | — | — | PET | 0.1 | 26 | A | AA |
| Example 10 | (m-20) | 2.6% | — | — | PET | 4.2 | 7 | AA | B |
| Example 11 | (m-4) | 2.0% | (Example A1) | 2.0 wt % | PET | 0.6 | 14 | AA | A |
| Example 12 | (m-3) | 1.8% | — | — | PET | 0.5 | 15 | A | A |
| Example 13 | (24) | 3.0% | — | — | PET | 0.1 | 25 | AA | AA |
| Comparative Example 1 | (Example A1) | 2.3% | — | — | PET | 4.7 | 7 | B | B |
| Comparative Example 2 | (Example A2) | 2.0% | — | — | PET | 20 | 1 | AA | C |

(Example A1) and (Example A2) indicate the following compounds.

Example A1

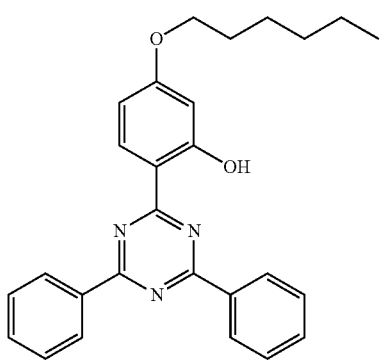

Tinuvin 15577 FF

Example A2

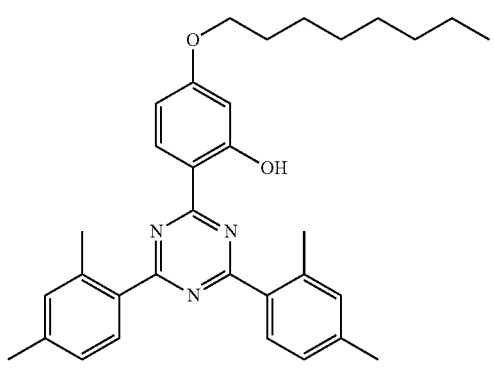

CYASORB UV-1164

These compounds are available on the market, that is, Example A1 is Tinuvin 1577FF produced by Ciba and Example A2 is CYASORB UV-1164 produced by CYTEC.

Also, ME-553 produced by Toyobo Co., Ltd. was used as PET.

It is seen from the results above that the polyester resin composition of the present invention (Examples 1 to 13) is excellent in the light resistance and the solubility as compared with Comparative Examples. Also, it was revealed that when the film obtained in Examples is used as an agricultural film, a PDP film, a food/medical packaging film, a window film or an optical film, the light resistance is excellent as compared with the commercially available films.

Production Example 1

Photovoltaic Backsheet

Two resin film layers were formed by stacking, in order, a resin film layer composed of a polyethylene naphthalate (PEN) film having a thickness of 25 μm, which works out to an outside layer disposed on the relatively remoter side (outer side) with respect to the photovoltaic module, and a resin film layer composed of the polyethylene terephthalate (PET) film prepared in Example 1, and a polyester-based primer layer was coated on the inner surface of the PET film layer. Between the PEN film layer and the PET film layer, an adhesive layer composed of an adhesive for dry lamination was disposed.

A photovoltaic backsheet having a configuration where starting from the outermost layer, a PEN film (25 μm), an adhesive layer, a PET film (99 μm±2 μm), and a polyester-based primary layer are stacked, was produced. The thus-produced photovoltaic backsheet was revealed to be excellent in the light resistance.

Production Example 2

Photovoltaic Backsheet

On both surfaces of the PEN film having a thickness of 99 μm±2 μm produced in Example 2, an adhesive layer (formed of an adhesive prepared by using POLYMENT NK350 produced by Nippon Shokubai Co., Ltd. and EPIKOTE 828 (curing agent) produced by Yuka Shell Epoxy K.K. and after blending in a ratio of POLYMENT NK350 and EPIKOTE 828=100 and 4.5 (mass ratio), diluting the mixture with toluene) was provided, and on both sides of the laminate, a white polyvinyl fluoride film (Tedler Film, produced by Du Pont Co.) having a thickness of 25 μm was stacked.

A photovoltaic backsheet having a configuration where starting from the outermost layer, a polyvinyl fluoride film (25 μm), an adhesive (dry coating amount: 4.5 g/m$^2$), a PEN film (99 μm±2 μm), an adhesive (dry coating amount: 4.5 g/m$^2$), and a polyvinyl fluoride film (25 μm) are stacked, was produced.

The thus-produced photovoltaic backsheet was revealed to be excellent in the light resistance.

Production Example 3

Photovoltaic Front Sheet

One surface of a 50 μm-thick biaxially stretched polyethylene terephthalate film (SPPET 3811, produced by Lintec Co., thickness: 38 μm) was subjected to an antiglare treatment (coat thickness: about 2 μm) composed of 100 parts by mass of an acrylic binder (NIPOL Lx811, produced by ZEON Corporation) and 5 parts by mass of silica filler (Snowtex ZL, trade name, produced by Nissan Chemicals Industries, Ltd.). The thus-produced photovoltaic front sheet can be used by adhering it to a photovoltaic module.

A photovoltaic front sheet having a configuration where starting from the outermost layer, an antiglare treatment layer (about 99 μm), a PET film (50 μm), a pressure-sensitive adhesive layer (20 μm), and the PEN film (99 μm±2 μm) produced in Example 2 are stacked, was produced.

The thus-produced photovoltaic front sheet can be used by adhering it to a photovoltaic module. This protective sheet was revealed to be excellent in light resistance.

Production Example 4

Photovoltaic Backsheet

On both surfaces of a PEN film having a thickness of 99 μm±2 μm produced by the same operation as in Example 2 except for replacing Compound (21) as an ultraviolet absorber to Compound (m-21), the coating composition prepared by the method described below was coated to have a binder amount of 0.1 g/m² in terms of the coating amount and dried at 180° C. for 1 minutes to form an undercoat layer having a dry thickness of about 0.1 µm. Over one entire surface of the undercoat layer, the fluorine-containing polymer layer-forming coating solution prepared by the method described below was coated to have a binder amount of 2.0 g/m² in terms of the coating amount and dried at 180° C. for 1 minute to form a fluorine-containing polymer layer having a dry thickness of about 2 µm.

On the surface opposite the fluorine-containing polymer layer, a color layer-forming coating material prepared by the method described below was coated and dried at 180° C. for 1 minute to form a color layer having a titanium dioxide amount of 7.0 g/m² and a binder amount of 1.2 g/m².

A photovoltaic backsheet having a configuration where starting from the outermost layer, a fluorine-containing polymer layer (2 µm), an undercoat layer (0.1 µm), a PEN film (99 µm±2 µm), an undercoat layer (0.1 µm), and a color layer are stacked, was produced. The thus-produced photovoltaic backsheet was revealed to be excellent in the light resistance.

Preparation Method of Coating Solution for Each Layer
—Preparation of Undercoat Layer-Forming Coating Solution—

Respective components in the formulation below were mixed to prepare an undercoat layer-forming coating solution.

| | |
|---|---|
| Polyester-based binder (VYLONAL DM1245 (produced by Toyobo Co., Ltd., solid content: 30 mass %)) | 48.0 parts by mass |
| Carbodiimide compound (crosslinking agent) (CARBODILITE V-02-L2, produced by Nisshinbo Industries, Inc., solid content: 10 mass %) | 10.0 parts by mass |
| Oxazoline compound (crosslinking agent) (EPOCROS WS700, produced by Nippon Shokubai Co., Ltd., solid content: 25 mass %) | 3.0 parts by mass |
| Surfactant (NAROACTY CL95, produced by Sanyo Chemical Industries, Ltd., solid content: 1 mass %) | 15.0 parts by mass |
| Distilled water | 907.0 parts by mass |

—Preparation of Backside Polymer Layer-Forming Coating Solution—

Respective components in the formulation below were mixed to prepare a backside polymer layer-forming coating solution.

| | |
|---|---|
| Obbligato SSW0011F (binder, P-101) (fluorine-based binder, produced by AGC COAT-TECH Co., Ltd., solid content: 39 mass %) | 247.8 parts by mass |
| Carbodiimide compound (crosslinking agent, A-1) (CARBODILITE V-02-L2, produced by Nisshinbo Industries, Inc., solid content: 40 mass %) | 24.2 parts by mass |
| Surfactant (NAROACTY CL95, produced by Sanyo Chemical Industries, Ltd., solid content: 1 mass %) | 24.2 parts by mass |
| Distilled water | 703.8 parts by mass |

—Preparation of Titanium Dioxide Dispersion—

Components in the formulation below were mixed, and the mixture was subjected to a dispersion treatment for 1 hour by a Dyno-mill type disperser.

(Formulation of Titanium Dioxide Dispersion)

| | |
|---|---|
| Titanium dioxide (volume average particle diameter = 0.42 µm) [TIPAQUE R-780-2, produced by Ishihara Sangyo Kaisha, Ltd., solid content: 100 mass %] | 39.9 mass % |
| Polyvinyl alcohol [PVA-105, produced by Kuraray Co., Ltd., solid content: 10 mass %] | 49.9 mass % |
| Surfactant [DEMOL EP, produced by Kao Corporation, solid content: 10 mass %] | 0.5 mass % |
| Distilled water | 9.7 mass % |

—Preparation of Color Layer Coating Solution—

Components in the formulation below were mixed to prepare a color layer coating solution.
(Formulation of Coating Solution)

| | |
|---|---|
| Titanium dioxide dispersion | 78.0 mass % |
| Silanol-modified polyvinyl alcohol binder [R1130, produced by Kuraray Co., Ltd., solid content: 7 mass %] | 11.4 mass % |
| Polyoxyalkylene alkyl ether [NAROACTY CL95, produced by Sanyo Chemical Industries, Ltd., solid content: 1 mass %] | 3.0 mass % |
| Oxazoline compound [EPOCROS WS-700, produced by Nippon Shokubai Co., Ltd., solid content: 25%; crosslinking agent] | 2.0 mass % |
| Distilled water | 5.6 mass % |

Examples 14 to 17

Fabrication of Photovoltaic Module

Using the photovoltaic front sheets and backsheets produced in Production Examples 1 to 4, photovoltaic modules of Examples 14 to 17 were fabricated

[Fabrication Method of Photovoltaic Module]

A hardened glass having a thickness of 3 mm, an EVA sheet [SC50B, produced by Mitsui Chemicals Fabro, Inc.], a crystal-based photovoltaic cell, an EVA sheet [SC50B, produced by Mitsui Chemicals Fabro, Inc.], and the sheet in each of Production Examples 1 to 4 were stacked one on another in this order, and the assembly was hot-pressed using a vacuum laminator [vacuum lamination machine, manufactured by Nisshinbo Industries, Inc.], thereby adhering EVA. The conditions of EVA adhesion were as follows.

After air purging at 128° C. for 3 minutes by using a vacuum laminator, provisional adhesion was effected by applying a pressure for 2 minutes and thereafter, definitive adhesion was effected at 150° C. for 30 minutes in a dry oven.

In this way, a crystal-based photovoltaic module was fabricated. The fabricated photovoltaic module was used to perform a power-generating operation and exhibited a good power generation performance as a solar cell.

<<Evaluation>>

[Energy Conversion Efficiency of Photovoltaic Module]

Photovoltaic modules were fabricated using the solar cell protective sheets of Production Examples 1 to 4 and measured for the energy conversion efficiency. It was found that as for the energy conversion efficiency of the photovoltaic module having a solar cell protective sheet using the polyester resin composition of the present invention, a high energy conversion efficiency is obtained as compared with the conventional protective sheet using an ultraviolet absorber. The solar cell protective sheet using the polyester resin composition of the present invention can be incorporated into a known photovoltaic module. As Comparative Examples 3 to 6, films containing the same amount of comparative ultraviolet absorbers in place of the ultraviolet absorbers used in Production Examples were produced in the same manner, and Examples 14 to 17 were evaluated based on Comparative Examples 3 to 6.

Specifically, with respect to the module described in JP-A-2007-128943 to which a solar cell protective sheet using the polyester resin composition of the present invention was provided as the photovoltaic backsheet and the photovoltaic front sheet, the energy efficiency coefficient for each of Examples 14 to 17 was evaluated as follows based on Comparative Examples 3 to 6.

Incidentally, measurement of the energy conversion efficiency of the photovoltaic cell was performed as follows.

A xenon lamp of 500 W (manufactured by Ushio, Inc.) was mounted with a correction filter for sunlight simulation (AM1.5 direct (trade name), manufactured by Oriel), and the solar cell was irradiated with a pseudo-sunlight having an incident light intensity of 100 mW/cm$^2$, from the side of the porous semiconductor fine particle electrode (photosensitive electrode). The device was fixed closely on the stage of a thermostat, and the temperature of the device during irradiation was controlled to 50° C. The DC voltage applied to the device was scanned by using a current voltage analyzer (Source Measure Unit Model 238, manufactured by Keithley Instruments, Inc.) at a constant rate of 10 mV/sec, and the photocurrent output from the device was measured to measure the photocurrent-voltage characteristics and thereby determine the energy conversion efficiency.

AA: The power generation efficiency of the photovoltaic module produced in Example was 1.5 times or more the power generation efficiency of the photovoltaic module produced in Comparative Example.

A: The power generation efficiency of the photovoltaic module produced in Example was from 1 times to less than 1.5 times or more the power generation efficiency of the photovoltaic module produced in Comparative Example.

B: The power generation efficiency of the photovoltaic module produced in Example was the same as the power generation efficiency of the photovoltaic module produced in Comparative Example.

C: The power generation efficiency of the photovoltaic module produced in Example was less than 1 times the power generation efficiency of the photovoltaic module produced in Comparative Example.

TABLE 3

| | Ultraviolet Absorber | Power Generation Efficiency |
|---|---|---|
| Example 14 | (m-21) | A |
| Comparative Example 3 | (Example A1) | basis |
| Example 15 | (21) | AA |
| Comparative Example 4 | (Example A1) | basis |
| Example 16 | (21) | AA |
| Comparative Example 5 | (Example A1) | basis |
| Example 17 | (m-21) | AA |
| Comparative Example 6 | (Example A1) | basis |

Production Example 5

Fiber

Polyethylene terephthalate having an intrinsic viscosity of 1.0 was spun by an extruder-type spinning machine, and the obtained fiber was imparted with an oil containing Compound (m-21) as the ultraviolet absorber and then stretched to obtain a polyester yarn having a fineness of 1,260 deniers and a single-yarn fineness of 11.7 deniers. The amount of the oil attached was 1 mass % based on the mass of the fiber. The obtained fiber had good light resistance.

Industrial Applicability

By virtue of containing the compound represented by formula (1), which exhibits high solubility in an organic solvent and an ultraviolet-blocking effect even in the long-wavelength ultraviolet region as well as light resistance, the polyester resin composition of the present invention maintains a long-wavelength ultraviolet-blocking effect for a long period of time, exhibits high solubility for a solvent, and is reduced in change of the color hue with long-term aging. Furthermore, by molding the composition, a molded article such as film having a long-wavelength ultraviolet-blocking effect and being kept from precipitation or bleed-out with long-term aging as well as change in the color hue can be obtained. In addition, although the ultraviolet absorber composition is preferably odorless depending on the application, the ultraviolet absorber composition of the present invention is odorless even when used in a high concentration and is excellent also in view of odor.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2010-009538) filed on Jan. 19, 2010, Japanese Patent Application (Patent Application No. 2010-159143) filed on Jul. 13, 2010, and Japanese Patent Application (Patent Application No. 2010-261825) filed on Nov. 24, 2010, the contents of which are incorporated herein by way of reference.

DESCRIPTION OF REFERENCE NUMERALS

10 Photovoltaic module
31 Hardened glass
32 Resin layer
33 Solar cell encapsulant
34 Solar battery (cell)
35 Frame
36 Encapsulating resin
37 Wiring
38 Adhesive layer

The invention claimed is:

1. A polyester resin composition comprising a compound represented by the following formula (1) and a polyester resin:

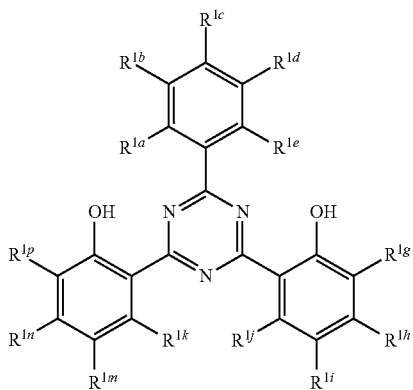

(1)

wherein
each of $R^{1a}$, $R^{1b}$, $R^{1c}$, $R^{1d}$ and $R^{1e}$ independently represents a hydrogen atom or a monovalent substituent excluding OH, at least one substituents represents a substituent having a positive Hammett's σp value, and substituents may combine with each other to form a ring; and each of $R^{1g}$, $R^{1h}$, $R^{1i}$, $R^{1j}$, $R^{1k}$, $R^{1m}$, $R^{1n}$ and $R^{1p}$ independently represents a hydrogen atom or a monovalent substituent, and substituents may combine with each other to form a ring, and wherein the polyester resin is at least one member selected from the group consisting of polyethylene terephthalate, polyethylene naphthalate, polybutylene terephthalate, poly-1,4-cyclohexanedimethylene terephthalate, and polyethylene-1,2-diphenoxyethane-4,4'-dicarboxylate.

2. The polyester resin composition as claimed in claim 1, wherein the monovalent substituent is a halogen atom, a substituted or unsubstituted alkyl group having a carbon number of 1 to 20, a cyano group, a carboxyl group, a substituted or unsubstituted alkoxycarbonyl group, a substituted or unsubstituted carbamoyl group, a substituted or unsubstituted alkylcarbonyl group, a nitro group, a substituted or unsubstituted amino group, a hydroxy group, an alkoxy group having a carbon number of 1 to 20, a substituted or unsubstituted aryloxy group, a substituted or unsubstituted sulfamoyl group, a thiocyanate group, or a substituted or unsubstituted alkylsulfonyl group, and in the case where the monovalent substituent has a substituent, the substituent is a halogen atom, an alkyl group having a carbon number of 1 to 20, a cyano group, a carboxyl group, an alkoxycarbonyl group, a carbamoyl group, an alkylcarbonyl group, a nitro group, an amino group, a hydroxy group, an alkoxy group having a carbon number of 1 to 20, an aryloxy group, a sulfamoyl group, a thiocyanate group, or an alkylsulfonyl group.

3. The polyester resin composition as claimed in claim 1, wherein at least one of $R^{1b}$, $R^{1c}$ and $R^{1d}$ is a substituent having a positive Hammett's σp value.

4. The polyester resin composition as claimed in claim 1, wherein the Hammett's σp value is from 0.1 to 1.2.

5. The polyester resin composition as claimed in claim 1, wherein the substituent having a positive Hammett's σp value is a group selected from $COOR^r$, $CONR^s_2$, CN, $CF_3$, a halogen atom, $NO_2$, and $SO_3M$, wherein each of $R^r$ and $R^s$ independently represents a hydrogen atom or a monovalent substituent, and M represents a hydrogen atom or an alkali metal.

6. The polyester resin composition as claimed in claim 1, wherein the substituent having a positive Hammett's σp value is $COOR^r$ or CN, wherein $R^r$ represents a hydrogen atom or a monovalent substituent.

7. The polyester resin composition as claimed in claim 1, wherein $R^{1h}$ or $R^{1n}$ is a hydrogen atom.

8. The polyester resin composition as claimed in claim 1, wherein each of $R^{1g}$, $R^{1h}$, $R^{1i}$, $R^{1j}$, $R^{1k}$, $R^{1m}$, $R^{1n}$ and $R^{1p}$ is a hydrogen atom.

9. The polyester resin composition as claimed in claim 1, wherein pKa of the compound represented by formula (1) is from −5.0 to −7.0.

10. The polyester resin composition as claimed in claim 1, containing the compound represented by formula (1) in an amount of 0.01 to 30% by mass.

11. The polyester resin composition as claimed in claim 1, further comprising an additive.

12. The polyester resin composition as claimed in claim 1, wherein the polyester resin is polyethylene terephthalate.

13. The polyester resin composition as claimed in claim 11, wherein the additive is an ultraviolet absorber, a light stabilizer, an antioxidant, a heat stabilizer, a fluorescent brightener or a flame retardant.

14. A polyester resin molded article comprising the polyester resin composition claimed in claim 1, wherein the thickness of resin molded article is from 0.1 μm to 25 mm.

15. A photovoltaic backsheet comprising the polyester resin composition claimed in claim 1.

16. A photovoltaic front sheet comprising the polyester resin composition claimed in claim 1.

17. A window film comprising the polyester resin composition claimed in claim 1.

18. A packaging film for food or medical use comprising the polyester resin composition claimed in claim 1.

19. An agricultural film comprising the polyester resin composition claimed in claim 1.

20. An optical film comprising the polyester resin composition claimed in claim 1.

21. A fiber comprising the polyester resin composition claimed in claim 1.

22. A photovoltaic module comprising the polyester resin composition claimed in claim 1.

23. The polyester resin composition as claimed in claim 5, wherein the polyester resin is at least one member selected from the group consisting of polyethylene terephthalate, polyethylene naphthalate, polybutylene terephthalate, poly-1,4-cyclohexanedimethylene terephthalate, and polyethylene-1,2-diphenoxyethane-4,4'-dicarboxylate.

24. The polyester resin composition as claimed in claim 6, wherein the polyester resin is at least one member selected from the group consisting of polyethylene terephthalate, polyethylene naphthalate, polybutylene terephthalate, poly-1,4-cyclohexanedimethylene terephthalate, and polyethylene-1,2-diphenoxyethane-4,4'-dicarboxylate.

25. The polyester resin composition as claimed in claim 5, wherein the polyester resin is polyethylene terephthalate.

26. The polyester resin composition as claimed in claim 6, wherein the polyester resin is polyethylene terephthalate.

* * * * *